USOO5949693A

United States Patent [19]
Tandler

[11] Patent Number: 5,949,693
[45] Date of Patent: Sep. 7, 1999

[54] COMPUTER AIDED DESIGN (CAD) SYSTEM FOR AUTOMATICALLY CONSTRUCTING DATUM REFERENCE FRAME (DRF) AND FEATURE CONTROL FRAME (FCF) FOR MACHINE PART

[76] Inventor: William Tandler, 865 Lemon St., Menlo Park, Calif. 94025-6110

[21] Appl. No.: 08/709,099

[22] Filed: Sep. 6, 1996

[51] Int. Cl.$^6$ .................................................. G06F 17/50
[52] U.S. Cl. ............... 364/512; 364/474.24; 364/474.35; 364/559
[58] Field of Search ...................... 364/474.25, 474.35, 364/474.37, 559, 560, 474.24

[56] References Cited

U.S. PATENT DOCUMENTS

| | | | |
|---|---|---|---|
| 4,296,474 | 10/1981 | Hurt | 364/560 |
| 4,754,417 | 6/1988 | Beeson et al. | 364/560 |
| 4,918,627 | 4/1990 | Garcia et al. | 364/552 |
| 5,208,763 | 5/1993 | Hong et al. | 364/551.02 |
| 5,465,221 | 11/1995 | Merat et al. | 364/552 |
| 5,586,052 | 12/1996 | Iannuzzi et al. | 364/512 |

OTHER PUBLICATIONS

Desrochers et al., "A Dimensioning & Tolerancing Assistance Model for Cad/Cam Systems", Int J Adv Manuf Tech (1994) vol. 9, pp. 352–361.

Ikonomov et al., "Inspection Method for Geometrical Tolerances Using Virtual Gauges", IEEE Int Conf on Robotics/ Auto, pp. 550–555, Jun. 1995.

Committee Correspondence to Jim Meadows from Archie Anderson re: "Y14.5/WG4 White Paper on Secondary and Tertiary Datum Features RFS," May 9, 1995.

Committee Correspondence to Cal Gomez from David Honsinger re: White Paper: "Tertiary Datum Feature of Size," Jun. 20, 1995.

Committee Correspondence to A.R. Anderson from Marty Wright re: White Paper: "Tertiary Datum Features," Aug. 31, 1995.

Committee Correspondence to Archie Anderson from Robert D. Wiles re: Research Paper: "An Inquiry into the Nature and Causes of Datums and Datum Reference Frames Prompted by the Debate Surrounding Tertiary Datum Features at RFS," Aug. 29, 1995.

R. D. Wiles, "Tertiary Datum Feature—Diameter or Width RFS," ASME Standards Committee Y14 Engineering Drawing and Related Documentation Practices, Y14.5M Work Order No. A150, Sep. 6, 1996.

Committee Correspondence to A.R. Anderson from Marty Wright re: White Paper: "Tertiary Datum Features," Aug. 31, 1995.

(List continued on next page.)

*Primary Examiner*—Kevin J. Teska
*Assistant Examiner*—Russell W. Frejd
*Attorney, Agent, or Firm*—David G. Alexander

[57] ABSTRACT

A formal drawing for a machine part includes datum features that are used to construct a Datum Reference Frame (DRF) for the part. A Feature Control Frame (FCF) containing a datum feature that is intended to eliminate roll about a fixed primary axis of the DRF includes a material location modifier which specifies whether the orientation or the location of the feature should be used to eliminate roll. The material location modifiers enable specification of Independent of Material Location (IML), at Basic Material Location (BML), at Maximum Material Location (MML) and at Least Material Location (LML), eliminate all ambiguity in the formal drawing, and enable a DRF to be constructed automatically using a computer. The material location modifiers further eliminate any possibility of misinterpretation of the formal drawing during all stages of manufacture and inspection of the part. A computer program implementing a method of the invention includes instructions for constructing a DRF in response to the dimensions, tolerances, FCF datum feature sequence and material location modifiers using a set of rules and specific DRF construction tools. The tools include ORIENT, ALIGN, PIVOT, SET ORIGIN, TRANSLATE and ROTATE, and are applied in order to sequentially eliminate pitch, yaw, roll, and translation from the DRF.

59 Claims, 26 Drawing Sheets

OTHER PUBLICATIONS

R. D. Wiles, "Definition of a Datum," ASME Standards Committee Y14 Engineering Drawing and Related Documentation Practices, Y14.5M Work Order No. A152, Sep. 6, 1996.

M.P. Wright, "Tertiary Datums," Attachment G, pp. 1–4, Oct. 6, 1995.

ASME Committee Correspondence to Walt Sites from Alvin G. Neumann, Attachment J re: "Section 4, minutes from Milpitas, CA meeting on Oct. 10, 1995," Jan. 3, 1996.

Bruce A. Wilson, "Tertiary Datum Simulation," Attachment F, pp. 1–11., Oct., 1995.

Bruce A. Wilson, "Tertiary Datum Simulation," Attachment E, pp. 1–5, May, 1995.

M.A. Nasson, "Y14.5/Y14.5.1," Attachment D, pp. 1–8, Oct. 9, 1995.

Alan K. Jones, "TTRS Theory of Datum Systems," Boeing Information & Support Services, Research & Technology, May 19, 1996.

ISO/JHG/TG Datums, Nos. 1–35, French Contribution, Jun. 1996.

James D. Keith, "Expanded Use of Tangent Symbol For Clocking Datums,".

International Committee Draft, "Geometrical Product Specifications (GPS)—Datums for Geometrical Tolerancing—Part 2: Datums and Datum–Systems, Drawing Indications," ISO/CD 5459-2:1995(E).

Lowell Foster, "Tertiary Datum Features of Size," ASME Standards Committee Y14 Engineering Drawing and Related Documentation Practices, Y14.5M Work Order No. A039, May 31, 1994.

ASME Committee Correspondence to Bill Tandler, Multi Metrics, Inc. from W.M. Stites re: "Tertiary Datum Features of Size at RFS," Jul. 30, 1996.

Xuzeng Zhang and Utpal Roy, "Criteria for Establishing Datums in Manufactured Parts," Journal of Manufacturing Systems, vol. 12/No. 1, pp. 36–50.

The American Society of Mechanical Engineering, "ASME Y14.5M—1994 Dimensioning and Tolerancing", 1995, USA.

The American Society of Mechanical Engineers, "ASME Y14.5.1M—1994 Mathematical Definition of Dimensioning and Tolerancing Principles", 1995, USA.

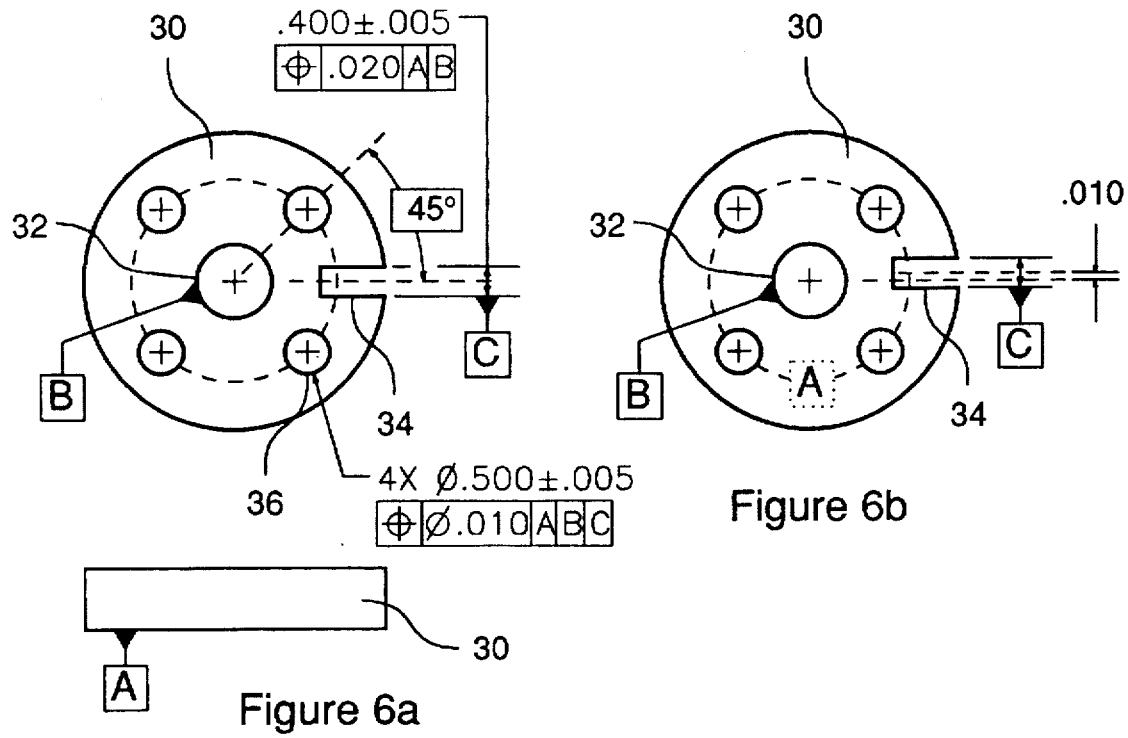
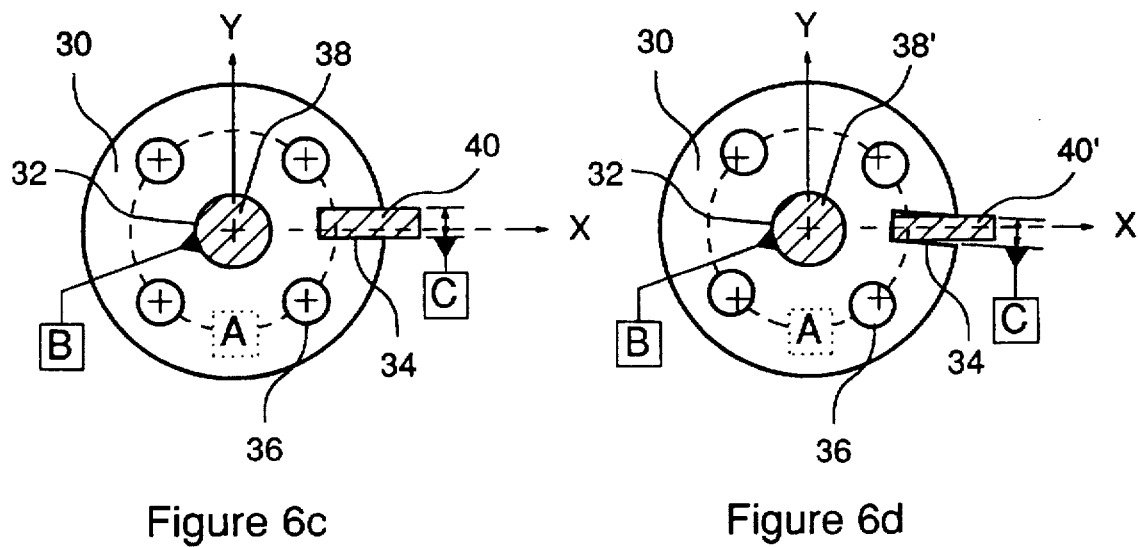
Figure 6a
Figure 6b
Figure 6c
Figure 6d

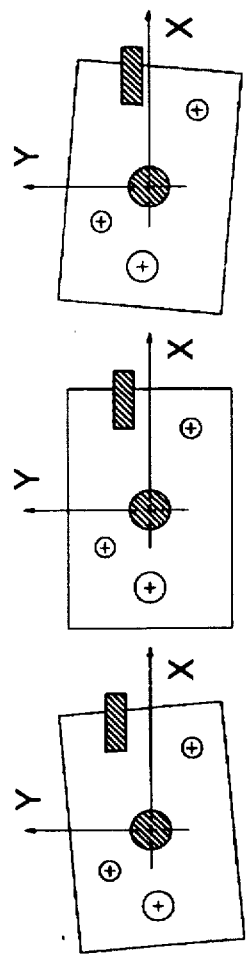
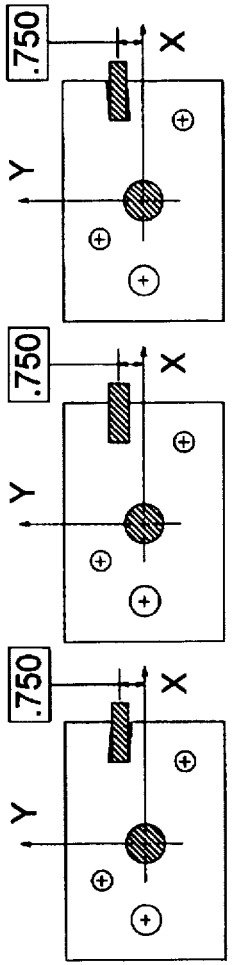
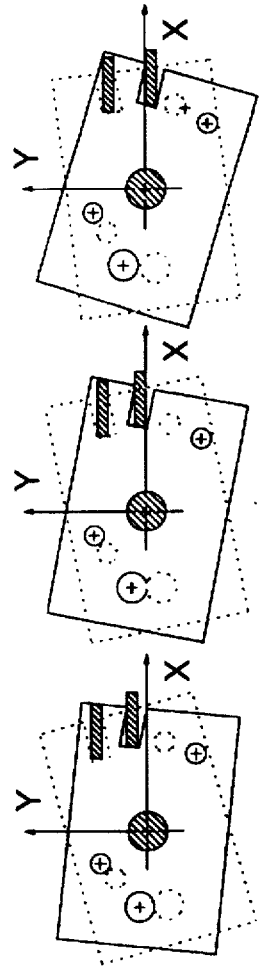
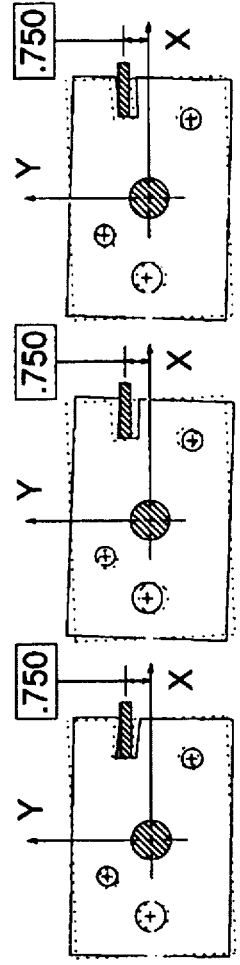
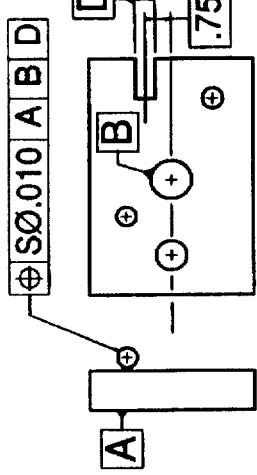
Figure 17a
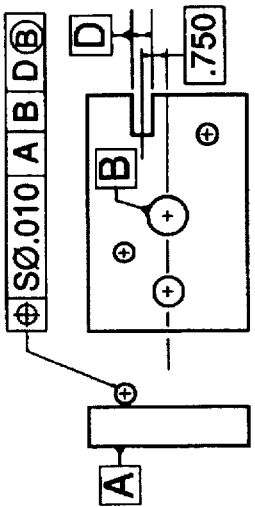
Figure 17b
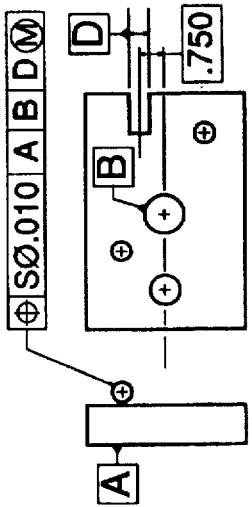
Figure 17c
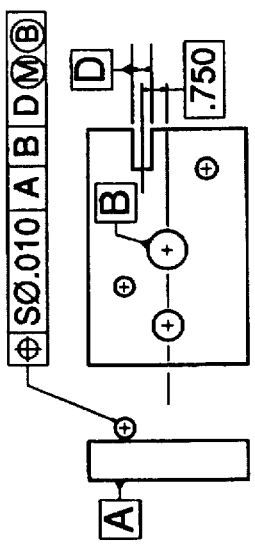
Figure 17d

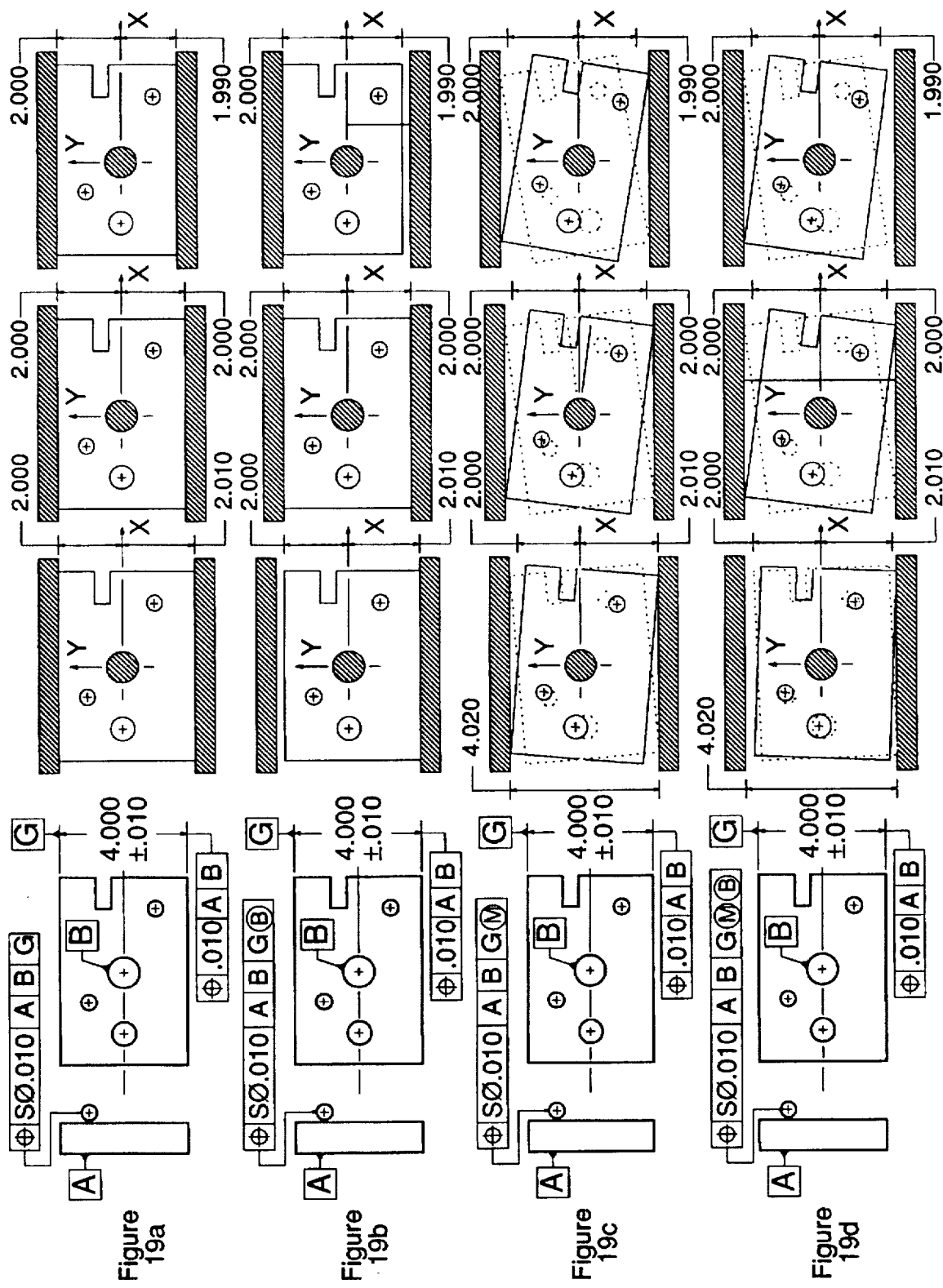

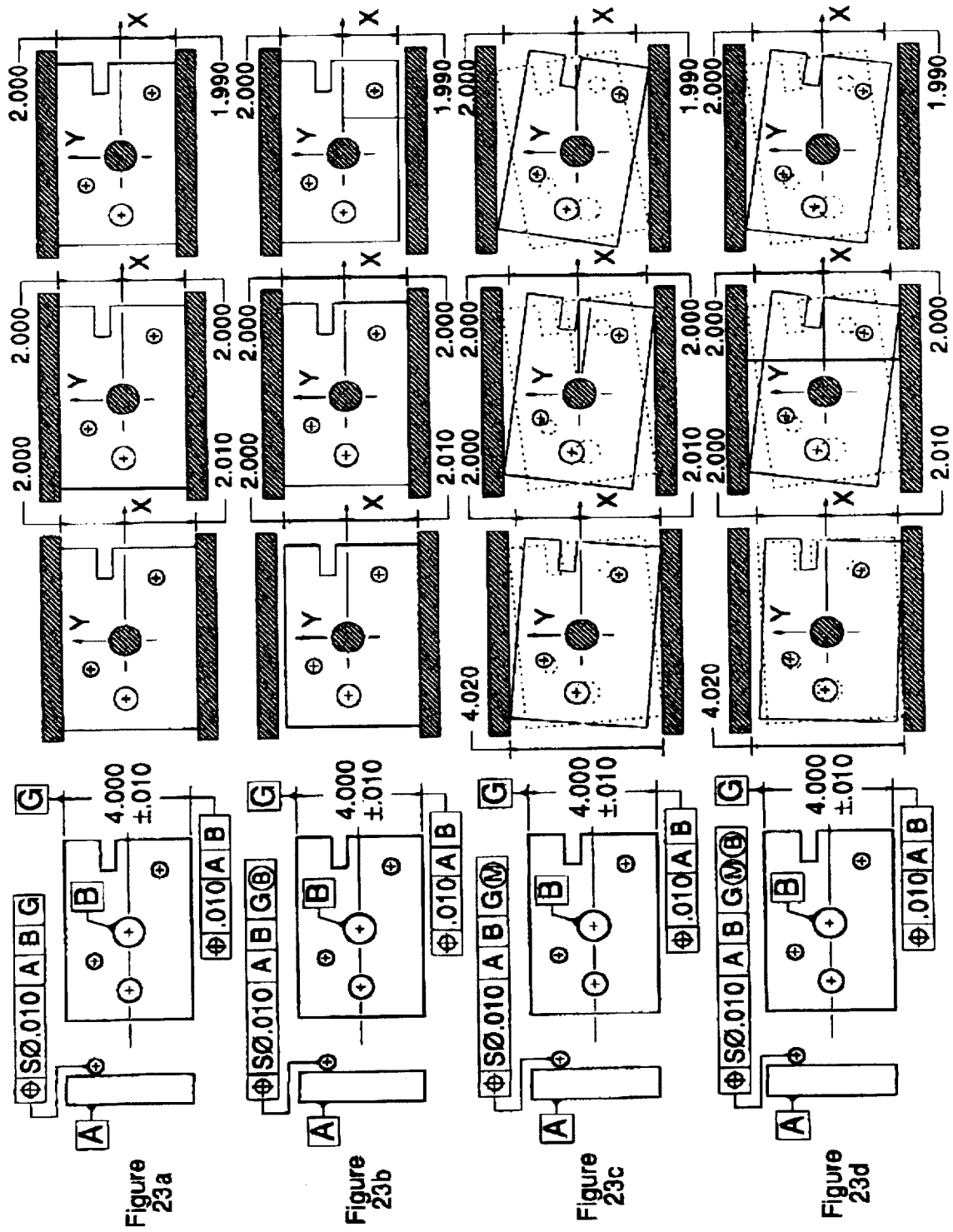

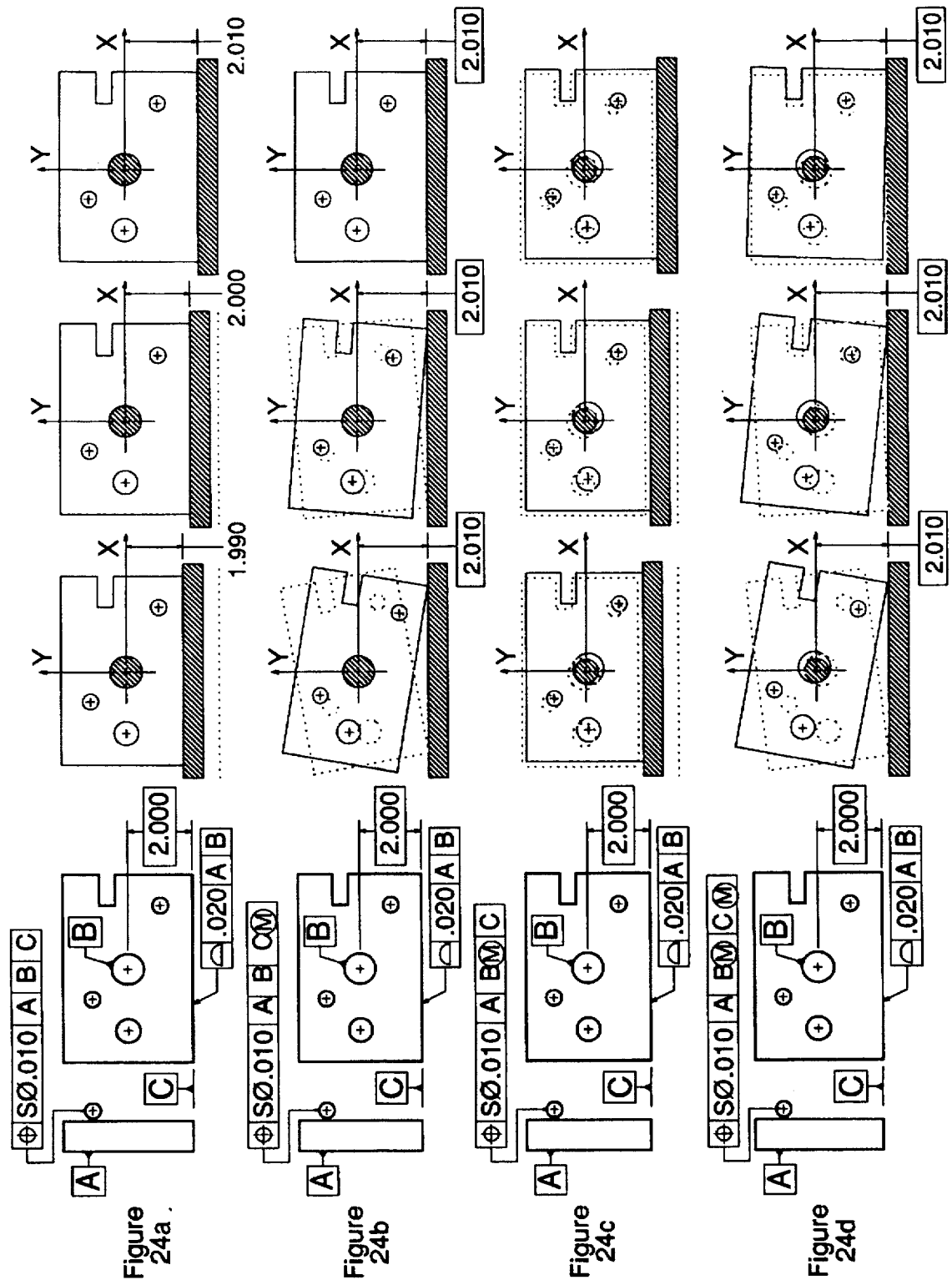

COMPUTER AIDED DESIGN (CAD) SYSTEM FOR AUTOMATICALLY CONSTRUCTING DATUM REFERENCE FRAME (DRF) AND FEATURE CONTROL FRAME (FCF) FOR MACHINE PART

BACKGROUND OF THE INVENTION

1. Field of the Invention

The present invention generally relates to the art of fabricating objects using machine tools, and more specifically to a Computer Aided Design (CAD) system for unambiguously constructing Feature Control Frames (FCF) and to Computer Aided Tolerance Analysis (CATA), Computer Aided Manufacturing (CAM) and Computer Aided Inspection (CAI) systems for automatically constructing Datum Reference Frames (DRF) for machine parts.

2. Description of the Related Art

A machine part or object made of metal or other material is conventionally formed or machined using a motorized tool such as a press or a milling machine by immobilizing the part in a holding fixture, and engaging appropriate surfaces of the part with forming or cutting tools to move or remove material and thereby form the part into the required shape.

The precision with which a part must be manufactured can be extremely high, with tolerances often expressed in microinches. With such precision comes the need to accurately determine the location of the cutting tool relative to the other features on the part. For example, if a hole must be drilled at a certain distance from an edge of a part, means must be provided to establish a frame of reference in which to measure this distance and accurately position the cutting tool.

This need is fulfilled by a Datum Reference Frame (DRF), which is a Cartesian coordinate system relative to which the locations and attitudes of machine part features are defined. Whereas one or more DRFs may be defined in each part, a DRF is not a physical entity, but rather an imaginary construct to which physical features on a part are geometrically related.

A system of standards has been established for dimensioning and tolerancing using DRFs. These standards are presented in a publication entitled "Dimensioning and Tolerancing", ASME Y14.5M-1994, American Society of Mechanical Engineers 1995. Further standards are set forth in a publication entitled "Mathematical Definition of Dimensioning and Tolerancing Principles", ASME Y14.5.1M-1994, American Society of Mechanical Engineers 1995. These publications are incorporated herein by reference in their entirety.

A DRF is defined by a small number, typically three, of specially selected features on a part called Datum Features (DF), which, if engaged by a holding fixture, render the part immobilized. The immobilizing components of a holding fixture or a functional gage can be seen as the inverses of the datum features, and are referred to as Datum Feature Simulators (DFS). The origin, axes, and planes of the DRF constructed with the help of said Datum Features are referred to as Datums.

For example, a planar surface of a part can be used as a primary datum feature to eliminate pitch, yaw, and one degree of translational freedom, with other datum features being used to eliminate the three remaining degrees of freedom which are roll and two additional degrees of translational freedom. The precise geometrical orientations and locations of the remaining features of the part are then controlled relative to the DRF so constructed.

Prior to machining or inspecting a part, a holding fixture or functional gage is produced. The part is clamped in said fixture such that its datum features mate with the datum feature simulators of the fixture, whereby the DRF of the part is brought into alignment with the DRF of the fixture and therefore with the coordinate system of the machine or measuring tool. This enables the features of the part to be reliably machined and inspected using the dimensions specified in the engineering blueprint or formal drawing.

The concept of a DRF can be better understood through the presentation of an illustrative example, which takes a simple part from the concept stage, through all the ensuing drawing, manufacturing and inspection stages.

At the outset, it is useful to make a simple perspective sketch of the part, which is shown in FIG. 1 and designated by the reference numeral 10. Further illustrated are an origin 0 and the X, Y and Z axes of a DRF which will serve to control the location of the part's features. If the part 10 were handled at this point, it would be discovered that it has six Degrees of Freedom (DOF); it can pitch, yaw and roll (three degrees of rotational freedom), and translate in the X, Y and Z directions (three degrees of translational freedom). Since the coordinate system is attached to the part, it goes wherever the part goes, making it clear that coordinate systems also have six degrees of freedom.

The six degrees of freedom are illustrated in FIG. 2. In the particular case shown, pitch is about the Y axis, yaw about the X axis and roll about the Z axis. Translation is indicated by a coordinate system X',Y',Z' which is translated from the coordinate system X,Y,Z by offsets $\Delta X, \Delta Y, \Delta Z$.

In order to be manufactured, the conceptual part must be defined in a formal drawing or Computer Aided Design (CAD) data base. In addition to creating its general outlines and dimensions, it is important to select certain features to determine the coordinate system responsible for locating and orienting the other features.

The most reliable of such "datum" features are probably (1) the bottom of the part 10 which is designated by the reference character A, which can eliminate pitch, yaw, and one degree of translational freedom in the Z direction as indicated above; (2) a long edge B of the part 10 which can eliminate roll and one more degree of translational freedom in Y; and (3) a short edge C of the part 10 which can eliminate the last degree of translational freedom in X.

These edges are selected to constitute datum features A, B and C respectively, and control the remaining features using ASME Y14.5M tolerancing tools. A formal drawing of the part 10 is shown in FIG. 3, in which Feature Control Frames (FCF) for position and surface profile incorporate all the information required to construct the intended coordinate systems.

As viewed in FIG. 3, the part 10 includes a hole 12 that is to be drilled 2.750 inches from the bottom edge B, and 3.000 inches from the left edge C. The formal drawing includes an FCF 14 for the hole 12, which specifies that the hole 12 is to have a diameter of 1.000±0.020 inches, and that the center of the hole 12 must lie within a cylindrical tolerance zone of diameter 0.015 inches at Maximum Material Condition (MMC) having its axis at the basic location (3.000,2.750). The concept of MMC will be described in detail below.

The FCF 14 further includes datum feature references 14a, in this case to the planar surfaces A, B and C. This specifies that a DRF for the part 10 is to be constructed using the datum features A, B and C in the order or sequence listed in the FCF. The formal drawing, including the FCF 14 with datum feature references 14a, is prepared by the engineer who designs the part 10, and must be adhered to exactly during all stages of the manufacture, inspection, etc. of the part 10.

Assuming that the part 10 is to be manufactured from a rough forged billet, it is secured in a milling machine vise (not shown), and the top surface is cleaned up using a rotary cutting tool 16 as illustrated in FIG. 4. This results in datum feature A, which coincides with the machine's X-Y base plane as soon as the Z axis of the machine's digital readout is reset to zero.

In the same set-up, the front surface is milled perpendicular to A and parallel to the machine's X axis. This results in datum feature B, which coincides with the machine's X-Z base plane once the Y axis of the machine's digital readout is reset to zero, after correcting for the tool radius. Repeating the process for the right hand surface, the datum feature C is produced. FIG. 4 illustrates the results of the process as described thus far.

Finishing the part at this point would consist of milling the remaining two sides, boring the hole 12, flipping the part 10 over, and cleaning up the top. However, if the machine were needed for other work before the job could be finished, and the unfinished part 10 would have to be removed from the machine, the relationship between the part 10's DRF and that of the machine would be lost.

This, however, is where datum features A, B and C come in. Since they define the part 10's reference frame, they can serve to reunite it with that of the machine.

This is accomplished by flipping the part 10 over and putting datum feature A down on the bottom of the vise to eliminate the part's pitch and yaw, after which the opposed surface may be milled to size in accordance with its Dimension origin tolerance of 1.000±0.005.

Next, datum feature A is clamped against the back of the vise with datum feature B face down on the bottom of the vise. By so doing, datum feature A is used to eliminate pitch and yaw in a new way, and datum feature B, for the first time, to eliminate roll, creating the coordinate system in which the rear surface of the part can be milled to size in accordance with its surface profile tolerance.

Next, in preparation for the final operations, pitch and yaw are again eliminated by placing datum feature A back on the bottom of the vise, and roll by clamping datum feature B up against the back of the vise. With the help of an edgefinder to null the Y axis of the milling machine on the back of the vise and the X axis on the highest point of datum feature C, the remaining end of the part 10 can be milled to size in accordance with its surface profile tolerance, and the hole 16 bored in accordance with its position tolerance.

This example illustrates how datum features A, B and C, can be used to bring the DRF of the part 10 into coincidence with that of the machine for each operation, allowing its manufacture to be completed in strict observance of the requirements of the drawing.

When more than one datum feature is referenced in an FCF, they work in concert to construct a DRF, and it is important to recognize the significance of their sequence. In the FCF for position in the example of FIG. 4, the sequence is ABC. This requires that A be used to eliminate pitch and yaw as well as translation in Z, that B be used to eliminate roll and translation in Y, and C to eliminate translation in X. This requirement is called the rule of precedence, and leads to designation of the datum features as "primary", "secondary" and "tertiary".

Since elimination of pitch and yaw is of the greatest importance, the datum feature chosen for this must be large compared to the locations and extent of the features referred to it. Since the elimination of roll is of almost equal importance, the datum feature chosen for this must also be large compared to the locations and extent of the features referred to it. In the case of datum features used only to eliminate degrees of translational freedom, the smaller the better, to reduce uncertainty.

Even if these requirements for datum feature selection appear not to be observed in the drawing, the stated order of the datum features must nevertheless be respected by all who deal with the part, until changed by the design engineer. FCFs may thus not be "interpreted", but must be "read" in the same way by those involved in the manufacturing process as by those involved in the metrology process. Only this can ensure one-to-one correspondence between the DRFs in each operation, without which the possibility of process control feedback collapses.

This concept is illustrated in FIGS. 5a to 5c. These drawings, as well as other figures that will be referenced below, are greatly simplified in that only the dimensions and tolerances which are necessary for understanding the concepts being described are included. Other dimensions and tolerances, although necessary for providing a complete engineering specification for the corresponding part, are explicitly omitted for clarity of description.

FIG. 5a is a formal drawing for a part 20, which has a bottom surface which constitutes a datum feature A, a lower edge which constitutes a datum feature B and a left hand edge which constitutes a datum feature C.

More specifically, in accordance with well defined procedures described in the referenced standards, the datum feature A is intended to eliminate pitch, yaw, and translation in the Z direction, the datum feature B is intended to eliminate roll and translation in the Y direction, and the datum feature C is intended to eliminate translation in the X direction of said part.

The drawing for the part 20 furthermore specifies a hole 22 which is to be drilled at a basic dimension of 3.000 inches from the datum feature C (equivalently 3.000 inches from the Y axis of the DRF), and 2.750 inches from the datum feature B (equivalently 2.750 inches from the X axis of the DRF).

As illustrated in FIG. 5b, it is assumed that the machining blank in which the hole 22 is to be drilled has become parallelogram-like. Assuming this error is within the tolerances governing the exterior of the part 20, and that the part 20 is placed in a requisite drill fixture 24 using datum feature B to eliminate roll in accordance with the procedure cited above, the hole 22 will be drilled at precisely the correct location specified by the drawing as further illustrated in FIG. 5b.

However, if during the inspection process the formal drawing is misread, and the datum feature C is used to eliminate roll, then, when the part 20 is placed in a requisite inspection fixture 26, as illustrated in FIG. 5c, the location of the hole 22 will appear to be displaced from its basic location. The effect of this error may be the decision to scrap a part which fully meets the requirements of the formal drawing. This demonstrates the power of the FCF in this particular case to unambiguously define the desired DRF, as well as the potential for human oversight to corrupt the system.

An important feature of the present invention relates to an ambiguity in the Y14.5.M and the Y14.5.1M standards and their international counterparts as to whether the orientation or the location of secondary and tertiary datum features should be used to eliminate roll relative to a previously fixed primary axis of a DRF. The current standards provide no means to differentiate between the two alternatives, thus leaving the matter open to interpretation and manufacturing companies exposed to the costly consequences thereof.

In a manner similar to FIGS. 5a to 5c, FIGS. 6a to 6d illustrate a case in which the uncontrolled freedom to choose between orientation and location produces the uncertainty referred to above.

FIG. 6a is a greatly simplified formal drawing of a part 30 which is referred to by practitioners in the art as the "hockey puck". The part 30 has a flat surface which is designated as a datum feature A, and a central hole 32 which is designated as a datum feature B. As indicated by the FCF for the four circumferentially spaced 0.500 inch diameter holes 36, their position is to be controlled relative to a DRF constructed using datum features in the order A, B, and C, wherein A eliminates pitch and yaw and translational freedom in the Z direction, and B eliminates translational freedom in the X and Y directions.

The one remaining degree of freedom is rotation about the fixed primary axis (Z axis) passing through the center of the hole 32. This degree of freedom is intended to be eliminated by the slot 34 which is designated as datum feature C. The slot 34 is to have a width of 0.500, and a nominal midplane which contains the axis of the hole 32. The slab-like tolerance zone within which the actual midplane must lie has a width of 0.020 inches.

Whereas either the orientation or the location of the slot 34 could serve to eliminate roll about the axis through the hole 32, the FCF fails to define a preferred alternative, and thus leads to the confusion described below.

FIG. 6b illustrates the part 30 after the hole 32 and slot 34 have been formed. As shown, the slot 34 was formed imprecisely, more specifically offset 0.010 inch above its basic location, but just within the tolerance specified in the formal drawing.

FIG. 6c illustrates the alternative in which the orientation of the slot 34 is used to eliminate rotation about the axis of the hole 32 for the purpose of drilling the holes 36. All degrees of freedom except roll are eliminated by placing the part 30 on a planar Datum Feature Simulator (DFS) (not shown) which engages the surface A, and over an expanding cylindrical DFS 38 extending upwardly therefrom which engages the hole 32.

FIG. 5c further illustrates how roll is eliminated by a DFS 40 in the form of an expanding slab which engages the slot 34. In order for the orientation of the slot 34 to be used to eliminate roll, the DFS 40 must be free to translate perpendicular to its midplane while expanding to fill all available space in the slot 34.

Since the DFS 40 is free to translate, upon coming to rest its upper and lower surfaces end up parallel to the upper and lower surfaces of the slot 34. Thus, the orientation of the slot 34 is used to eliminate roll.

In FIG. 6d, it will be assumed that the four holes 36 have been correctly drilled using the set-up shown in FIG. 6c, and that the finished part 30 is placed in an inspection fixture comprising a planar DFS (not shown) and an expanding, cylindrical DFS 38' which are identical to those described with reference to FIG. 6c.

In FIG. 6d, it will assumed that the formal drawing has been interpreted as indicating that the location, rather than the orientation, of the slot 34 is to be used to eliminate roll. As a result, the DFS for the slot 34 will be an expanding slab whose midplane is fixed at the basic location of the slot 34, and thus contains the axis of the hole 32.

Since the actual slot 34 is offset upwardly from its basic location, the part 30 is caused to rotate clockwise as the now fixed DFS 40' expands in the slot 34 as shown in FIG. 6d.

Using orientation to eliminate roll in the manufacturing process, as in FIG. 6c, and location to eliminate roll in the inspection process, as in FIG. 6d, causes the four holes 36 to appear to be offset from their desired locations. Since there is no means of deciding whether the orientation or the location of the slot 34 is to be responsible for eliminating DFS roll, it is impossible to say whether the part was manufactured correctly and inspected incorrectly, or vice versa.

This ambiguity has heretofore prevented practitioners in the art from providing a formal drawing including feature control frames which unambiguously define the preferred function of datum features. The same omission has further prevented the implementation of a CAD or other computer system which can automatically construct a DRF.

SUMMARY OF THE INVENTION

It is therefore an object of the present invention to fulfill the need which has existed heretofore in the prior art by providing a computer implemented method for unambiguously specifying and automatically constructing a Datum Reference Frame (DRF) for a machine part.

In accordance with the present invention, a formal drawing for a machine part includes a Feature Control Frame (FCF) which identifies the datum features required to construct a Datum Reference Frame (DRF) for the part, and in the case of a datum feature intended to eliminate roll about a previously fixed primary axis of the DRF, provides for a material location modifier which specifies whether the associated Datum Feature Simulator is to be fixed or free to float in a direction perpendicular to its basic axis, midplane or surface, and thus whether the orientation or the location of the datum feature should be used to eliminate roll.

The material location modifiers enable specification of Independent of Material Location (IML), at Basic Material Location (BML), at Maximum Material Location (MML) and at Least Material Location (LML), and thereby eliminate any possibility of misinterpretation of the formal drawing during all stages of manufacture and inspection of the part. Computer programs implementing a method of the invention include instructions (1) for assisting in the construction of rational FCFs based on selected datum features belonging to a mathematical model of a part defined in a CAD environment, and (2) for automatically constructing unambiguous DRFs in Computer Aided Tolerance Analysis (CATA), Computer Aided Manufacturing (CAM) and Computer Aided Inspection (CAI) environments in response to the dimensions, tolerances, datum feature sequence and material location modifiers listed in a FCF, using a set of specific DRF construction tools and rules.

The tools for DRF construction include ORIENT, ALIGN, PIVOT, SET ORIGIN, TRANSLATE and ROTATE, and are applied in order to sequentially eliminate pitch, yaw, roll, and three degrees of translation freedom from the DRF.

The rules for DRF construction include: RULE OF MATERIAL ORIENTATION, RULES OF MATERIAL LOCATION, RULES OF MATERIAL CONDITION, FIRST RULE OF PRECEDENCE, SECOND RULE OF PRECEDENCE, RULE OF MAXIMUM UTILIZATION, RULE OF COMPOSITE FEATURE CONTROL FRAMES, RULE OF NON-OVERRIDE, and RULE OF SIMULTANEITY.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 6a to 6d are diagrams illustrating how ambiguity regarding the use of the orientation or location of a datum feature to eliminate roll can result in an erroneous manufacture and inspection of a part;

FIG. 16a is a diagram illustrating conceptual construction of a DRF for the part of FIG. 15a using conceptual DRF construction tools in a Computer Aided Tolerance Analysis (CATA) or Computer Aided Inspection (CAI) system;

FIG. 16b is a diagram illustrating an intrinsic DRF for the part of FIG. 15a constructed using the conceptual procedure illustrated in FIG. 16a;

FIGS. 17a to 17d, 18a to 18d, 19a to 19d, and 20a to 20d are diagrams illustrating DRF construction using MLMs in a "floating" default scenario;

FIGS. 21a to 21d, 22a to 22d, 23a to 23d, and 24a to 24d are diagrams illustrating DRF construction using MLMs in a "fixed and floating" default scenario;

DETAILED DESCRIPTION OF THE INVENTION

Introduction

Figure 1:
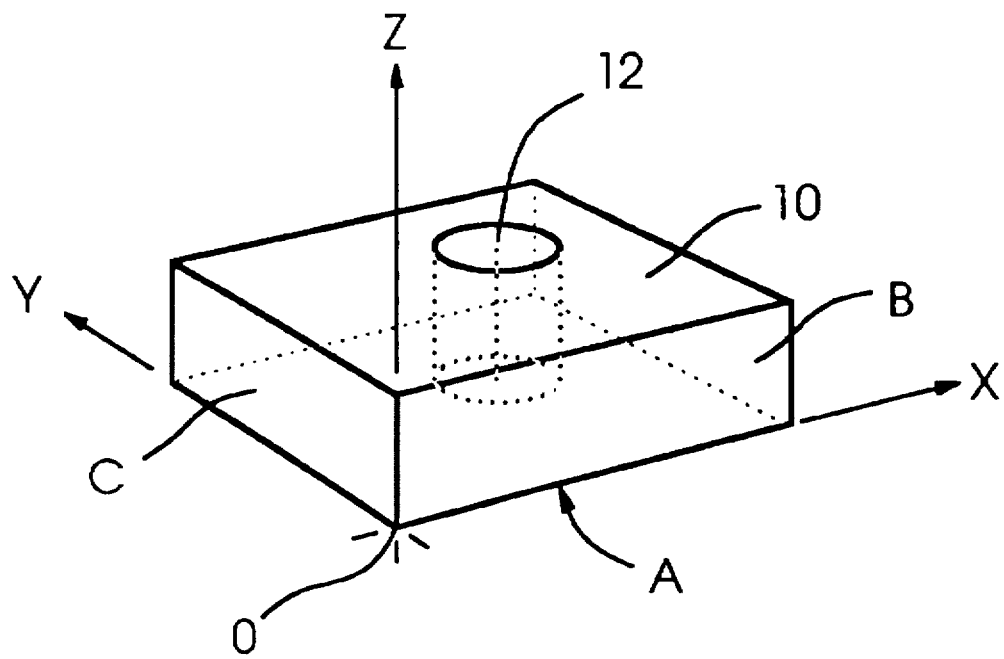
FIG. 1 is a diagram illustrating the Datum Features (DF) and a Datum Reference Frame (DRF) of a machine part.

The construction of Datum Reference Frames (DRF) is fundamental for the management of machine part geometry. Two kinds of DRF construction processes can be defined. The first might be called "natural", representing the natural, physical process of nesting a part in a manufacturing fixture in strict accordance with the "Rules of Natural DRF Construction" implied in the Y14.5M and Y14.5.1M standards. The second might be called "artificial", representing processes which may be desirable, but contravene the "Rules of Natural DRF Construction".

Whereas the "natural" process has always been assumed to be clearly defined, failure to deal unambiguously with certain secondary and tertiary datum features (DF), as exemplified by the controversy over the "interpretation" of the well known "hockey puck" (see ASME Y14.5.1M FIG. 4-2, p. 15), prove it is not. Although the explanation in the Y14.5.1M 1994 standard (4.3.3 p. 15) states quite categorically that it is the orientation of the slot-like tertiary datum feature which must be used to eliminate roll, legions of practitioners contend it is the location.

In fact, both alternatives are of interest, and the question is how to distinguish between them in order to eliminate this last source of ambiguity in specifying "natural" DRFs.

DRF Construction Concepts

Datum Reference Frame (DRF) construction is the process of orderly reduction of the three degrees of rotational and three degrees of translational freedom of Cartesian coordinate systems by means of and as affected by the degrees of rotational, translational and material condition freedom of selected datum features.

Definition I: The process of "natural" DRF construction (1) is currently defined by the datum feature labels and Material Condition Modifiers listed in a Feature Control Frame, (2) is accomplished by the sequential engagement of the referenced datum features by the associated datum features of the mating part or by the datum feature simulators of a functional gage, and (3) is governed by certain rules and natural laws, some of which are explicitly defined in the Y14.5.1M standard (§4.4.2, §4.5 and §4.6 on p. 17).

Definition II: The process of "artificial" DRF construction is identical to that of "natural" DRF construction except that the natural power of datum features to eliminate degrees of DRF freedom is artificially limited with the help of symbolic, graphic or English language indicators. The rules concerning Composite Feature Control Frames are an example of "artificial" DRF construction currently defined in the Y14.5M and Y14.5.1M standards, to wit: whereas the datum features referenced in the first tier of a Composite Feature Control Frame must eliminate both translational and rotational degrees of freedom, those referenced in the second and lower tiers may only eliminate rotational degrees of freedom.

Thesis: The ongoing uncertainty in "natural" DRF construction, and the limitations plaguing "artificial" DRF Construction are caused by:

1. Inadequacy of current Feature Control Frame symbology to completely.define the requirements.

2. Lack of a complete set of clearly defined DRF construction tools.

3. Lack of a complete set of explicit DRF construction rules.

Proposal I: "Natural" DRF construction can be made completely unambiguous by:

1. Extending ASME Y14.5M defined Feature Control Frame symbology through the addition of Material Location Modifiers to augment the existing Material Condition Modifiers.

2. Defining explicit "natural" DRF construction tools, which mimic the natural DRF construction processes of functional gages and fixtures.

3. Explicitly stating the "natural" DRF construction rules and laws which control the application of said tools.

Proposal II: Artificial DRF construction can be facilitated by:

1. Extending ASME Y14.5M (ISO 1101) defined Feature Control Frame symbology through the addition of Degrees of Freedom modifiers to augment the proposed Material Location Modifiers and the existing Material Condition Modifiers.

2. Explicitly stating the "artificial" DRF construction rules and laws which control the application of said modifiers.

The Natural DRF Construction Process

Although it is well known that DRFs are constructed by eliminating as many of their six degrees of freedom as the datum features in a particular Feature Control Frame (FCF) will permit, it is essential to understand the process explicitly. The foundation of the DRF construction process is the concept of nesting the datum features of the considered part in the datum features of the mating part, thus orienting and locating all the features of both parts relative to one another. By extension, we can substitute a machining fixture or a functional gage for the mating part, and thus focus on DRF related manufacturing and inspection processes. In the following we limit ourselves to the functional gage, and to treatment of its DRF construction components. These are commonly referred to as datum feature simulators (DFS), and are simply the inverses of the datum features they serve to engage. Thus the DFS for a planar datum feature is a plane oriented in the opposite direction, the DFS for a bore is a shaft and that for a shaft is a bore.

With the help of the functional gage concept it is possible to understand that the listing of datum feature labels and their modifiers in FCFs serves three purposes: (1) to identify the datum features intended to construct a particular DRF, (2) to specify the geometric characteristics and behavior of the datum feature simulators intended to engage said datum features, and (3) to specify the order in which said engagement is to be accomplished during DRF construction.

The definition of the "geometric characteristics and behavior of datum feature simulators" comes partly from the drawing or CAD model, and partly from the modifiers associated with each datum feature label in a FCF. In particular, the geometric nature and the basic orientations and locations of the datum feature simulators are defined by the CAD model itself, whereas the instructions concerning their behavior are stored in FCFs in the form of datum feature modifiers. The current world standards for geometric dimensioning and tolerancing recognize only one type of datum feature modifier called "Material Condition Modifiers" (MCM). These determine whether a datum feature simulator which simulates a datum feature with size is to be fixed in size or is to be free to expand or contract to consume all the space available in or outside said datum feature during the process of DRF construction. The current proposal introduces a new set of modifiers called "Material Location Modifiers" (MLM), with which the remaining ambiguity in the current standard can be completely eliminated. As will be demonstrated, said Material Location Modifiers serve to determine whether datum feature simulators shall be fixed or shall be free to translate during the process of DRF construction.

The Artificial DRF Construction Process

Whereas "natural" DRF construction foresees requiring each datum feature to remove as many degrees of DRF freedom as it can and may under the rules of "natural" DRF construction referenced herein, the artificial DRF construction extension envisions providing the designer with the freedom to construct DRFs in "unnatural" or completely artificial ways. The method for so doing involves extending the datum feature modifier concept to Include. Degrees of Freedom Modifiers (DFM) in addition to the aforementioned Material Condition Modifiers (MCM) and Material Location Modifiers (MLM). In accordance with this extension, DFMs are appended to the datum features referenced in a FCF in the same manner as are MCMs and MLMs, and specify those degrees of freedom which a particular datum feature may remove or those which it may not remove.

Material Condition Modifiers (MCM)

Figure 7A:
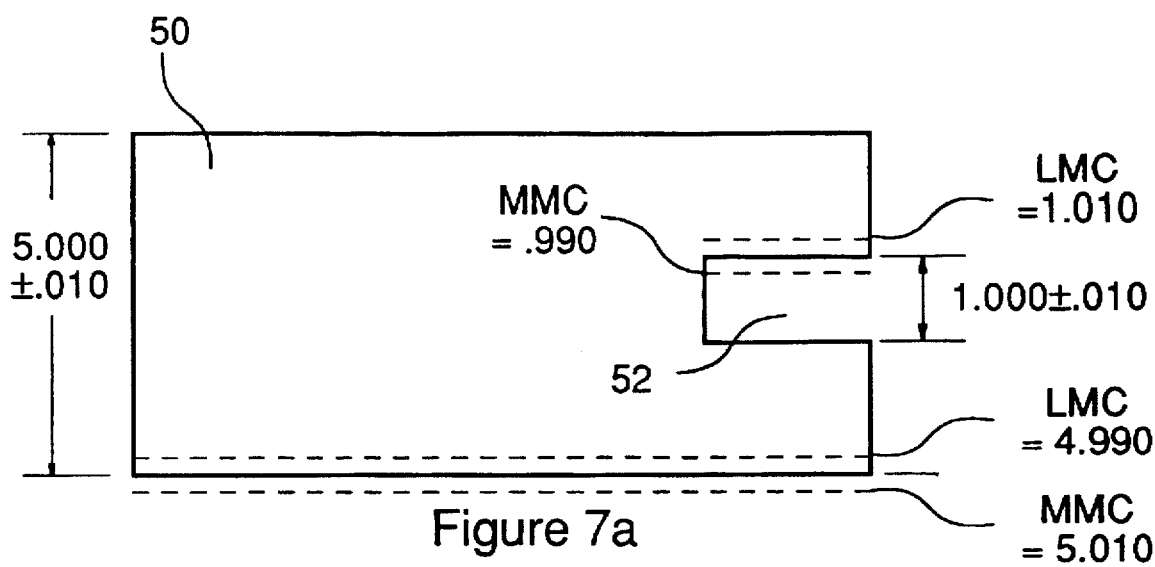
FIGS. 7a to 7c are diagrams illustrating Material Condition Modifiers (MCM)
Figure 7B:
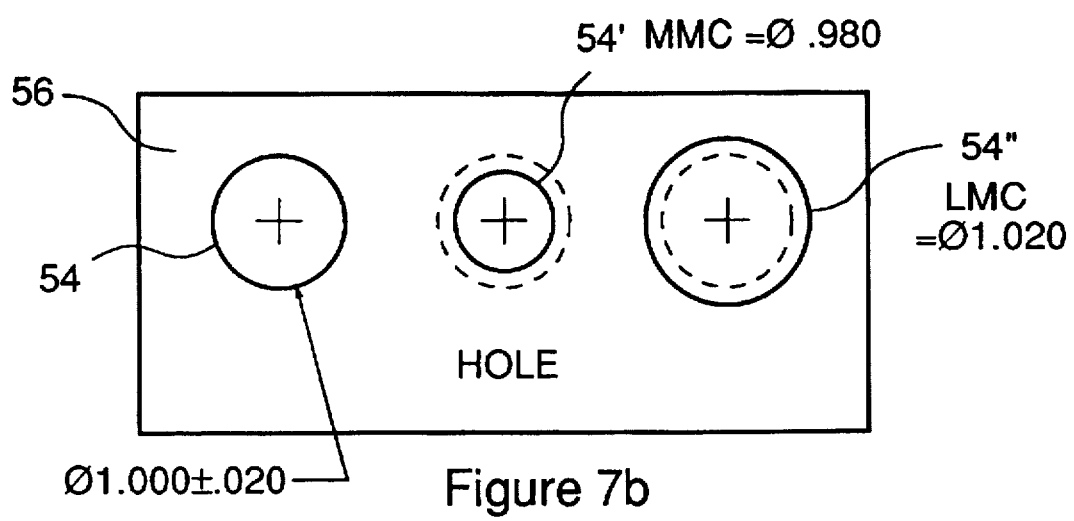
Figure 7C:
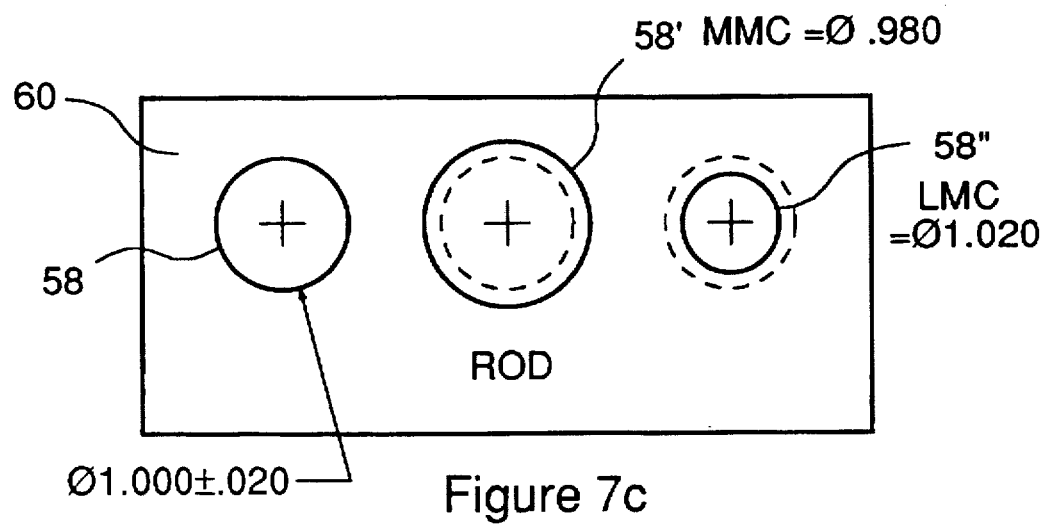

The current Y14.5.1 standard includes Material Condition Modifiers (MCM) for datum features with size which will be presented with reference to FIGS. 7a to 7c. It will be noted that features with size include spheres, cones, cylinders, slabs and slots, and that features without size include points, lines and planar surfaces.

The material condition modifiers include Regardless of Feature Size (RFS) |in essence "Regardless of Material Condition" (RMC)|, at Maximum Material Condition (MMC) and at Least Material Condition (LMC).

When a datum feature with size is referenced in a FCF accompanied by the Material Condition Modifier RFS (the default condition in the Y14.5M 1994 standard), the design engineer has stipulated that the actual size of the feature is not permitted to influence DRF construction, and thus that the implied datum feature simulator shall expand or contract to fill any available space. When a datum feature with size is referenced in a FCF accompanied by a Maximum Material Condition Modifier, the design engineer has stipulated that the actual size of the feature is intended to influence DRF construction, and that the implied datum feature simulator shall be fixed at Virtual Material Condition, in this case the Maximum Material Condition of the datum feature plus (in the case of external features) or minus (in the case of internal features) any applicable tolerance on its location or orientation. When a datum feature with size is referenced in a FCF accompanied by a Least Material Condition Modifier, the design engineer has stipulated that the actual size of the feature is again intended to influence DRF construction, and that the implied datum feature simulator shall again be fixed at Virtual Material Condition, in this case the Least Material Condition of the datum feature plus (in the case of internal features) or minus (in the case of external features) any applicable tolerance on its location or orientation.

The concepts of MMC and LMC are presented in FIG. 7a for a part 50 in the form of a rectangular slab which is formed with a rectangular slot 52. The part 50 has a width of 5.000±0.010 inches, whereas the slot 52 has a width of 1.000±0.010 inches.

The MMC of the width of the part 50, in which the part 50 has the most material, is 5.000 inches plus the upper tolerance of 0.010 inches or 5.010 inches. The LMC, in which the part 50 has the least material, is 5.000 inches minus the lower tolerance of 0.010 inches or 4.990 inches.

The MMC of the width of the slot, in which the part 50 taken as a whole has the most material, is 1.000−0.010= 0.990 inch. The LMC, in which the part 50 taken as a whole has the least material, is 1.000+0.010=1.010 inch. It will be noted that at maximum material condition, the width of the slot 52 is the smallest, and at least material condition, the largest.

FIG. 7b illustrates the concepts of MMC and LMC for an internal feature in the shape of a cylindrical hole 54 in a part 56. The hole 54 has a diameter of 1.000±020 inch.

As indicated at 54', the hole 54 is at MMC when its diameter is equal to the nominal diameter (1.000 inch) minus the lower tolerance (0.020 inch)=0.980 inch.

As indicated at 54', the hole 54 is at LMC when its diameter is equal to the nominal diameter (1.000 inch) plus the upper diameter tolerance (0.020 inch)=1.020 inch.

FIG. 7c illustrates the concepts of MMC and LMC for an external feature in the shape of a cylindrical rod 58 which extends upwardly from a part 60. The rod 58 has a diameter of 1.000±0.020 inch.

As indicated at 58' the rod 58 is at MMC when its diameter is equal to the nominal diameter (1.000 inch) plus the upper diameter tolerance (0.020 inch)=ø1.020 inch.

As indicated at 58' the rod 58 is at LMC when its diameter is equal to nominal diameter (1.000 inch) minus the lower diameter tolerance (0.020 inch)=ø0.980 inch.

Material Location Modifiers (MLM)

Although the current Y14.5 standard includes Material Condition Modifiers (MCM) as described above, it does not include Material Location Modifiers (MLM) which are introduced in accordance with the present invention to eliminate the ambiguity regarding whether the orientation or location of secondary and tertiary datum features should be used to eliminate roll. The invention envisions four MLMs: Independent of Material Location (IML), at Basic Material Location (BML), at Maximum Material Location (MML) and at Least Material Location (LML).

In operation, the modifier IML stipulates that the implied datum feature simulator shall be free to translate perpendicular to its basic axis, midplane or surface as it attempts to eliminate roll. The modifier BML, where applicable, stipulates that the implied datum feature simulator be fixed at its basic location as it attempts to eliminate roll. The modifiers MML and LML, where applicable, stipulate that the implied datum feature simulator be fixed at its Virtual Material Location as it attempts to eliminate roll.

Whereas the modifiers IML and BML apply to features with and without size, the modifiers MML and LML apply only to features without size.

Whereas the meanings of IML and at BML are obvious, the following explanation is required for MML and LML. A planar feature is at MML when it is located such that the associated part has the most material associated with it. Similarly, a planar feature is at LML when it is located such that the associated part has the least material associated with it.

Figure 8:
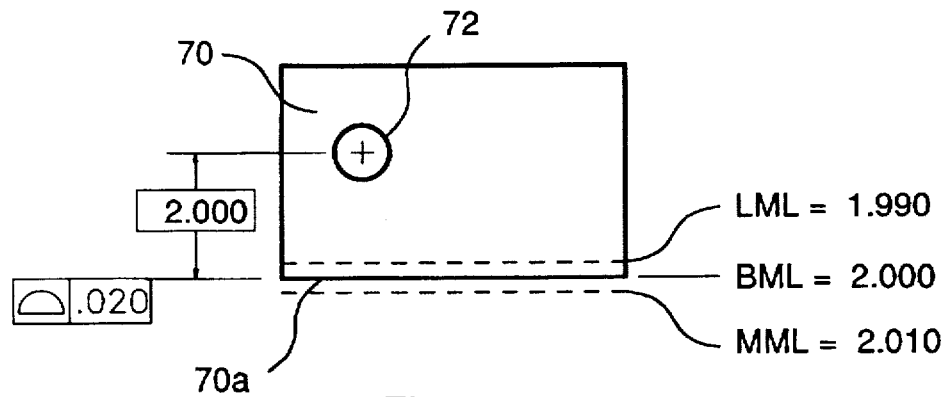
FIG. 8 is a diagram illustrating Material Location Modifiers (MLM)

The MLM concepts of the invention are illustrated in FIG. 8, which shows a part 70 which is formed with a cylindrical hole 72. A planar surface 70a of the part 70 is offset from the axis of the hole 72 by a basic dimension of 2.000 inches. The location of the planar surface 70a is controlled relative to the hole 72 by a Surface Profile tolerance of 0.020 inch.

Illustrating the above definitions, the planar surface 70a is at MML when located a distance 2.010 inches from the hole 72 and at LML when located a distance 1.990 inches from the hole 72.

Examples of the Effects of MLMs (1) A straddling planar DF referenced IML defines an opposed planar DFS which is free to translate toward the DF until brought to a stop, causing the orientation of the DF to be responsible for eliminating roll.

(2) A straddling planar DF referenced at MML defines an opposed planar DFS which is fixed at the VML of said DF, causing the orientation of said DF to eliminate roll, with the location of said DF determining the degree of residual roll in the DRF.

(3) A non-straddling, slot-like DF referenced RFS and IML, defines a slab-like DFS which is free to expand (RFS) inside the DF, and free to translate perpendicular to the mid-plane of said DFS until the DFS has consumed all the space available inside the DF at which point the object and DFS have come to rest, in effect using the orientation of the DF to eliminate roll.

(4) A non-straddling, slot-like DF referenced RFS and at BML defines a slab-like DFS which is fixed (BML) at the basic location of the DF, but is free to expand (RFS) inside the DF until the DFS has consumed all the space available inside the DF, at which point the object has come to rest, in effect using the location of the DF to eliminate roll.

Natural DRF Construction Requirements

In the case of datum features of all types, it must be known whether the associated datum feature simulators are to be (1) fixed in orientation relative to one another, or free to pitch, yaw or roll, and (2) fixed in location relative to one another, or free to translate in a direction perpendicular to their axes, mid-planes or planar surfaces. In the case of datum features with size, it must also be known whether the associated datum feature simulators are to be (3) fixed at virtual condition, or required to expand or contract to consume all the space available in or around the related datum feature.

The current Y14.5M standard uses the material condition modifiers "M" and "L", or the absence thereof, to unambiguously address requirement (3). Furthermore, although it fails to say so explicitly, the current standard clearly implies that all DFSs be fixed at their BASIC orientations, and therefore essentially addresses requirement (1).

However, the current standard lacks any means for specifying whether datum feature simulators are to be fixed in location or not, and thus leaves requirement (2) open to "interpretation". In some cases, a particular interpretation is so well embedded as to be difficult to identify as an interpretation; in others, the alternative interpretations are obvious as in the case of the "hockey puck" problem described above with reference to FIGS. 6a to 6d.

Preliminary Concepts and Definitions

As stated above, the ambiguity in the Y14.5M and related standards has to do with inadequate means for specifying how secondary and tertiary datum features are intended to eliminate DRF roll. The method of the present invention includes introducing the above described set of material location modifiers in parallel with the existing material condition modifiers.

Figure 9:
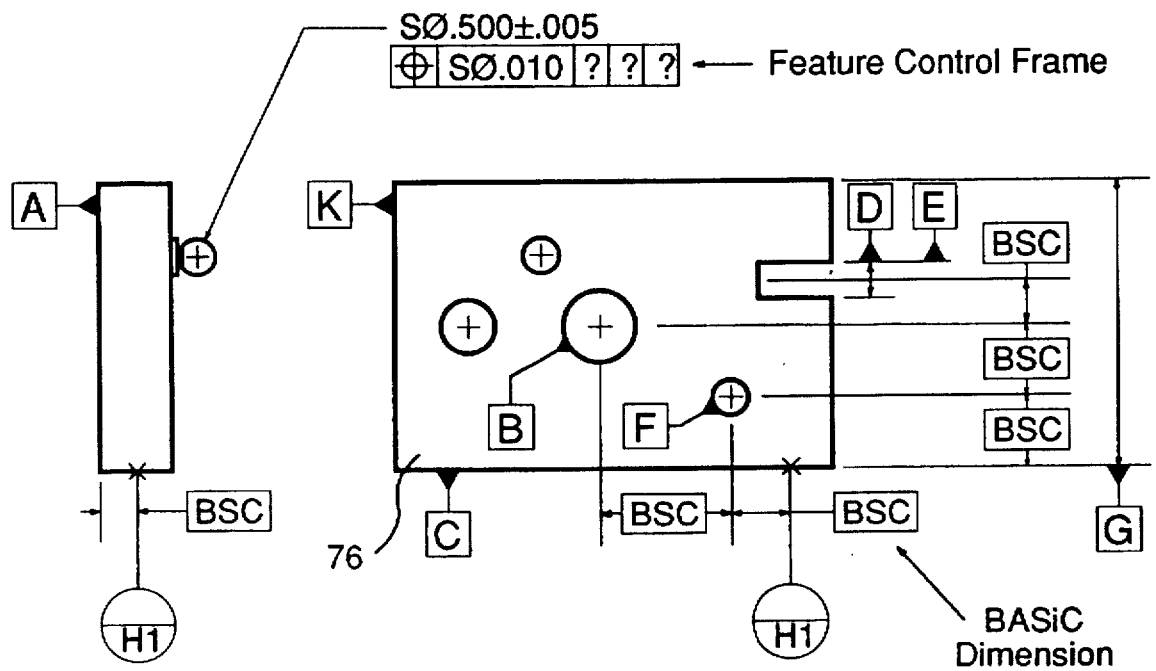
FIG. 9 is a formal drawing of a machine part.

FIG. 9 is a formal drawing of a part 76 including a flat bottom surface A, a hole B, a lower edge C, a slot D, an upper edge E of the slot D, a hole F, and a slab G which are designated as datum features. A point Hi on the edge C is designated as a datum target.

Designating datum features A and B as primary and secondary respectively, the tertiary datum features identified in TABLE I below demonstrate significantly different characteristics which determine their significantly differing ability to eliminate DRF roll. For example, either the orientation or the location of datum features D and E could serve to eliminate roll, but only the locations of F and H1 can do so.

It can also be seen that the orientations of datum features C and G are primarily responsible for eliminating roll, but that their locations have an effect as well. Although easily demonstrated in common assembly situations, this is a condition undefined in the current Y14.5M standard, but easily dealt with by the present material location modifiers.

TABLE I

| Feature Name | Feature w. Size | Feature w/o Size | Unit Vector relative to the Primary DRF Axis PRL | Unit Vector relative to the Primary DRF Axis PPD | Location relative to the Primary DRF Axis Non-straddling | Location relative to the Primary DRF Axis Straddling |
|---|---|---|---|---|---|---|
| C  | —  | X | — | X | — | X |
| D  | X  | — | — | X | X | — |
| E  | —  | X | — | X | X | — |
| F  | X  | — | X | — | X | — |
| G  | X  | — | — | X | — | X |
| H1 | —  | X | — | X | X | — |

As will become clear from subsequent description, it is important in the case of roll eliminating secondary and tertiary datum features to differentiate between those which "straddle" versus those which do not straddle the primary DRF axis because of the different treatment they will naturally demand.

For the purposes of the invention we define a datum feature as "straddling" if the normal projection of the primary axis onto the feature intersects the feature's axis, center plane or surface, and otherwise as "non-straddling". As a consequence, the special case of a feature whose axis is parallel to the primary axis is non-straddling. These alternatives are illustrated in FIG. 10.

Figure 10:
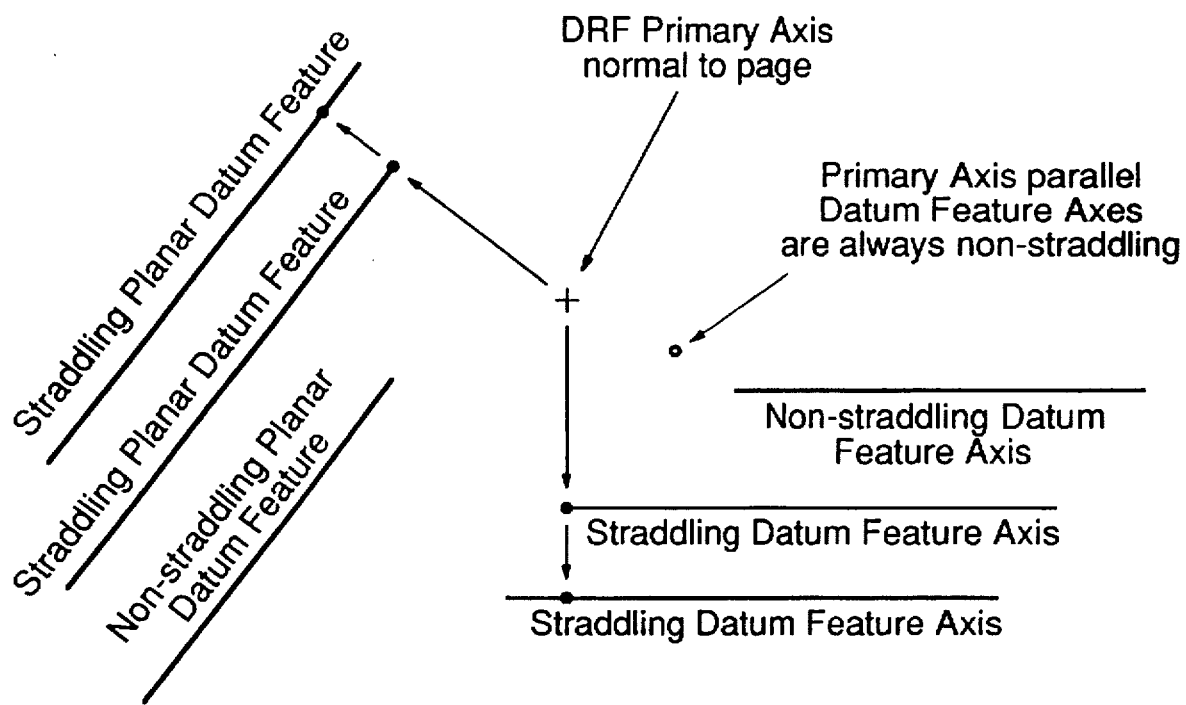
FIG. 10 is a diagram illustrating straddling and non-straddling datum features.

From this definition it is evident from FIG. 10 that the datum features D, E, F and H1 of the part 76 of FIG. 9 are "non-straddling", and that C and G are "straddling".

Natural DRF Construction Tools & Rules

The construction of DRFs can be accomplished by a set of conceptual tools which mimic the defining process of nesting a machine part in a functional gage. These tools are either vectorial in nature or simulate the functional gaging process directly using computer based part and gage models. The vectorial process uses the tools tabulated in TABLE II, to build the founding DRF. If required, the vectorial process provides the springboard for refining the founding DRF with the help of functional gage simulation. This addresses residual DRF mobility arising from among other causes, (1) an insufficient number of datum features to remove all six degrees of freedom, (2) the mobilizing effects of certain Material Condition and Material Location Modifiers under certain circumstances, and (3) the mobilizing effects of imperfect datum feature form.

TABLE II

Natural DRF Construction Tools

| | |
|---|---|
| ORIENT | to eliminate Pitch and Yaw |
| ALIGN | to eliminate Roll using the orientation of a Datum Feature |
| PIVOT | to eliminate Roll using the location of a Datum Feature |
| SET ORIGIN | to eliminate all three degrees of translational freedom |
| TRANSLATE | to shift a DRF along its axes by BASIC dimensions |
| ROTATE | to swivel a DRF about an axis by a BASIC angle |

The tools are implemented by applying them in succession to each datum feature listed in a feature control frame in an effort to eliminate as many degrees of DRF freedom as possible and permissible. The ORIENT tool uses the orientation of a datum feature to eliminate pitch and yaw; the ALIGN tool uses the orientation of a datum feature to eliminate roll, and so on. Hardly coincidentally, these are common names for the same tools used to construct DRFs in Coordinate Measuring Machine software systems.

Figure 11A:
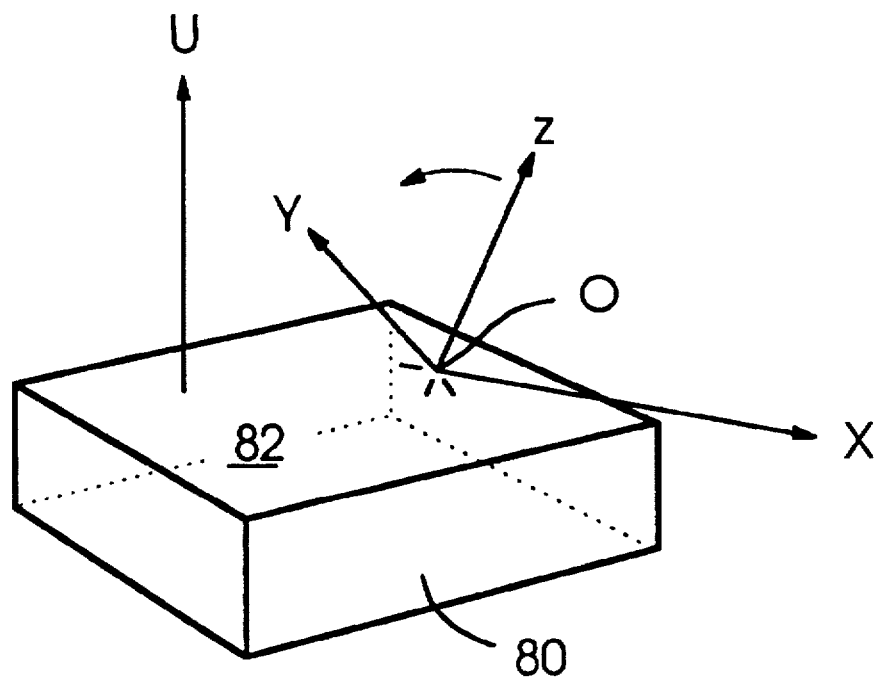
FIGS. 11a and 11b are diagrams illustrating the use of an ORIENT tool to eliminate pitch and yaw in a DRF.
Figure 11B:
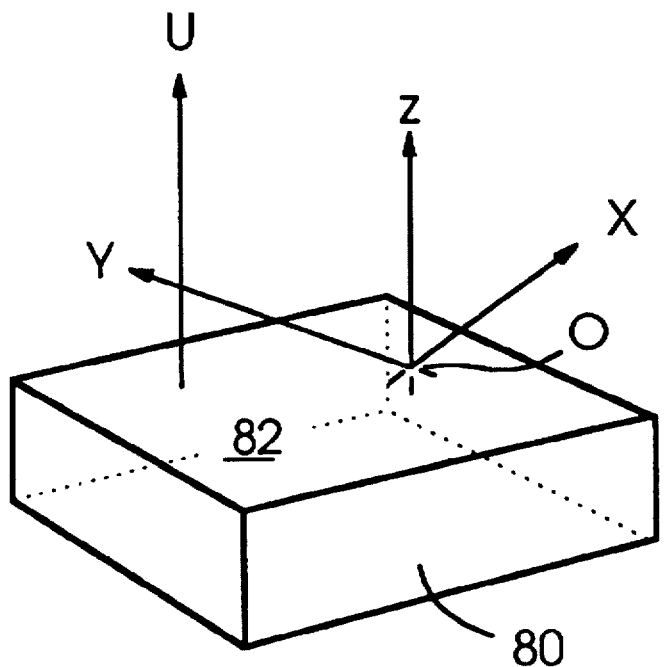

The ORIENT tool eliminates pitch and yaw, and is illustrated in FIGS. 11a and 11b. FIG. 11a illustrates a part 80 having a planar datum feature 82, a unit normal vector U and a DRF with X,Y,Z axes which are skewed relative to the feature 82. FIG. 11b illustrates how the ORIENT tool causes the DRF axes to be re-oriented such that one of the axes, in this case the Z axis, becomes parallel to the unit vector U.

Figure 12A:
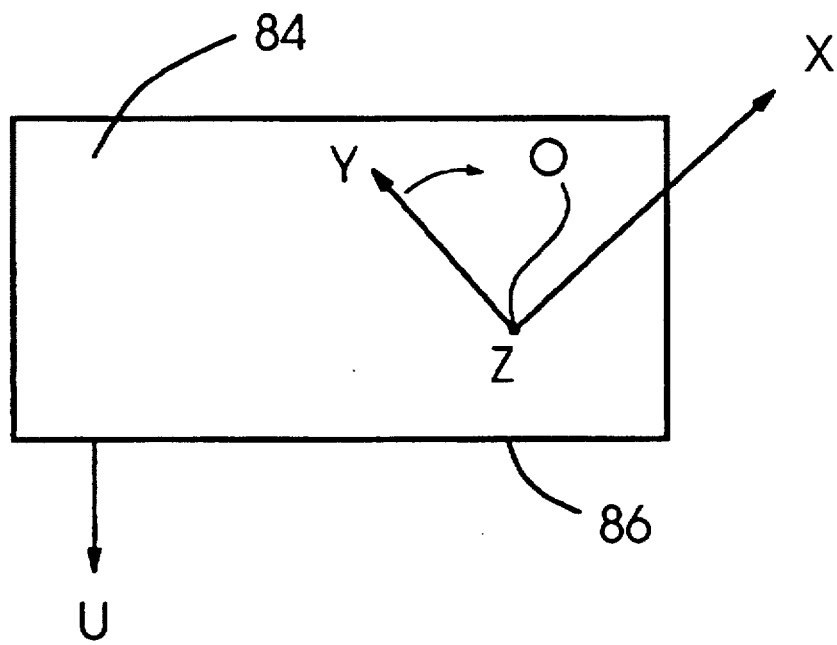
FIGS. 12a and 12b are diagrams illustrating the use of an ALIGN tool to eliminate roll in a DRF using the orientation of a datum feature.
Figure 12B:
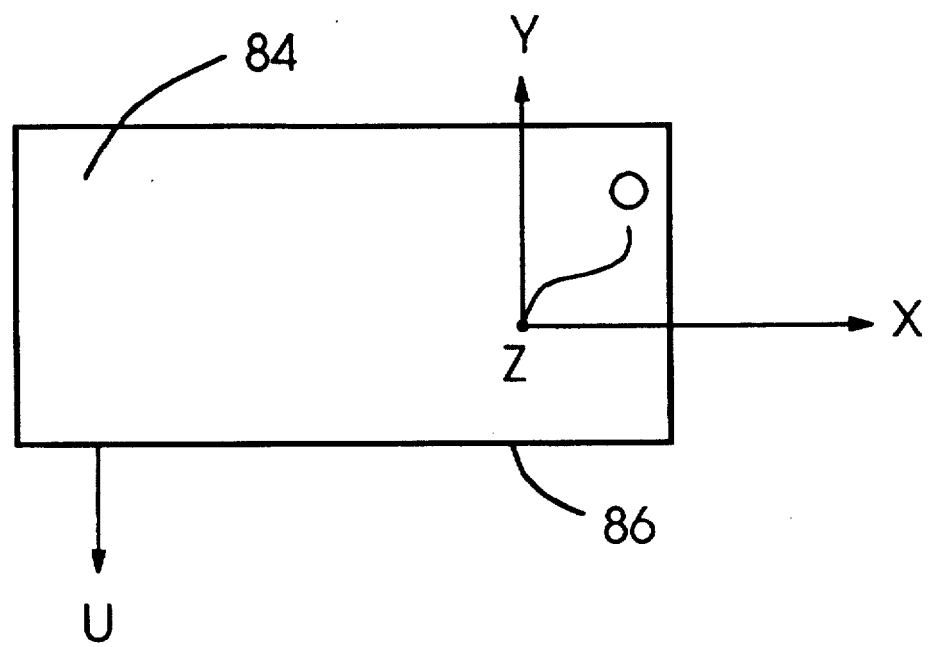

The ALIGN tool eliminates roll using the orientation of a datum feature 86, and is illustrated in FIGS. 12a and 12b. FIG. 12a illustrates a part 84 having a planar datum feature which extends perpendicular to the plane of the drawing, a unit normal vector U, and a DRF with unaligned X, Y axes. FIG. 12b illustrates how the ALIGN tool is used to rotate the DRF about its Z axis until one of its remaining axes, in this case the Y axis, becomes parallel to the unit vector U.

Figure 13A:
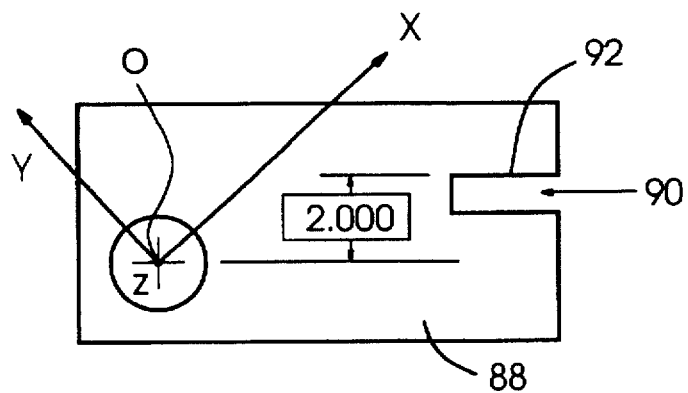
FIGS. 13a and 13b are diagrams illustrating the use of a PIVOT tool to eliminate roll in a DRF using the location of a datum feature.
Figure 13B:
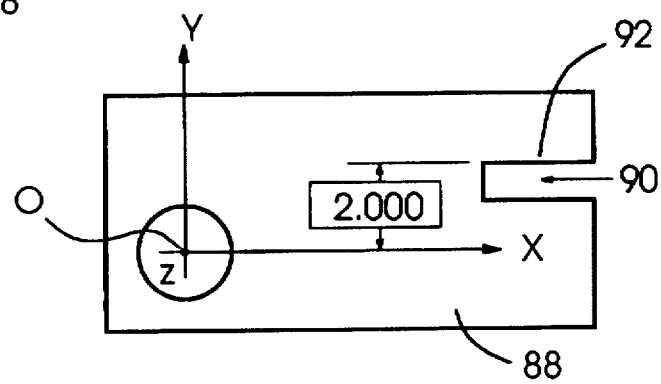

The PIVOT tool eliminates roll using the location of a datum feature and is illustrated in FIGS. 13a and 13b. FIG. 13a, illustrates a part 88 having a non-straddling planar datum feature 92 which extends perpendicular to the plane of the drawing, a hole 94 and a DRF with unaligned X, Y axes whose origin is fixed at the center of the hole 94. The feature 92 is nominally located 2.000 inches from the center of the hole 94. FIG. 13b illustrates how the PIVOT tool is used to rotate (pivot or swivel) the DRF about its Z axis until one of the remaining axes, in this case the X axis, is offset from the feature 92 by the basic dimension of 2.000 inches.

Figure 14A:
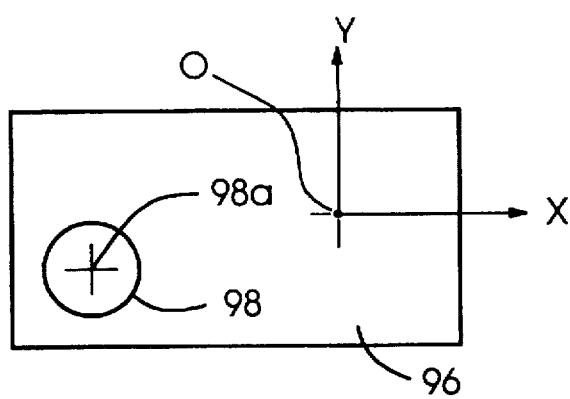
FIGS. 14a and 14b are diagrams illustrating the use of a SET ORIGIN tool to eliminate translation in a DRF.
Figure 14B:
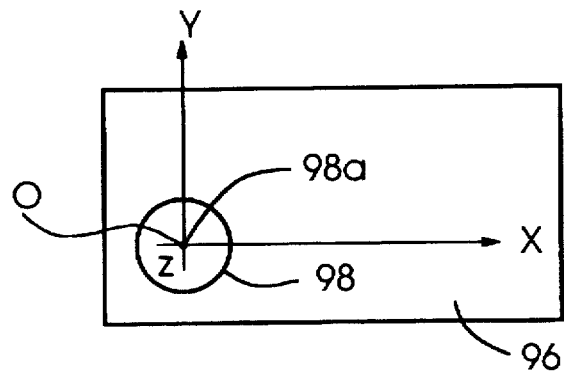

The SET ORIGIN tool eliminates one or more degrees of translational freedom and is illustrated in FIGS. 14a and 14b. FIG. 14a illustrates a part 96 having a hole 98 with an axis 98a, and a previously oriented and aligned DRF with a mislocated origin O. FIG. 14b illustrates how the SET ORIGIN tool causes the origin of the DRF to be translated so as to lie on the axis 98a of the hole 98.

The TRANSLATE and ROTATE tools are used merely to re-rotate the axes and shift the origin of a previously constructed DRF in order to bring it into line with a Cartesian coordinate system of a machine tool, inspection machine, CAD representation, etc., and are not explicitly illustrated.

It can be proven that these six tools are both necessary and sufficient for the construction of all static and mobile DRFs when used in conjunction with the Rules of Natural DRF Construction which are listed below. Rules 1, 3, 4, 5, 6, 7, 8 and 9 are either explicitly or implicitly defined in the ASME Y14.5M 1994 standard. The remaining rule 2 is an integral element of the present invention.

Rules of Natural DRF Construction

1. RULE OF MATERIAL ORIENTATION—the orientations of datum feature simulators are fixed relative to one another at the BASIC angles of their corresponding datum features;

2. RULES OF MATERIAL LOCATION (i) datum feature simulators which do not serve to eliminate roll relative to a previously fixed primary axis of the DRF are fixed at their basic locations relative to previously established datums.

(ii) all datum feature simulators representing datum targets are fixed at their basic locations relative to previously established datums.

(iii) the manner in which datum feature simulators serve to eliminate roll relative to a previously fixed primary axis of a DRF is determined by explicit Material Location Modifiers or by Material Location Modifier defaults.

3. RULE OF MATERIAL CONDITION—datum feature simulators representing datum features with size are fixed at Virtual Material Condition (VMC) if accompanied by Maximum Material Condition (MMC) or Least Material Condition (LMC) modifiers, and will otherwise expand or contract to consume all space inside or outside respective datum features;

4. FIRST RULE OF PRECEDENCE—datum features listed in a Feature Control Frame (FCF) must be used in the order in which they appear;

5. SECOND RULE OF PRECEDENCE—the tools ORIENT, ALIGN, PIVOT, and SET ORIGIN must be applied to each datum feature in the order shown in an attempt first to eliminate pitch and yaw, then to eliminate roll, and then to eliminate the three degrees of translational freedom;

6. RULE OF MAXIMUM UTILIZATION—each datum feature must contribute everything it can and may to eliminating the six degrees of freedom of a DRF;

7. RULE OF COMPOSITE FEATURE CONTROL FRAMES—datum features listed in a first tier of a composite feature control frame are empowered to remove both translational and rotational degrees of DRF freedom; datum features listed in a second tier and all lower tiers of a composite feature control frame may only remove rotational degrees of freedom;

8. RULE OF NON-OVERRIDE—no datum features may override degrees of freedom eliminated by previous datum features;

9. RULE OF SIMULTANEITY—all features referenced to a same mobile DRF must meet their requirements simultaneously unless modified by a notation indicating that they are separate; in the case of separate groups of features referenced to the same mobile DRFs defined by second and lower tiers of separate composite feature control frames, the rule of simultaneity applies separately within each group.

Physical Process for Constructing a DRF

Figure 15A:
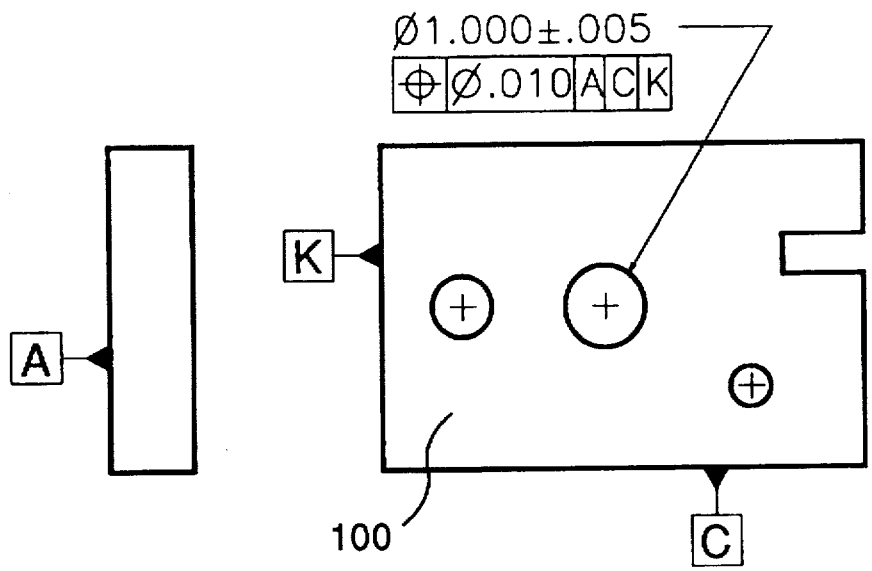
FIG. 15a is a formal drawing of a machine part.
Figure 15B:
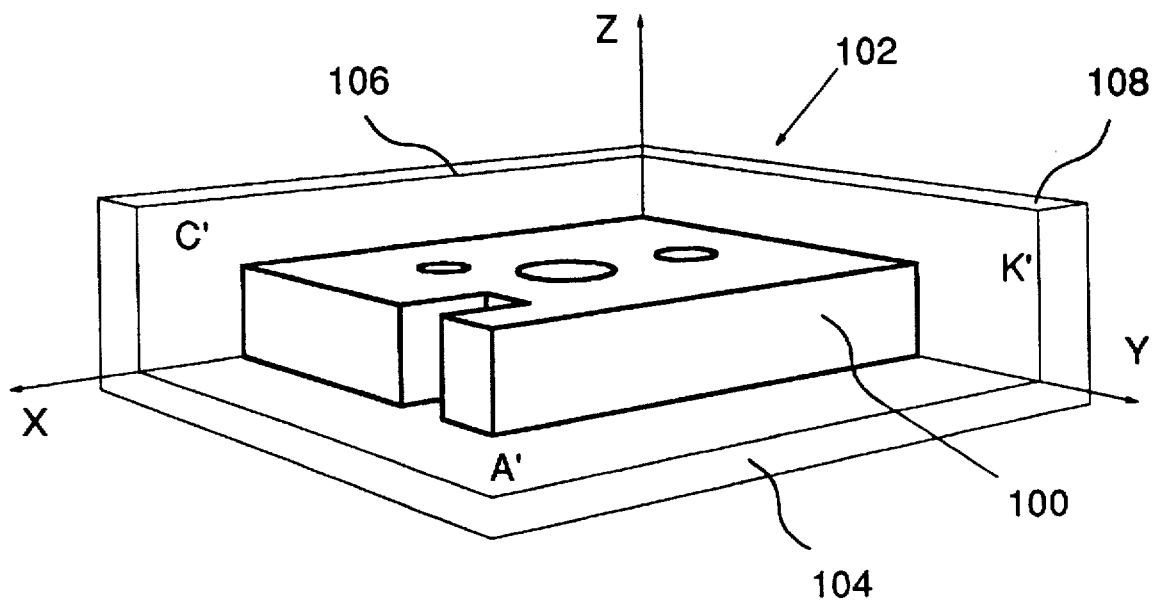
FIG. 15b is a diagram illustrating physical construction of a DRF for the part of FIG. 15a using a functional gage.

FIGS. 15a and 15b illustrate how a DRF for a part 100 which is illustrated in FIG. 15a can be physically constructed using a functional gage 102 which is illustrated in FIG. 15b.

The part 100 has a flat bottom A, and edges C and K, which constitute planar datum features, as well as a central hole to be drilled relative to a DRF which is constructed using the datum features A, C and K. The functional gage 102 consists of slabs 104, 106 and 108 having functional gage components A', C' and K' constituted by surfaces thereof respectively.

The first DRF construction step is to place datum feature A of the part 100 on the functional gage component A' of the slab 104 as shown in FIG. 15b to eliminate two degrees of rotational freedom (pitch and yaw), and one degree of translational freedom in the Z direction.

The second step is to push datum feature C up against the functional gage element C' of the slab 106 to eliminate the remaining degree of rotational freedom (roll), and one more degree of translational freedom in the Y direction, being careful not to override the previous elimination of pitch and yaw.

The third step is to push datum feature K up against the functional gage element K' of the slab 108 to eliminate the remaining degree of translational freedom in the X direction, being careful not to override the previous elimination of roll, pitch and yaw.

This process demonstrates the First Rule of Precedence governing the order in which the datum features are to be used, the Rule of Maximum Utilization, in which each datum feature must contribute everything it can to DRF construction, and the Rule of Non-Override, barring succeeding datum features from altering previously eliminated degrees of DRF freedom.

Conceptual Process for Constructing a DRF

Figures 16A, 16B:
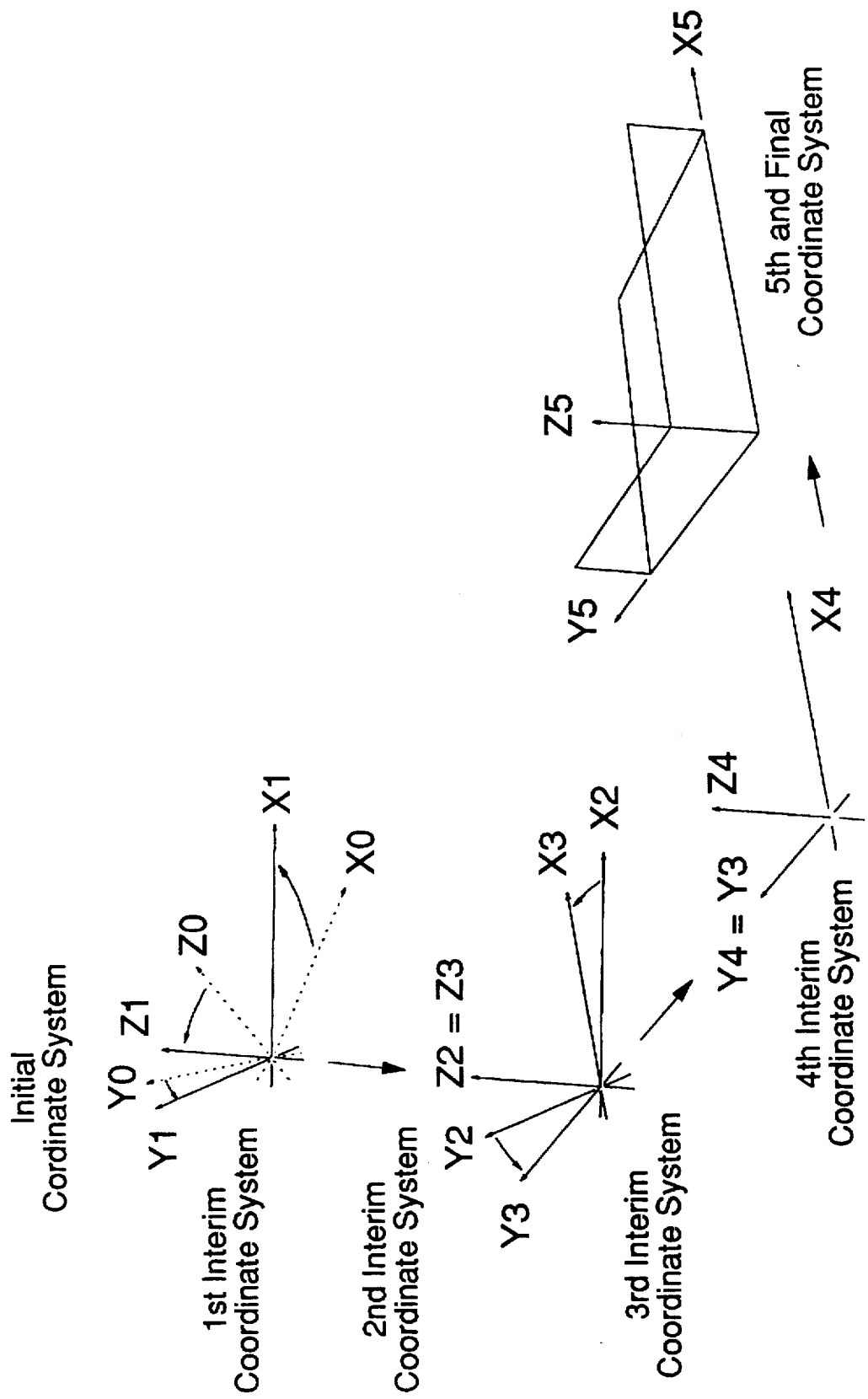

A DRF can also be constructed "conceptually" thus without a physical functional gage, using the computer system of a coordinate measuring machine to process data collected from individual datum feature surfaces. FIGS. 16a and 16b illustrate how a conceptual DRF is constructed for the part 100 of FIG. 15a using the tools which were described with reference to FIGS. 11 to 14.

As real machine parts or objects do not have perfect geometry, the coordinate measuring machine must simulate the function of physical DFSs by contacting the three highest points, on the primary datum feature, the two highest on the secondary datum feature and the single highest point on the tertiary datum feature of the part 100.

As shown in FIG. 16a, the ORIENT tool is used to orient the Z axis of an initial or "unborn" coordinate system (X0, Y0, Z0) normal to the plane through the three highest points on datum feature A, eliminating two degrees of rotational freedom (pitch and yaw) and creating a 1st interim coordinate system (X1, Y1, Z1).

The SET ORIGIN tool is then used to move the origin of the 1st interim coordinate system into said plane through the three highest points on datum feature A, eliminating the first degree of translational freedom in the Z direction, and creating a 2nd interim coordinate system (X2, Y2, Z2).

The ALIGN tool is used to make the X axis of the 2nd interim coordinate system parallel to the orientation of the line through the two highest points on datum feature C, eliminating the last degree of rotational freedom (roll), and creating a 3rd interim coordinate system (X3, Y3, Z3) The SET ORIGIN tool is then used to move the origin of the 3rd interim coordinate system into said line through the two highest points on datum feature C, eliminating one more degree of translational freedom in the Y direction, and creating a 4th interim coordinate system (X4, Y4, Z4).

Finally, the SET ORIGIN tool is used to move the origin of the 4th interim coordinate system to the highest point on datum feature K, eliminating the last degree of translational freedom in the X direction, and creating a 5th and final coordinate system (X5, Y5, Z5).

Material Location Modifier Alternatives

As described above, means have been heretofore available for designating the conditions under which the "size" of a datum feature is intended to influence the construction of a DRF. Namely, if a datum feature with size is referenced Regardless of Material Condition (RMC) [i.e. Regardless of Feature Size (RFS)], the associated datum feature simulator is required to expand or contract to consume all the space available. This always leads to complete elimination of the associated degrees of freedom.

On the other hand, if a datum feature with size is referenced at Maximum Material Condition (MMC), the associated datum feature simulator is to be frozen in size at Virtual Material Condition (VMC), resulting in an ever looser fit as the datum feature departs from VMC, and thus to a partially mobile DRF. The same applies conceptually in the case of Least Material Condition (LMC) datum feature modifiers.

Since datum features are possessed of orientation and location as well as size, the manner in which these characteristics are intended to influence the construction of DRFs must also be addressed. Every indication in the Y14.5M standard and all common practice implies that the orientation of datum feature simulators shall be fixed at the basic angles of their associated datum features. The Rule of Material Orientation set forth above provides a simple means for formally eliminating this source of potential confusion.

However the need has remained in the prior art to institute rules which determine whether datum feature simulators are to be fixed or free to translate during DRF construction. In the interest of maintaining the integrity of the current system, it seems advisable to incorporate the means for expressing the designer's intent in this regard into the symbology of the feature control frame. Thus, the present invention adds a set of material location modifiers to the existing set of material condition modifiers. As will become clear in the following sections, the proposed material location modifiers completely eliminate the remaining ambiguity surrounding "natural" DRF construction.

In particular, the new material location modifiers will enable the designer to specify whether (1) the orientation or (2) the location of the slot in the "hockey puck" is to be used to eliminate DRF roll, in addition to providing a host of new design alternatives.

Three alternative defaults and therefore three alternative possible sets of material location modifier symbols and Rules of Material Location are provided within the scope of the present invention, as follows.

1. "Floating" : all datum feature simulators which serve to eliminate roll about a previously fixed DRF axis are free to "float" (translate) in a direction perpendicular to their basic axes, mid-planes or surfaces.

2. "Fixed & Floating" : all datum feature simulators which serve to eliminate roll about a previously fixed DRF axis and represent "non-straddling" datum features are locked at their basic locations, whereas those which represent "straddling" datum features are free to float in a direction perpendicular to their basic axes, midplanes or surfaces.

3. "Fixed" : all datum feature simulators which serve to eliminate roll about a previously fixed DRF axis are "fixed" at the basic locations of their defining datum features.

The "Fixed & Floating" default requires two new explicit modifiers: (B) and (I), whereas the "Floating" default requires only the new explicit modifier (B), and the "Fixed" default requires only the new explicit modifier (I). Although requiring a greater number of explicit modifiers, the "Fixed & Floating" default requires the fewest changes to existing drawings under the current 1994 standard and is perhaps the most natural of the three, in that it is natural to think of datum feature simulators which represent non-straddling datum features as fixed, and those which represent straddling datum features as floating.

It is further within the scope of the invention to have no default modifiers, and require that all modifiers be stated explicitly.

Material Location Modifier Alternative I—Default: "Floating"

In the "Floating" default scenario, all datum feature simulators which serve to eliminate roll relative to a fixed primary axis are free to translate perpendicular to their basic axes, mid-planes or surfaces unless explicitly constrained. The unconstrained, default condition is represented by the material location modifier IML (Independent of Material Location), just as the default for unconstrained size is represented in the Y14.5 standard by the Material Condition Modifier RFS (herein replaced for consistency by the modifier RMC for "Regardless of Material Condition").

In addition, the constraints which may be required on the location of datum feature simulators are applied with the help of the following additional material location modifiers as described above: BML (at BASIC Material Location) for features with size, as well as for non-straddling features without size, and MML (at Maximum Material Location) and LML (at Least Material Location) for all features without size. TABLES III to VII, taken in combination with FIGS. 17 to 20 respectively, provides an overview of the proposed symbols and their applicability.

TABLE III

"Floating" Material Condition & Location Modifiers for Natural DRF Construction

| Short Form | Long Form | Full | Meaning | Applies to: |
|---|---|---|---|---|
| default | R_C | RMC | Regardless of Material Condition (RFS) | any feature with size |
| M | M_C | MMC | at Maximum Material Condition | any feature with size |
| L | L_C | LMC | at Least Material Condition | any feature with size |
| default | I_L | IML | Independent of Material Location | any feature with or w/o size |
| B | B_L | BML | at BASIC Material Location | any feature with size + "non-straddling" w/o size |
| M | M_L | MML | at Maximum Material Location | any feature w/o size |
| L | L_L | LML | at Least Material Location | any feature w/o size |

In the "Floating" default scenario, the modifiers (I) and (B) are added to the classical Y14.5M 1994 symbol set, and the use of the modifiers (M) and (L) is extended to apply to the location of datum features without size. Since the modifier (I) is always implied, the modifier (B) must be used expressly to arrest datum feature simulators which are not intended to "float". There is no danger of confusion between (M) used for MMC and (M) used for MML, or between (L) used for LMC and (L) used for LML, because the former apply only to features with size, and the latter only to features without size. The combination of the "Floating" default and the new material location modifiers enables the following.

Rules of Material Location ("Floating" Default)

1. All Datum Feature Simulators representing Datum Targets are fixed at their BASIC locations relative to previously established Datums.

2. All Datum Feature Simulators which do not serve to eliminate Roll about a previously fixed primary DRF axis are fixed at their BASIC locations relative to previously established Datums.

3. All Datum Feature Simulators which serve to eliminate Roll about a previously fixed primary DRF axis shall be free to float in a direction perpendicular to their basic axes, mid-planes or surfaces, unless associated with the Material Location Modifiers (B), (M) or (L), used as set forth in the table above Examples of "Floating" Default Alternative To demonstrate the implications of the "Floating" default alternative, four different scenarios are presented as illustrated in FIGS. 17 to 20 respectively. In each of these drawings, the leftmost entity is a formal drawing of an exemplary machine part or object. The rightmost three entities illustrate the tertiary datum feature of the part as being displaced through a specified range of angular or linear locations.

1. FIGS. 17a to 17d illustrate the case of a non-straddling datum feature with size (the "hockey puck").

These figures illustrate the effects on DRF construction of a rotation of datum feature D about a vertical axis through the its midpoint by −15°, 0°, and +15°.

FIG. 17a illustrates an expanding slab-like DFS D' which is free to float in Y.

FIG. 17b illustrates an expanding slab-like DFS D' which is fixed at BML in Y.

FIG. 17c illustrates a VMC slab-like DFS D' which is free to float in Y.

FIG. 17d illustrates a VMC slab-like DFS D' which is fixed at BML in Y.

In this default scenario, by saying nothing (the invisible symbols for IML and RMC), it is automatically stipulated that the DFS intended to engage datum feature D be free to translate and expand to consume all the space inside D, thus making its orientation responsible for eliminating roll. Changes in the orientation of datum feature D have no effect on the DRF. This alternative creates a static DRF (to the extent D is not wedge-shaped), represents the "Y14.5.1 interpretation" illustrated in FIG. 4-2 on p. 15 of the ASME Y14.5.1M-1994 standard, and is illustrated in FIG. 17a.

As shown in FIG. 17b, adding only the material location modifier (B) to datum feature D creates an equally static DRF, but this time making the location of D responsible for eliminating roll. This alternative is in keeping with the more common "shop floor interpretation" of the "hockey puck" conundrum.

As shown in FIG. 17c, adding only the Material Condition Modifier (M) to datum feature D causes the slab-like DFS to be fixed at its Virtual Material Condition (VMC) but remain free to translate, resulting in a highly unstable and therefore undesirable DRF as D departs from Virtual Material Condition.

As shown in FIG. 17d, adding both an (M) for MMC and a (B) for BML to datum feature D causes the slab-like DFS to be fixed at its Virtual Material Condition (VMC) and at its basic location, resulting in a relatively stable DRF with minor residual roll. This alternative is in keeping with the "generally accepted interpretation" of this case of the "hockey puck" in which datum feature D is referenced at MMC. It can therefore be seen that addition of the material location modifier (B) completely eliminates the ambiguity of the "hockey puck".

2. FIGS. 18a to 18d illustrate the case of a non-straddling datum feature without size.

These figures illustrate the effects on DRF construction as a construction of a shift in the Y location of datum feature E relative to datum feature B from 1.240 to 1.250 to 1.260.

Figure 18A:
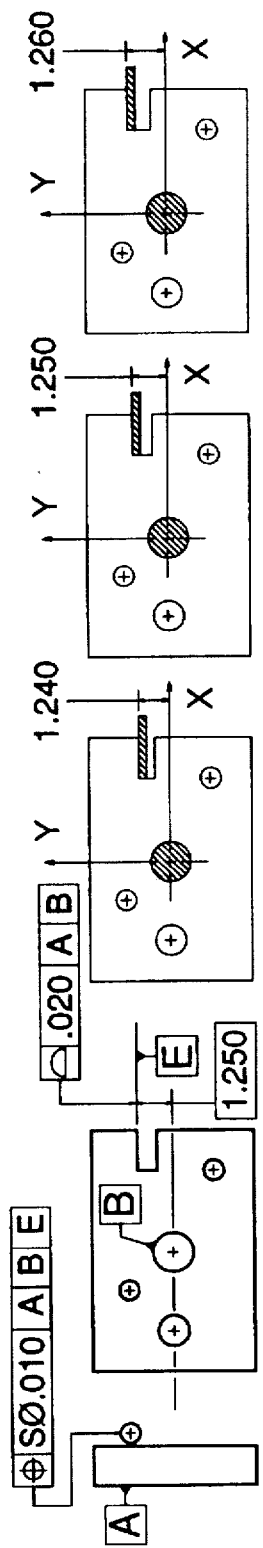

FIG. 18a illustrates a planar DFS E' which is free to float in Y.

Figure 18B:
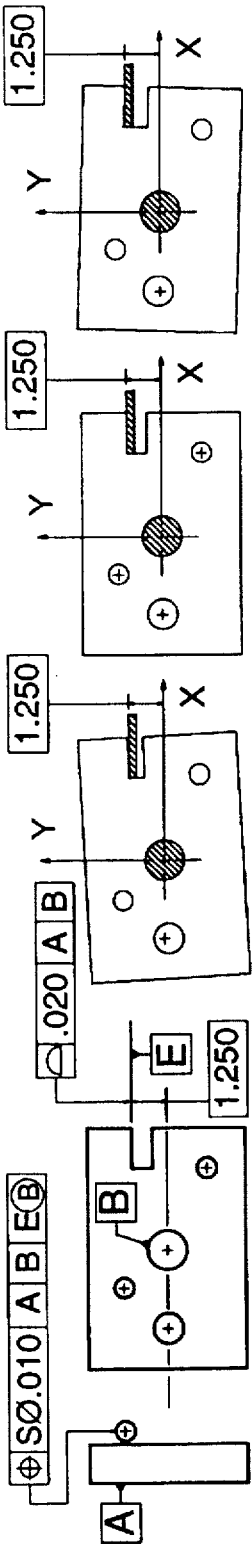

FIG. 18b illustrates a planar DFS E' fixed at BML in Y.

Figure 18C:
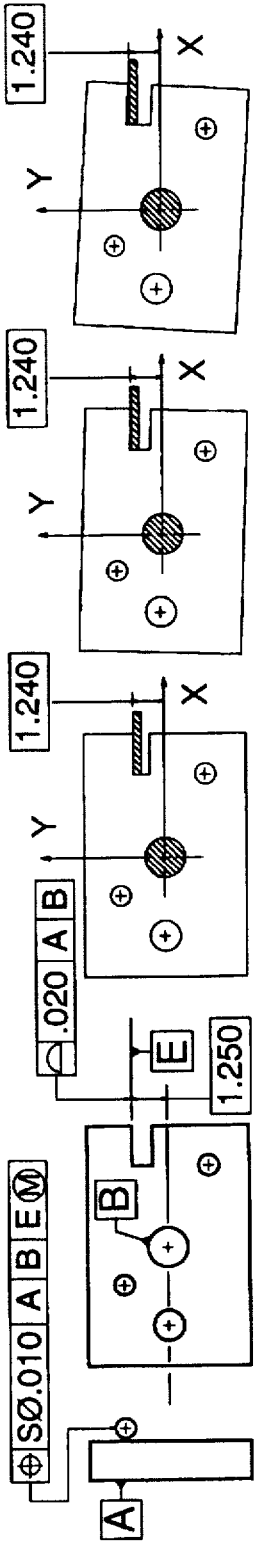

FIG. 18c illustrates a planar DFS E' fixed at maximum Virtual Material Location (VML) in Y.

Figure 18D:
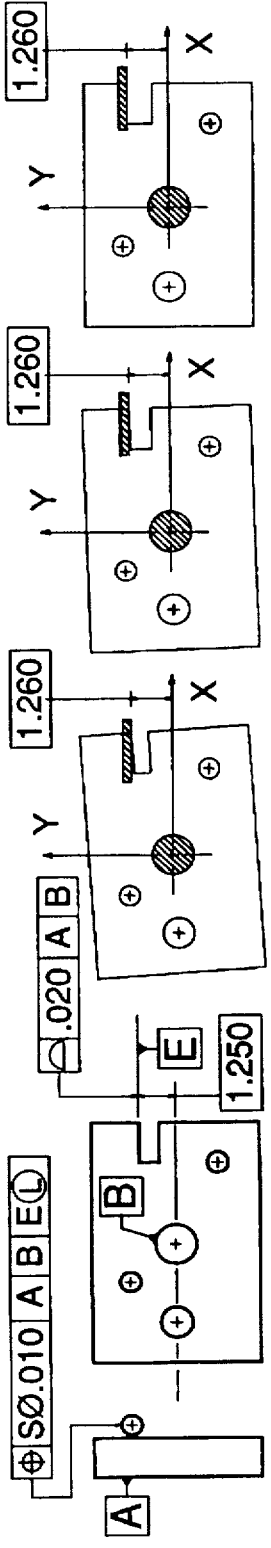

FIG. 18d illustrates a planar DFS E' fixed at least VML in Y.

In the "Floating" default scenario by saying nothing (the invisible symbol for IML), it is automatically stipulated that the DFS intended to engage datum feature E be free to translate until stability is achieved, thus making the orientation of E responsible for eliminating roll, regardless of its location. This alternative creates a static DRF to the extent E is not a "rocker" and is shown in FIG. 18a.

Adding the modifier (B) to datum feature E for @BML creates an equally static DRF in which the location of E is responsible for eliminating roll. This is accomplished by pivoting datum feature E about datum feature B until it runs up against the associated DFS fixed at E's basic location as shown in FIG. 18b.

Adding a stand-alone (M) to datum feature E for @MML, or (L) for @LML produces the same effect, except in these cases by pivoting datum feature E until it runs up against a DFS fixed at the feature's VML as illustrated in FIGS. 18c and 18d respectively.

3. FIGS. 19a to 19d illustrate the case of a straddling datum feature with size.

These figures illustrate the effect on DRF construction of a change in the width of datum feature G from 4.010 to 4.000 to 3.900 with a commensurate shift in the center plane from −0.005 to 0.000 to +0.005.

FIG. 19a illustrates a shrinking, vise-like DFS G' which is free to float in Y.

FIG. 19b illustrates a shrinking, vise-like DFS G' which is fixed at its BML in Y.

FIG. 19c illustrates vise-like DFS G' fixed at VMC which is free to float in Y.

FIG. 19d illustrates a vise-like DFS G' at VMC which is fixed at BML in Y.

In the "Floating" default scenario, by saying nothing (the invisible symbols for IML and RMC), it is automatically stipulated that the DFS intended to engage G be free to translate and contract to consume all the space outside G, thus making the orientation of the entire feature responsible for eliminating roll. This alternative creates a static DRF to the extent G is not wedge- or barrel-shaped , and is shown in FIG. 19a.

As shown in FIG. 19b, adding a (B) to datum feature G for @BML creates a DRF most likely based on the orientation of only one surface of G, since the DFS is not free to translate until both surfaces have been engaged. This alternative is also static, to the extent the engaged surface is not convex "a rocker".

As shown in FIG. 19c, adding either an (M) to datum feature G for @MMC, or an (L) for @LMC, but failing to add a (B) for @BML results in a DRF with the potential for significant Roll mobility as G departs from Virtual Material Condition.

As shown in FIG. 19d, adding either an (M) or an (L) together with a (B) to datum feature G results in a DRF with the potential for slightly less Roll mobility than shown in FIG. 19c, and explicitly stipulates the common "interpretation" of the datum feature series: |A,B,G(M)|. These examples demonstrate a number of new DRF alternatives which the addition of Material Location Modifiers make available.

4. FIGS. 20a to 20d illustrates the case of a straddling datum feature without size.

These figures illustrate the effects on DRF construction of a shift in the location of datum feature C relative to B from 1.990 to 2.000 to 2.010.

Figures 20A, 20B, 20C, 20D:
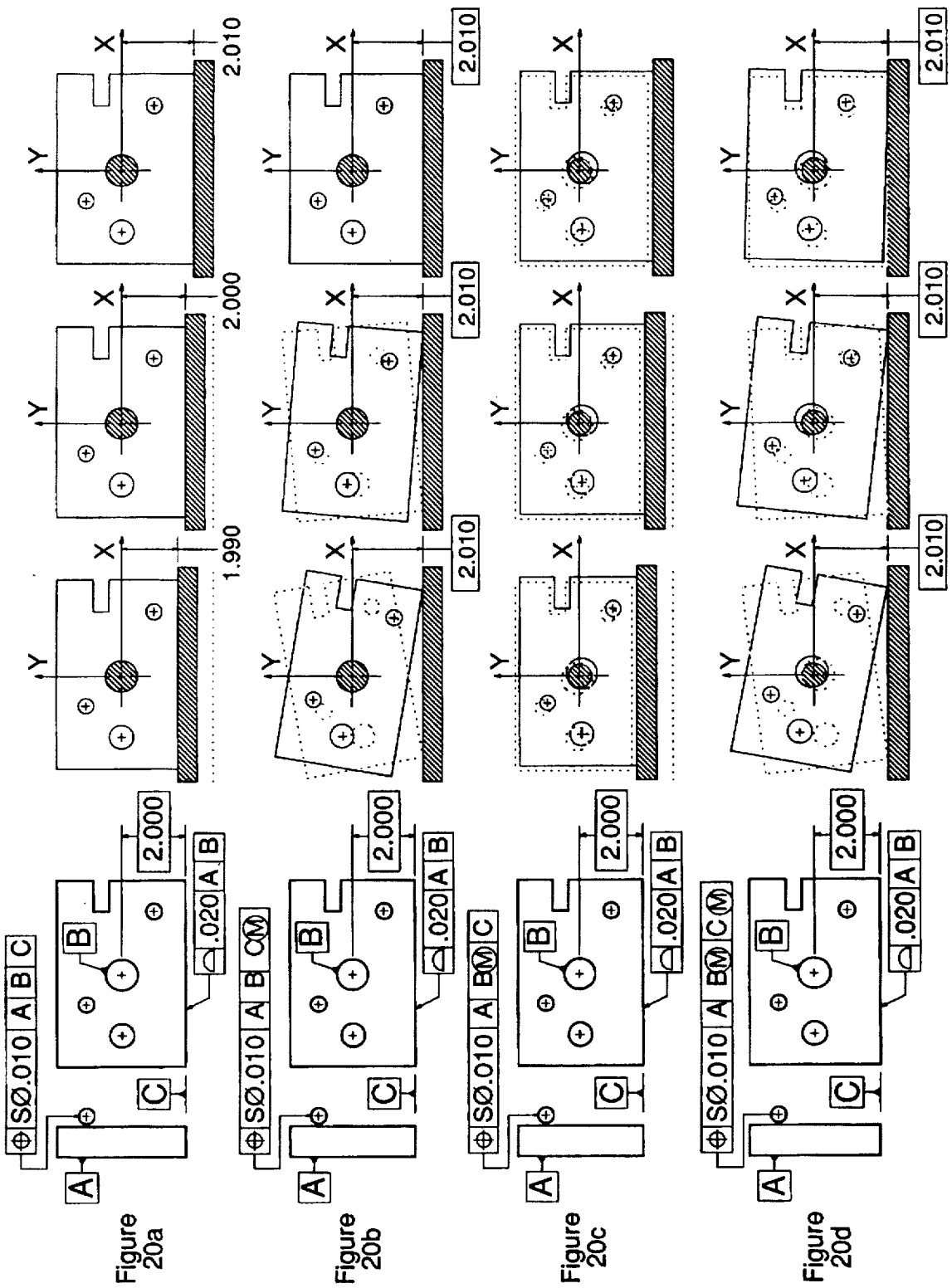

FIG. 20a illustrates a planar DFS C' which is free to float in Y relative to an expanding cylindrical DFS B'.

FIG. 20b illustrates a planar DFS C' which is fixed in Y at Maximum Material Location (MML) relative to an expanding cylindrical DFS B'.

FIG. 20c illustrates a planar DFS C' which is free to float in Y relative to a VMC cylindrical DFS B'.

FIG. 20d illustrates a planar DFS C' which is fixed in Y at MML relative to a VMC cylindrical DFS B'.

In the "Floating" default scenario, by saying nothing (the invisible symbol for IML), it is automatically stipulated that the DFS intended to engage C be free to translate until stability is achieved, thus making the orientation of C responsible for eliminating roll, independent of its location. This is the standard interpretation of this scenario, and leads to a static DRF to the extent C is not convex (a "rocker"). It is illustrated in FIG. 20a.

As shown in FIG. 20b, adding either an (M) to datum feature C for @MML, or an (L) for @LML stipulates that the DFS intended to engage C be at Virtual Material Location, in which case the orientation of C is still responsible for eliminating roll, but now with a degree of mobility which depends on the location of C. It is only the addition of material location modifiers which now makes it possible to specify this common scenario in machine part assembly.

FIGS. 20c and 20d refine the new alternatives by demonstrating the effects of adding an MMC modifier to datum feature B, first with C referenced IML, then with C referenced @MML. As can be seen, adding an MMC modifier to B with C referenced IML introduces two degrees of residual translational freedom only, whereas adding an MML modifier to C as well, introduces residual Roll mobility as C retreats from MML.

In summary, FIGS. 17 to 20 illustrate how various DRFs can be clearly differentiated using appropriate material location modifiers in conjunction with a "Floating" default, and in particular, how they eliminate the confusion of the "hockey puck" conundrum in a way which dovetails easily with current Y14.5M annotation and is in complete conformance with the newly stated rules for "natural" DRF construction.

All examples use the following abbreviations: The symbols used in the column labeled "Conceptual DRF Construction Commands" are to be understood as follows: OR=ORIENT, AL=ALIGN, PI=PIVOT, SOX, SOY and SOZ=SET ORIGIN in X, Y, and Z respectively.

The symbols used in the column labeled "Material Condition Dependent Mobility" are to be understood as follows: $\Delta X$, $\Delta Y$, $\Delta Z$ stand for residual Material Condition and Material Location induced translational mobility along DRF X, Y and Z, axes respectively, whereas $\Delta a$ stands for minimal and $\Delta \Delta a$ for significant residual roll mobility.

(Datum feature simulators) bear the same labels as their associated datum features, but with the addition of an apostrophe. The labels are to be read as: datum feature A and datum feature simulator A'.

TABLE IV

Figure 2:
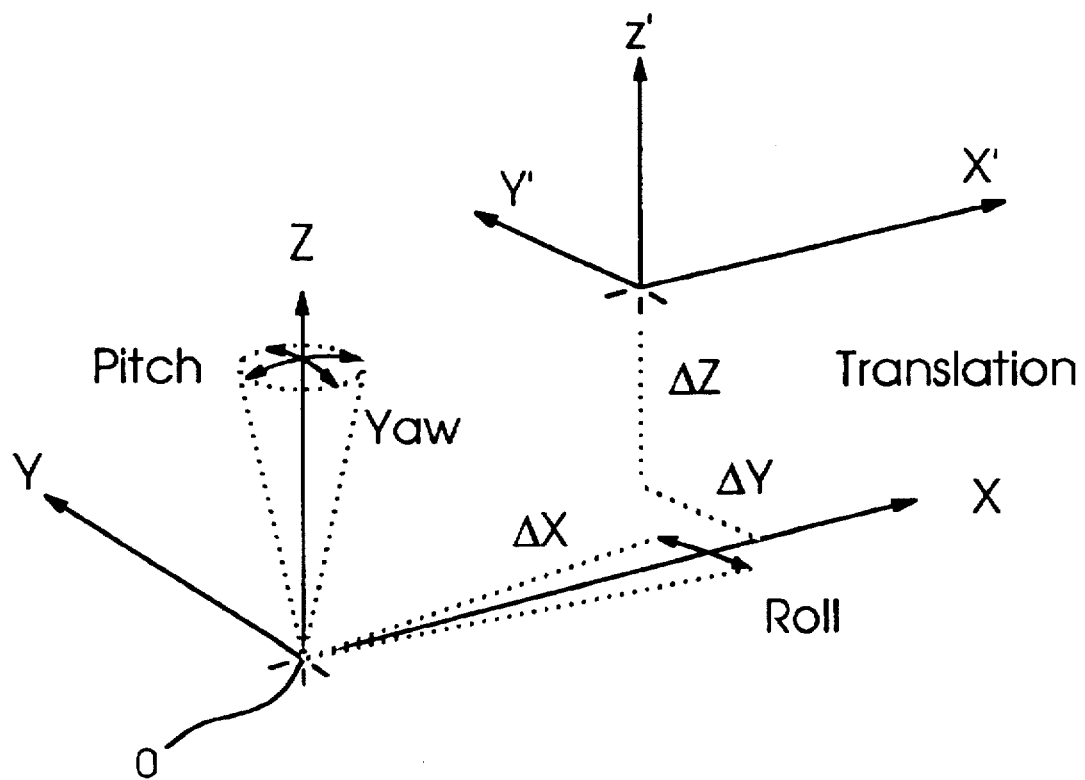
FIG. 2 is a diagram illustrating all the degrees of freedom of a DRF.
Figure 3:
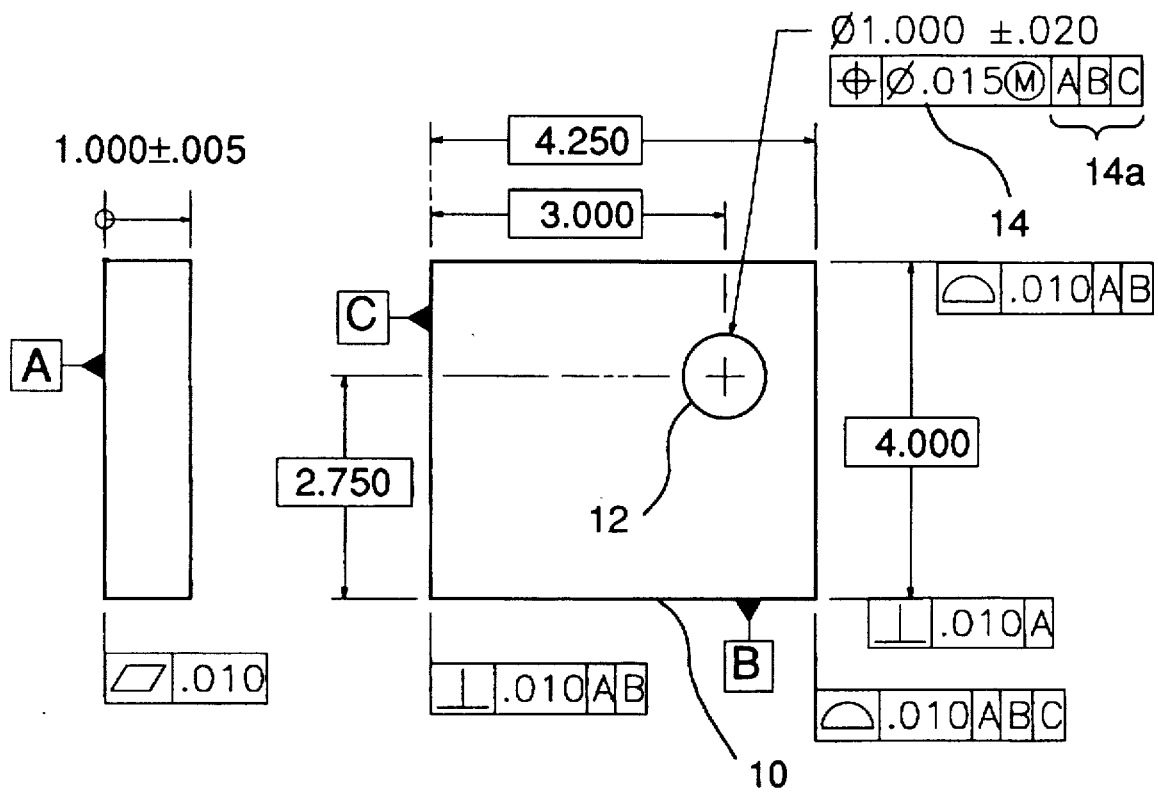
FIG. 3 is an exemplary formal drawing of a machine part.
Figure 4:
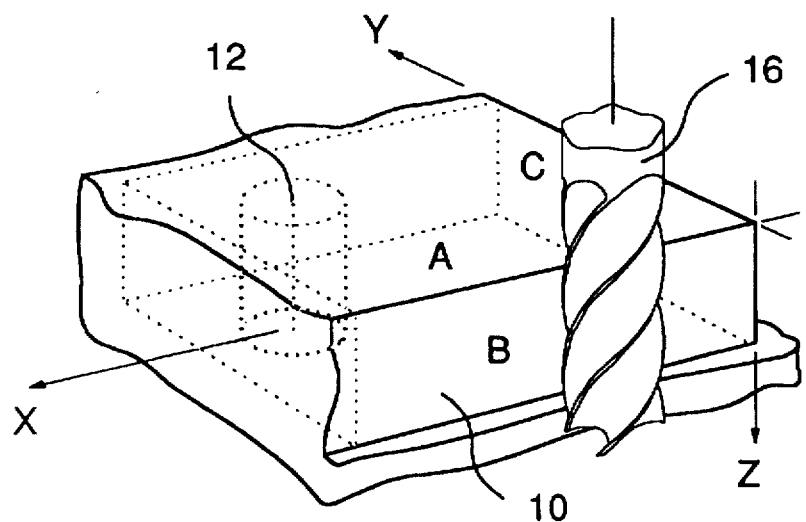
FIG. 4 is a diagram illustrating how the Datum Features and other features of the part of FIG. 3 are formed in a manufacturing operation.
Figure 5A:
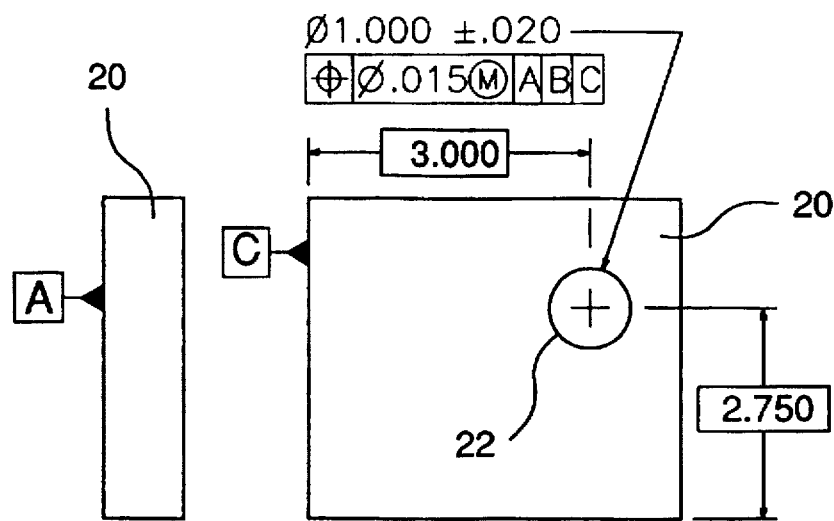
FIGS. 5a to 5c are diagrams illustrating the DRF construction process as well as how failure to respect a datum feature sequence can result in erroneous inspection of a part.
Figure 5B:
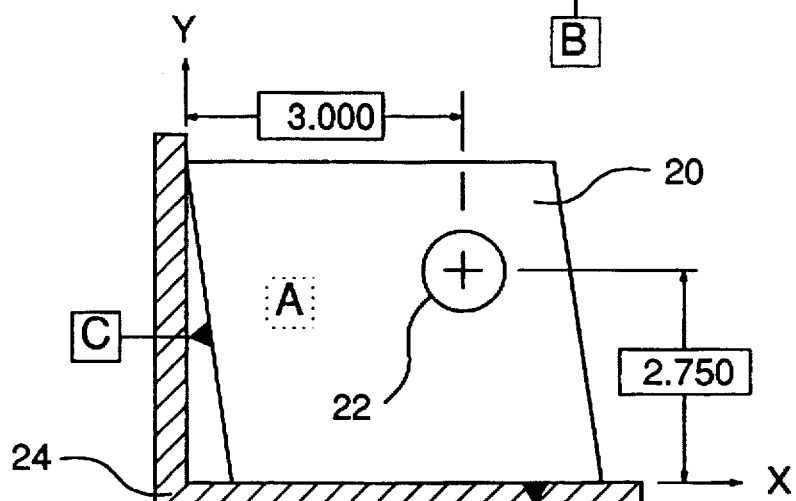
Figure 5C:
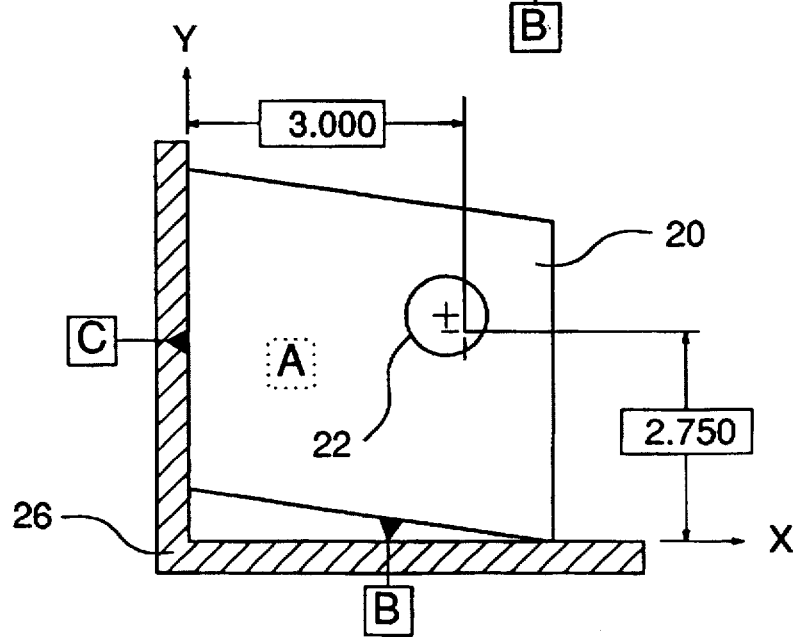

| FIG. No. | Current | FCF Def Propsed | Complete | Conceptual DRF Constr Commands | Mat Cond Depend Mobility | Datum Feature Simulators | Comments |
|---|---|---|---|---|---|---|---|
| 17a | ABD | ABD | A<br>B(R$_C$)<br>D(R$_C$)(1$_L$) | OR/SOZ<br>SOX/SOY<br>AL | —<br>—<br>— | Plane A' Fixed in Z<br>Expanding Mandrel B' Fixed in XY<br>Expanding Mandrel D' Floating in Y<br>All DFSs are assumed to be frozen at their BASIC relative orientations! | Because D is referenced RMC (default) and IML (default), the functional gage element representing it is free to translate as it expands, insuring that the orientation of D will serve to eliminate Roll, thus indicating the use of the ALIGN tool. This represents the Y14.5.1 interpretation of ABD as shown in FIG. 4-2 of the Y14.5.1M standard, and illustrates how the Material Location Modifier method clearly leads to this unique alternative. See FIG. 17a. |
| 17b | ABD | ABD | A<br>B(R$_C$)<br>D(R$_C$)(B$_L$) | OR/SOZ<br>SOX/SOY<br>PI | —<br>—<br>— | Plane A' Fixed in Z<br>Expanding Mandrel B' Fixed in XY<br>Expanding Mandrel D' Fixed in Y<br>All DFSs are assumed to be frozen at their BASIC relative orientations! | Because D is referenced RMC (default) and @BML, the functional gage element representing it is fixed relative to B as it expands, insuring that the location of D will serve to eliminate Roll, thus indicating the use of the PIVOT tool. This represents "the other" common interpretation of ABD which differs radically from that shown in FIG. 17a, and illustrates how the Material Location Modifier method clearly differentiates between the two. |

TABLE IV-continued

| FIG. No. | Current | FCF Def Propsed | Complete | Conceptual DRF Constr Commands | Mat Cond Depend Mobility | Datum Feature Simulators | Comments |
|---|---|---|---|---|---|---|---|
| 17c | ABD(M) | ABD(M) | A<br>B($R_C$)<br>D($M_C$)($1_L$) | OR/SOZ<br>SOX/SOY<br>AL(?) (P1)<br>(?)<br>(+ Mobility Adjustment) | —<br>—<br>$\Delta\Delta\alpha$ | Plane A' Fixed in Z<br>Expanding Mandrel B' Fixed in XY<br>VMC Mandrel D' Floating in Y<br>All DFSs are assumed to be frozen at their BASIC relative orientations! | See FIG. 17a. Because D is referenced at MMC and IML (default), the functional gage element representing it will be at VMC and free to float in Y, thus providing no clear cut means for eliminating Roll. Although this illustrates how the Material Location Modifier method defines a completely unambiguous alternative, this happens to be one worth avoiding. |
| 17d | ABD(M) | ABD(M) (B) | A<br>B($R_C$)<br>D($M_C$)($B_L$) | OR/SOZ<br>SOX/SOY<br>P1<br>(+ Mobility Adjustment) | —<br>—<br>$\Delta\alpha$ | Plane A' Fixed in Z<br>Expanding Mandrel B' Fixed in XY<br>VMC Mandrel D' Fixed in Y<br>All DFSs are assumed to be frozen at their BASIC relative orientations! | Because D is referenced at MMC and at BML, the functional gage element representing it is fixed in size (VMC) and in location relative to B, insuring that the location of D will serve to eliminate Roll, this indicating the use of the PIVOT tool. In this case D is a reliable roll controlling feature, allowing only a small degree of rotational mobility as D departs from MMC. This illustrates how the Material Location Modifier method clearly defines the preferable of two possible interpretations of the sequence AB(M)D. |

TABLE V

| FIG. No. | Current | FCF Def Proposed | Complete | Conceptual DRF Constr Commands | Mat Cond Depend Mobility | Datum Feature Simulators | Comments |
|---|---|---|---|---|---|---|---|
| 18a | ABE | ABE | A<br>B($R_C$)<br>E($1_L$) | OR/SOZ<br>SOX/SOY<br>AL | —<br>—<br>— | Plane A' Fixed in Z<br>Expanding Mandrel B' Fixed in XY<br>Plane E' Floating in Y<br>All DFSs are assumed to be frozen at their BASIC relative orientations! | Because E is referenced IML (default), the functional gage element representing it is free to translate until E is parallel to it, insuring that the orientation of E will serve to eliminate Roll, and indicating the use of the ALIGN tool. This illustrates how the Material Location Modifier |

TABLE V-continued

| FIG. No. | Current | FCF Def Proposed | Complete | Conceptual DRF Constr Commands | Mat Cond Depend Mobility | Datum Feature Simulators | Comments |
|---|---|---|---|---|---|---|---|
| 18b | ABE | ABE(B) | A<br>B(R_C)<br>E(B_L) | OR/SOZ<br>SOX/SOY<br>P1 | —<br>—<br>— | Plane A' Fixed in Z<br>Expanding Mandrel B' Fixed in XY<br>Plane E' Fixed in Y at BML<br>All DFSs are assumed to be frozen at their BASIC relative orientations! | method clearly defines the first of the two possible interpretations of the common sequence ABE. See also FIG. 18b. Because E is referenced at BML, the functional gage element it is fixed in Y, insuring that the location of E will serve to eliminate Roll, and indicating the use of the PIVOT tool. This illustrates how the Material Location Modifier method clearly defines the second of the two possible interpretations of the common sequence ABE. See also FIG. 18a. |
| 18c | ABE | ABE(M) | A<br>B(R_C)<br>E(M_L) | OR/SOZ<br>SOX/SOY<br>P1 | —<br>—<br>— | Plane A' Fixed in Z<br>Expanding Mandrel B' Fixed in XY<br>Plane E' Fixed in Y at MML<br>All DFSs are assumed to be frozen at their BASIC relative orientations! | As in FIG. 18b, the location of E serves to eliminate Roll, however in this case the DFS representing it is fixed at the MMC Virtual Material Location. This illustrates how the Material Location Modifier method provides additional design freedom. |
| 18d | ABE | ABE(L) | A<br>B(R_C)<br>E(L_L) | OR/SOZ<br>SOX/SOY<br>P1<br>(+ Mobility Adjustment) | —<br>—<br>— | Plane A' Fixed in Z<br>Expanding Mandrel B' Fixed in XY<br>Plane E' Fixed in Y at LML<br>All DFSs are assumed to be frozen at their BASIC relative orientations! | As in FIG. 18b, the location of E serves to eliminate Roll, however in this case the DFS representing it is fixed at the LMC Virtual Material Location. This illustrates how the Material Location Modifier method provides additional design freedom. |

TABLE VI

| FIG. No. | Current | FCF Def Proposed | Complete | Conceptual DRF Constr Commands | Mat Cond Depend Mobility | Datum Feature Simulators | Comments |
|---|---|---|---|---|---|---|---|
| 19a | ABG | ABG | A<br>B(R_C)<br>G(R_C)(1_L) | OR/SOZ<br>SOX/SOY<br>AL | —<br>—<br>— | Plane A' Fixed in Z<br>Expanding Mandrel B' Fixed in XY<br>Shrinking Mandrel G' Floating in Y<br>All DFSs are assumed to be frozen at their BASIC relative orientations! | Because G is referenced RMC (default) and IML (default), the DFS representing it is free to translate as it shrinks, insuring that the orientation of both sides of G will serve to eliminate Roll, thus indicating the use of the ALIGN tool. |

TABLE VI-continued

| FIG. No. | Current | FCF Def Proposed | Complete | Conceptual DRF Constr Commands | Mat Cond Depend Mobility | Datum Feature Simulators | Comments |
|---|---|---|---|---|---|---|---|
| 19b | ABG | ABD | A<br>B(R$_C$)<br>G(R$_C$)(B$_L$) | OR/SOZ<br>SOX/SOY<br>AL | —<br>—<br>— | Plane A' Fixed in Z<br>Expanding Mandrel B' Fixed in XY<br>Expanding Mandrel G' Fixed in Y<br>All DFSs are assumed to be frozen at their BASIC relative orientations! | This represents the extension of the Y14.5.1 interpretation shown in FIG. 4-2 of the Y14.5.1M standard to a straddling Datum Feature with size. See also FIG. 19b. Because G is referenced RMC (default) and @BML, the DFS representing it is fixed relative to B as it shrinks, insuring that the orientation of only one side of G will eliminate Roll. This represents a thoroughly functional alternative to FIG. 19a, which the current standard could be "interpreted" to allow, but which Material Location Modifiers make explicit. |
| 19c | ABG(M) | ABD(M) | A<br>B(R$_C$)<br>G(M$_C$)(1$_L$) | OR/SOZ<br>SOX/SOY<br>AL<br>(+ Mobility Adjustment) | —<br>—<br>ΔΔα | Plane A' Fixed in Z<br>Expanding Mandrel B' Fixed in XY<br>VMC Mandrel G' Floating in Y<br>All DFSs are assumed to be frozen at their BASIC relative orientations! | Because G is referenced @MMC and IML (default), the DFS representing it is fixed at VMC but free to float relative to B. Although this is a potentially natural functional dependency, it results in significant roll instability, and is probably worth avoiding. |
| 19d | ABG(M) | ABD(M)<br>(B) | A<br>B(R$_C$)<br>G(M$_C$)(B$_L$) | OR/SOZ<br>SOX/SOY<br>AL<br>(+ Mobility Adjustment) | —<br>—<br>Δα | Plane A' Fixed in Z<br>Expanding Mandrel B' Fixed in XY<br>VMC Mandrel G' Fixed in Y<br>All DFSs are assumed to be frozen at their BASIC relative orientations! | Because G is referenced @MMC and at @BML, the DFS representing it is fixed in size and in location relative to B. Although similar to FIG. 19c, in this case roll instability is much better controlled, illustrating how the Material Location Modifier method permits a clear definition of the better of two possible "interpretations" of the sequence ABG(M) allowed by the current standard. |

TABLE VII

| FIG. No. | Current | FCF Def Proposed | Complete | Conceptual DRF Constr Commands | Mat Cond Depend Mobilty | Datum Feature Simulators | Comments |
|---|---|---|---|---|---|---|---|
| 20a | ABC | ABC | A<br>B($R_C$)<br>C($1_L$) | OR/SOZ<br>SOX/SOY<br>AL | —<br>—<br>— | Plane A' Fixed in Z<br>Expanding Mandrel B' Fixed in XY<br>Plane C' Floating in Y<br>All DFSs are assumed to be frozen at their BASIC relative orientations! | Because C is referenced IML (default), the functional gage element representing it is free to translate until C is parallel to it, insuring that the orientation of C will serve to eliminate Roll, and indicating the use of the ALIGN tool. This illustrates how the Material Location Modifier method makes this common interpretation of the sequence ABC explicit. See example 7.4.2 for a new possible interpretation of the sequence ABC. |
| 20b | ABC | ABC(M) | A<br>B($R_C$)<br>C($M_L$) | OR/SOZ<br>SOX/SOY<br>AL +<br>Mobility<br>Adjustment | —<br>—<br>Δα | Plane A' Fixed in Z<br>Expanding Mandrel B' Fixed in XY<br>Plane C' Fixed in Y at VMC<br>All DFSs are assumed to be frozen at their BASIC relative orientations! | Because C is referenced @MML, the DFS representing it is fixed at VML relative to B. Although the orientation of C is primarily responsible for eliminating Roll, its location determines the extent of the residual mobility. This illustrates how the Material Location Modifier method makes this seldom used but highly functional interpretation of ABC possible and explicit. Note the contrast with FIG. 20a. |
| 20c | AB(M)C | AB(M)C | A<br>B($M_C$)<br>C($1_L$) | OR/SOZ<br>SOX/SOY<br>(+ Mobility Adjustment)<br>AL | —<br>ΔX,ΔY<br>— | Plane A' Fixed in Z<br>Expanding Mandrel B' Fixed in XY<br>Plane C' Floating in Y<br>All DFSs are assumed to be frozen at their BASIC relative orientations! | This alternative is similar to FIG. 20a, but permits translational DRF mobility in X and Y as B departs from MMC. Because C is references IML, the functional gage element representing it is free to translate with C as C varies in location relative to B, and as the DRF translates, thus insuring that C eliminates all Roll, regardless of the material condition of B. See FIG. 20d for a further loosening of the DRF. |
| 20d | ABD(M) | AB(M)C<br>(M) | A<br>B($M_C$)<br>C($M_L$) | OR/SOZ<br>SOX/SOY<br>(+ Mobility Adjustment)<br>AL<br>(+ Mobility | —<br>ΔX,ΔY<br>Δα | Plane A' Fixed in Z<br>Expanding Mandrel B' Fixed in XY<br>Plane C' Fixed in Y<br>All DFSs are assumed to be frozen at their BASIC relative orientations! | This alternative is similar to FIG. 20c, but compounded by referencing B @MMC, thus permitting the same translational |

TABLE VII-continued

| FIG. No. | Current | FCF Def Proposed | Complete | Conceptual DRF Constr Commands | Mat Cond Depend Mobilty | Datum Feature Simulators | Comments |
|---|---|---|---|---|---|---|---|
| | | | | Adjustment) | | | DRF mobility in X and Y but additional rotational mobility about Z. This illustrates how the Material Location Modifier method makes this uncommon, but perfectly functional interpretation of AB(M)C possible and explicit, in contrast with FIG. 20c. |

Material Location Modifier Alternative II—Default: "Fixed & Floating"

In addition to certain general rules, and in the absence of specific material location modifiers, the "Fixed & Floating" default requires that all datum feature simulators which serve to eliminate roll relative to a fixed primary axis, be free to translate perpendicular to their basic axes, mid-planes or surfaces if "straddling", and be fixed at their basic locations if "non-straddling".

"Straddling" datum feature simulators with size may be fixed at their basic locations using the material location modifier BML (at basic Material Location), and those without size may be fixed at Maximum or Least Material Location using the material location modifiers MML (at Maximum Material Location) and LML (at Least Material Location) respectively, whereas "non-straddling" datum feature simulators with or without size can be made free to translate using the material location modifier IML (Independent of Material Location). TABLE VIII provides an overview of the proposed drawing symbols and their applicability.

TABLE VIII

"Fixed & Floating" Material condition/
Location Modifiers for Natural DRF Construction

| Short Form | Long Form | Full | Meaning | Applies to: |
|---|---|---|---|---|
| default | $R_C$ | RMC | Regardless of Material Condition (RFS) | any feature with size |
| M | $M_C$ | MMC | at Maximum Material Condition | any feature with size |
| L | $L_C$ | LMC | at Least Material Condition | any feature with size |
| I | $I_L$ | LMC | Independent of Material Location | non-straddling features with or without size |
| B | $B_L$ | BML | at BASIC Material Location | straddling features with size only |
| M | $M_L$ | MML | at Maximum Material Location | straddling without size only |
| L | $L_L$ | LML | at Least Material Location | straddling features without size only |

Just as in the "Floating" scenario, the modifiers (I) and (B) are added to the classical Y14.5M 1994 symbol set, and the use of the modifiers (M) and (L) is extended to apply to the location of datum features without size. However in the case of the "Fixed & Floating" default, (I) is used to mobilize non-straddling datum feature simulators and (B) to arrest straddling datum feature simulators. There is no danger of confusion between (M) used for MMC and (M) used for MML, or between (L) used for LMC and (L) used for LML, because the former apply only to features with size, and the latter only to features without size.

Rules of Material Location "Fixed & Floating" Default:

1. All datum feature simulators representing Datum Targets are fixed at their BASIC locations relative to previously established Datums.

2. All datum feature simulators which do not serve to eliminate Roll about a previously fixed primary DRF axis are fixed at their BASIC locations relative to previously established Datums.

3. All straddling datum feature simulators which serve to eliminate Roll about a previously fixed primary DRF axis are free to float in a direction perpendicular to their basic axes, mid-planes or surfaces unless associated with the material location modifiers (B), (M) or (L) used as set forth in the table above.

4. All Non-straddling datum feature simulators which serve to eliminate Roll about a previously fixed primary DRF axis are fixed at their basic locations unless associated with the material location modifiers (I), (M) or (L) used as set forth in the table above.

Examples of "Fixed and Floating" Default Alternative

To demonstrate the implications of the "Fixed and Floating" default alternative, four different scenarios are presented as illustrated in FIGS. 21 to 24 taken in combination with TABLES IX to XII respectively. In each of these drawings, the leftmost entity is a formal drawing of an exemplary machine part or object. The rightmost three entities illustrate the part as being displaced through a specified range of angular or linear locations.

1. FIGS. 21a to 21d illustrate the case of a non-straddling datum feature with size (the "hockey puck").

These figures illustrate the effects on DRF construction of a rotation of datum feature about a vertical axis through its midpoint by −15°, 0°, and +15°.

Figure 21A:
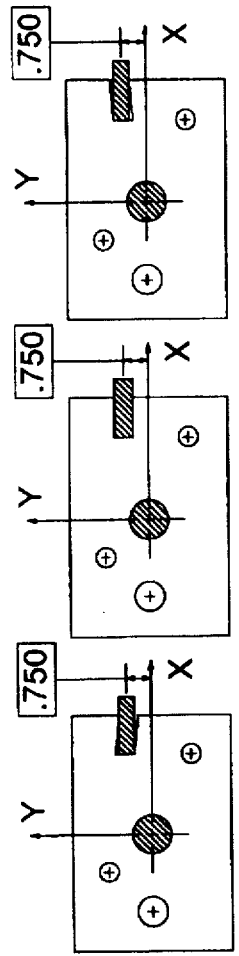

FIG. 21a illustrates an expanding slab-like DFS D' which is fixed at BML in Y.

Figure 21B:
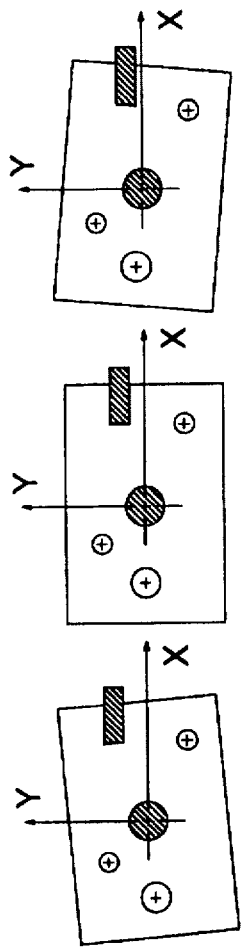

FIG. 21b illustrates an expanding slab-like DFS D' which is free to float in Y.

Figure 21C:
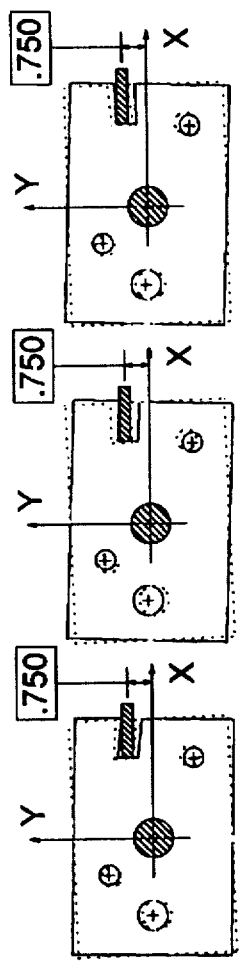

FIG. 21c illustrates a VMC slab-like DFS D' which is fixed at BML in Y.

Figure 21D:
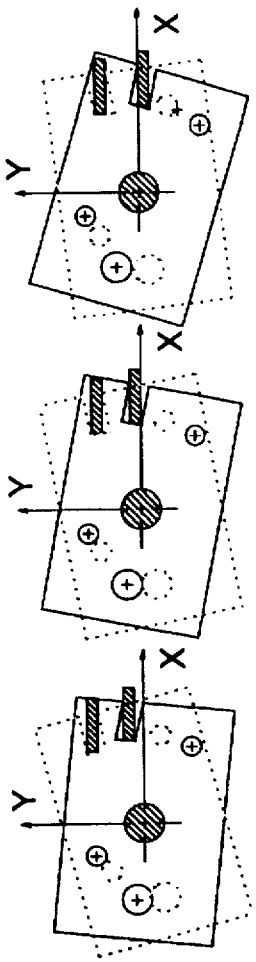

FIG. 21d illustrates a VMC slab-like DFS D' which is free to float in Y.

In the default scenario, by saying nothing, it is automatically stipulated that the DFS intended to engage datum feature D be free to expand to consume all the space inside D, but fixed at BML, thus making its location responsible for eliminating roll. This alternative creates a completely static DRF. is in keeping with the common "shop floor interpretation" of the "hockey puck" conundrum, and is illustrated in FIG. 21a.

As shown in FIG. 21b, adding the material location modifier (I) to datum feature D creates an equally static DRF (to the extent D is not barrel or wedge-shaped), but this time making the orientation of D responsible for eliminating roll. This alternative represents the "Y14.5.1 interpretation" illustrated in FIG. 4–2 on p. 15 of the ASME Y14.5.1M-1994 standard.

As shown in FIG. 21c, adding the Material Condition Modifier (M) to datum feature D results in a DRF with minor residual roll, in keeping with the "generally accepted interpretation" of this case of the "hockey puck".

As shown in FIG. 21d, adding both an (M) for @MMC and an (I) for IML to datum feature D results in a highly unstable and therefore undesirable DRF as D departs from virtual material condition, and should be avoided. This exposition demonstrates that the "Fixed & Floating" material location modifier default eliminates the ambiguity of the "hockey puck" just as effectively as does the "Floating" default.

2. FIGS. 22a to 22d illustrate the case of a non-straddling datum feature without size.

These figures illustrate the effects on DRF construction of a shift in the Y location of datum feature E relative to datum feature B from 1.240 to 1.250 to 1.260.

Figure 22A:
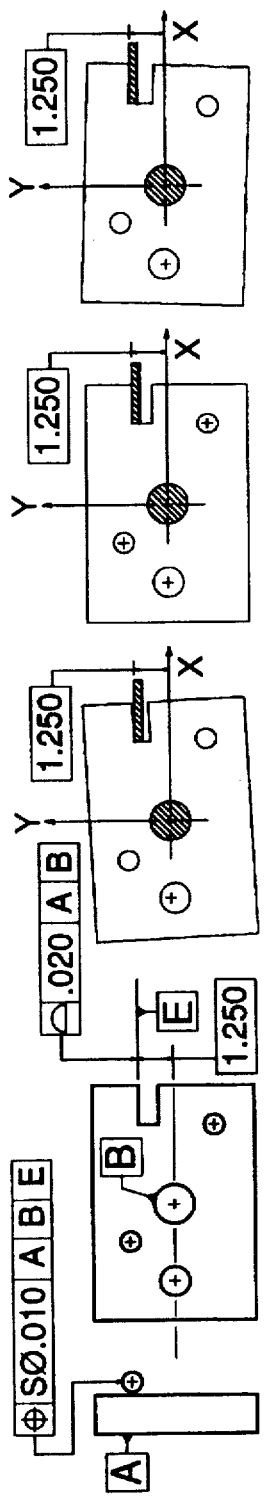

FIG. 22a illustrates a planar DFS E' fixed at BML in Y.

Figure 22B:
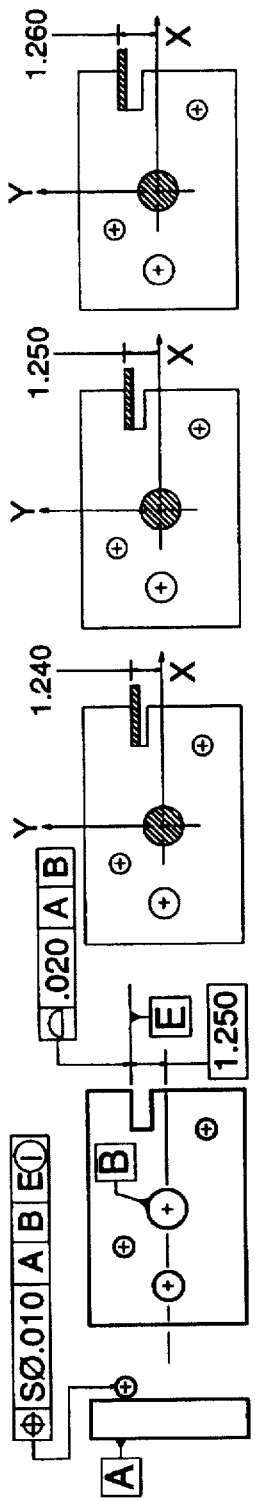

FIG. 22b illustrates a planar DFS E' which is free to float in Y.

Figure 22C:
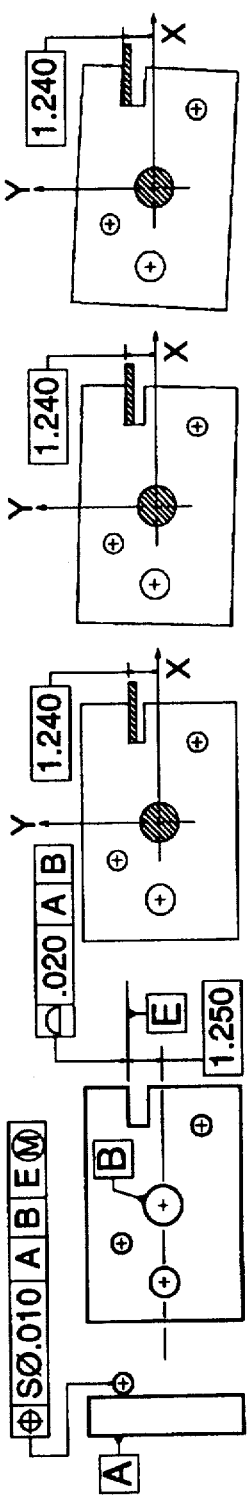

FIG. 22c illustrates a planar DFS E' fixed at maximum Virtual Material Location (VML) in Y.

Figure 22D:
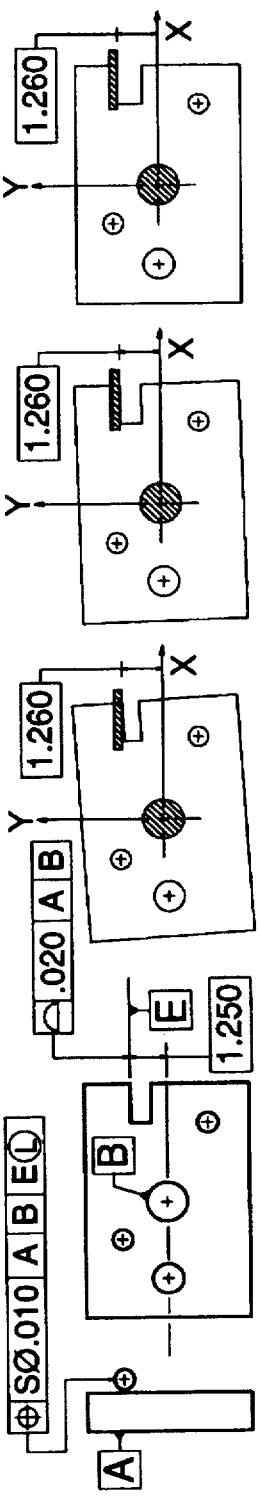

FIG. 22d illustrates a planar DFS E' fixed at least VML in Y.

In the "Fixed & Floating" default scenario, by saying nothing (the invisible symbol for IML), it is automatically stipulated that the DFS intended to engage E be fixed at its basic location, thus making the location of E responsible for eliminating roll, regardless of its orientation. This alternative creates a static DRF under all circumstances by pivoting E about B until it runs up against E', and is shown in FIG. 22a.

Adding the modifier (I) for IML to datum feature E requires the DFS intended to engage E to be free to translate until stability is achieved, thus making the orientation of E responsible for eliminating roll, independent of the location of E. This alternative creates a static DRF to the extent E is not convex (a "rocker"), and is shown in FIG. 22b.

Adding a stand-alone (M) for @MML, or (L) for @LML to datum feature E produces an effect similar to that of the default @BML, except in these cases datum feature E is free to pivot until it runs up against DFS E' here fixed at the feature's maximum or least Virtual Material Location (VML) as illustrated in FIGS. 22c and 22d respectively.

3. FIGS. 23a to 23d illustrate the case of a straddling datum feature with size (identical to "Floating" default alternative).

These figures illustrate the effect on DRF construction of a change in the width of datum feature C from 4.010 to 4.000 to 3.990 with a commensurate shift in the center plane from −0.005 to 0.000 to +0.005.

FIG. 23a illustrates a shrinking, vise-like DFS G' which is free to float in Y.

FIG. 23b illustrates a shrinking, vise-like DFS G' which is fixed at BML in Y.

FIG. 23c illustrates a vise-like, VMC DFS G' which is free to float in Y.

FIG. 23d illustrates a vise-like, VMC DFS G' which is fixed at BML in Y.

In the "Fixed & Floating" default scenario, by saying nothing (the invisible symbols for IML and RMC), it is automatically stipulated that the DFS intended to engage datum feature G be free to translate and contract to consume all the space outside G, thus making the orientation of the entire feature responsible for eliminating roll. This alternative creates a static DRF to the extent G is not wedge- or barrel-shaped, and is shown in FIG. 23a.

As shown in FIG. 23b, adding a (B) for @BML creates a DRF most likely based on the orientation of only one surface of G, since the DFS is not free to translate until both surfaces have been engaged. This alternative is also static, to the extent the engaged surface is not convex (a "rocker").

As shown in FIG. 23c, adding either an (M) for @MMC, or an (L) for @LMC to datum feature G, but failing to add a (B) for @BML results in a DRF with the potential for significant Roll mobility as G departs from virtual material condition.

As shown in FIG. 23d, adding either an (M) or an (L) together with a (B) to datum feature G results in a DRF with the potential for slightly less Roll mobility, and explicitly stipulates the common "interpretation" of the datum feature series: |A,B,G(M)|.

These examples demonstrate a number of new DRF alternatives which the addition of material location modifiers make available.

4. FIGS. 24a to 24d illustrate the case of a straddling datum feature without size (identical to "Floating" default alternative).

These figures illustrate the effects on DRF construction of a shift in the location of datum feature C relative to B from 1.990 to 2.000 to 2.010.

FIG. 24a illustrates a planar DFS C' which is free to slide relative to a fixed, expanding cylindrical mandrel B'.

FIG. 24b illustrates a planar DFS C' which is fixed in Y at Maximum Material Location (MML) relative to an expanding cylindrical DFS B'.

FIG. 24c illustrates a planar DFS C' which is free to float in Y relative to a VMC cylindrical DFS B'.

FIG. 24d illustrates a planar DFS C' which is locked at its basic offset relative to a VMC cylindrical mandrel B'.

In the "Fixed & Floating" default scenario, by saying nothing (the invisible symbol for IML), it is automatically stipulated that the DFS intended to engage datum feature C be free to translate until stability is achieved, thus making the orientation of C responsible for eliminating roll, independent of its location. This is the standard interpretation of this scenario, and leads to a static DRF to the extent C is not convex (a "rocker"). It is illustrated in FIG. 24a.

As shown in FIG. 24b, adding either an (M) for @MML, or an (L) for @LML to datum feature C stipulates that the DFS intended to engage C be at virtual material location, in which case the orientation of C is still responsible for eliminating roll, but now with a degree of mobility which depends on the location of C. It is only the addition of material location modifiers which now makes it possible to specify this common scenario in machine part assembly.

FIGS. 24c and 24d refine the new alternatives by demonstrating the effects of adding an MMC modifier to datum feature B, first with C referenced IML, then with C referenced @MML. As can be seen, adding an MMC modifier to B with C referenced IML introduces two degrees of residual translational freedom only, whereas adding an MML modifier to C as well, introduces residual Roll mobility as C retreats from MML.

In summary, FIGS. 21 to 24 illustrate how various DRFs can be clearly differentiated using appropriate material location modifiers in conjunction with a "Fixed & Floating" default, and in particular, how they eliminate the confusion of the "hockey puck" conundrum in a way which dovetails easily with current Y14.5M annotation and is in complete conformance with the newly stated rules for "natural" DRF construction.

All examples use the following abbreviations:

The symbols used in the column labeled "Conceptual DRF Construction Commands" are to be understood as follows: OR=ORIENT, AL=ALIGN, PI=PIVOT, SOX, SOY and SOZ=SET ORIGIN in X, Y, and Z respectively.

The symbols used in the column labeled "Material Condition Dependent Mobility" are to be understood as follows: $\Delta X$, $\Delta Y$, $\Delta Z$ stand for residual Material Condition and Material Location induced translational mobility along DRF X, Y and Z, axes respectively, whereas $\Delta a$ stands for minimal and $\Delta\Delta a$ for significant residual roll mobility.

Datum feature, simulators bear the same labels as their associated datum features, but with the addition of an apostrophe. The labels are to be read as: datum feature A and datum feature simulator A'.

TABLE IX

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| 21a | ABD | ABD | A<br>B(R_C)<br>D(R_C)(B_L) | OR/SOZ<br>SOX/SOY<br>PI | —<br>—<br>— | Plane A' Fixed in Z<br>Expanding Mandrel B' Fixed in XY<br>Expanding Mandrel D' Fixed in Y<br>All functional gage components are assumed to be frozen at their BASIC relative orientations! | Because D lacks any modifiers, the functional gage component representing it is free to expand but fixed in location, insuring that the location of D will serve to eliminate Roll, indicating the use of the PIVOT tool. This represents the common interpretation of ABD. |
| 21b | ABD | ABD(I) | A<br>B(R_C)<br>E(I_L) | OR/SOZ<br>SOX/SOY<br>AL | —<br>—<br>— | Plane A' Fixed in Z<br>Expanding Mandrel B' Fixed in XY<br>Plane, Fixed in Y at BML<br>All functional gage components are assumed to be frozen at their BASIC relative orientations! | Because D is referenced RMC and IML, the functional gage component representing it is free to float as it expands, insuring that the orientation of D will serve to eliminate Roll, indicating the use of the ALIGN tool. This represents the Y14.5.1 interpretation of ABD shown in FIG. 4-2 of the Y14.5.1.M 1994 standard and illustrates how the Material Condition Modifier method clearly differentiates between this alternative and the one shown in FIG. 21a. |
| 21c | ABD(M) | ABD(M) | A<br>B(R_C)<br>D(M_C)(B_L) | OR/SOZ<br>SOX/SOY<br>PI<br>(+ Mobility Adjustment) | —<br>—<br>$\Delta\alpha$ | Plane A' Fixed in Z<br>Expanding Mandrel B' Fixed in XY<br>VMC Mandrel, Fixed in Y<br>All functional gage components are assumed to be frozen at their BASIC relative orientations! | Because D is referenced @MMC and @BML, the functional gage element representing it is fixed in size (VMC) and in location relative to B, insuring that the location of D will serve to eliminate Roll, thus indicating the use of the PIVOT tool. In this case D is a reliable roll controlling feature, allowing only a small degree of rotational mobility as D departs from MMC. |

TABLE IX-continued

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| 21d | ABD(M) | ABD(M) (I) | A B($R_C$) D($M_C$)($I_L$) | OR/SOZ SOX/SOY AL(?) PI(?) (+ Mobility Adjustment) | — — $\Delta\Delta\alpha$ | Plane A' Fixed in Z Expanding Mandrel B' Fixed in XY VMC Mandrel, Floating in Y All functional gage components are assumed to be frozen at their BASIC relative orientations! | Because D is referenced @MMC and IML, the functional gage element representing it will be at VMC and free to float in Y, thus providing no clear cut means for eliminating Roll. Although this illustrates how the "natural DRF construction" method defines a completely unambiguous alternative, this happens to be one worth avoiding. |

TABLE X

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| 22a | ABE | ABE | A B($R_C$) E($I_L$) | OR/SOZ SOX/SOY PI | — — — | Plane A' Fixed in Z Expanding Mandrel B' Fixed in XY Plane E' Floating in Y All functional gage components are assumed to be frozen at their BASIC relative orientations! | Because E is referenced at BML (default), the functional gage element representing it is fixed in Y, insuring that the location of E will serve to eliminate Roll, thus indicating the use of the PIVOT tool. This illustrates how the Material Location Modifier method clearly defines the first alternative of the two possible interpretations of the common sequence ABE. See also FIG. 22b. |
| 22b | ABE | ABE(I) | A B($R_C$) E($I_L$) | OR/SOZ SOX/SOY AL | — — — | Plane A' Fixed in Z Expanding Mandrel B' Fixed in XY Plane, Fixed in Y at BML All functional gage components are assumed to be frozen at their BASIC relative orientations! | Because E is explicitly referenced IML, the functional gage element representing it is free to translate until E is parallel to it, insuring that the direction of E will serve to eliminate Roll, thus indicating the use of the ALIGN tool. This illustrates how the Material Location Modifier method clearly defines the second alternative of the two possible interpretations of the common sequence ABE. See also FIG. 22a. |
| 22c | ABE | ABE(M) | A B($R_C$) E($M_L$) | OR/SOZ SOX/SOY PI | — — — | Plane A' Fixed in Z Expanding Mandrel B' Fixed in XY Plane E' Fixed in Y at MML | As in FIG. 22a, the location of E serves to eliminate Roll, |

TABLE X-continued

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| | | | | | | All functional gage components are assumed to be frozen at their BASIC relative orientations! | again indicating the PIVOT tool, however in this case the functional gage component repesenting it is explicitly located at Maximum Material Location, providing a new alternative for DRF construction. |
| 22d | ABE | ABE(L) | A<br>B($R_C$)<br>E($L_L$) | OR/SOZ<br>SOX/SOY<br>PI | —<br>—<br>— | Plane A' Fixed in Z<br>Expanding Mandrel B' Fixed in XY<br>Plane E' Fixed in Y at LML<br>All functional gage components are assumed to be frozen at their BASIC relative orientations! | As in FIG. 22a, the location of E serves to eliminate Roll, again indicating the PIVOT tool, however in this case the functional gage component representing it is explicitly located at Least Material Location, providing a new alternative for DRF construction. |

TABLE XI

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| 23a | ABG | ABG | A<br>B($R_C$)<br>G($R_C$)($I_L$) | OR/SOZ<br>SOX/SOY<br>AL | —<br>—<br>—<br>— | Plane A' Fixed in Z<br>Expanding Mandrel B' Fixed in XY<br>Shrinking Mandrel G' Floating in Y<br>All functional gage components are assumed to be frozen at their BASIC relative orientations! | Because G is referenced RMC (default) and IML (default), the functional gage component representing it is free to translate as it shrinks, insuring that the orientation of both sides of G will serve to eliminate Roll, thus indicating the use of the ALIGN tool. This represents the extension of the Y14.5.1 interpretation shown in FIG. 4-2 of the Y14.5.1M standard to a straddling Datum Feature with size. See also FIG. 23b. |
| 23b | ABG | ABG(B) | A<br>B($R_C$)<br>G($R_C$)($B_L$) | OR/SOZ<br>SOX/SOY<br>AL | —<br>—<br>— | Plane A' Fixed in Z<br>Expanding Mandrel B' Fixed in XY<br>Shrinking Mandrel G' Fixed in Y<br>All functional gage components are assumed to be frozen at their BASIC relative orientations! | Because G is referenced RMC (default) and @BML, the functional gage component representing it is fixed relative to B as it shrinks, insuring that the orientation of only one side of G will eliminate Roll. This represents a thoroughly functional alternative to FIG. 23a, which the current standard could be "interpreted" to allow, but which Material Location Modifiers make explicit. |
| 23c | ABG(M) | ABG(M) | A<br>B($R_C$)<br>G($M_C$)($I_L$) | OR/SOZ<br>SOX/SOY<br>AL | —<br>—<br>ΔΔα | Plane A' Fixed in Z<br>Expanding Mandrel B' Fixed in XY<br>VMC Mandrel G' Floating in Y | Because G is referenced @MMC and IML (default), the functional gage |

TABLE XI-continued

| FIG. No. | Current | FCF Def Proposed | Complete | Conceptual DRF Constr Commands | Matl. Cond. Depend Mobility | Datum Feature Simulators | Comments |
|---|---|---|---|---|---|---|---|
| | | | | (+ Mobility Adjustment) | | All functional gage components are assumed to be frozen at their BASIC relative orientations! | component representing it is fixed at VMC but free to float relative to B. Although this is a potentially natural functional dependency, it results in significant roll instability, and is probably worth avoiding. |
| 23d | ABG(M) | ABG(M) (B) | A B($R_C$) G($M_C$)($B_L$) | OR/SOZ SOX/SOY AL (+ Mobility Adjustment) | — — $\Delta\alpha$ | Plane A' Fixed in Z Expanding Mandrel B' Fixed in XY VMC Mandrel G' Fixed in Y All functional gage components are assumed to be frozen at their BASIC relative orientations! | Because G is referenced @MMC and @BML, the functional gage component representing it is fixed in size and in location relative to B. Although similar to FIG. 23a, in this case roll instability is much better controlled, illustrating how the Material Location Modifier method permits a clear definition of the better of two possible "interpretations" of the sequence ABG(M) allowed by the current standard. |

TABLE XII

| FIG. No. | Current | FCF Def Proposed | Complete | Conceptual DRF Constr Commands | Matl. Cond. Depend Mobility | Datum Features Simulators | Comments |
|---|---|---|---|---|---|---|---|
| 24a | ABC | ABC | A B($R_C$) C($I_L$) | OR/SOZ SOX/SOY AL | — — — | Plane A' Fixed in Z Expanding Mandrel B' Fixed in XY Plane C' Floating in Y All functional gage components are assumed to be frozen at their BASIC relative orientations! | Because C is referenced IML (default), the functional gage element representing it is free to translate until C is parallel to it, insuring that the orientation of C will serve to eliminate Roll, and indicating the use of the ALIGN tool. This illustrates how the Material Location Modifier method makes this common interpretation of the sequence ABC explicit. See FIG. 24b for a new possible interpretation of the sequence ABC. |
| 24b | ABC | ABC(M) | A B($R_C$) C($M_L$) | OR/SOZ SOX/SOY AL (+ Mobility Adjustment) | — — $\Delta\alpha$ | Plane A' Fixed in Z Expanding Mandrel B' Fixed in XY Plane C' Fixed in Y at VMC All functional gage components are assumed to be frozen at their BASIC relative orientations! | Because C is referenced @MML, the functional gage component representing it is fixed at VML relative to B. Although the orientation of C is primarily responsible for eliminating Roll, its location determines the extent of the residual mobility. This illustrates how the Material Location Modifier method makes this seldom used but highly functional |

TABLE XII-continued

| FIG. No. | Current | FCF Def Proposed | Complete | Conceptual DRF Constr Commands | Matl. Cond. Depend Mobility | Datum Features Simulators | Comments |
|---|---|---|---|---|---|---|---|
| 24c | AB(M)C | AB(M)C | A B($M_C$) C($I_L$) | OR/SOZ SOX/SOY AL (+ Mobility Adjustment) | $\Delta X, \Delta Y$ | Plane A' Fixed in Z Expanding Mandrel B' Fixed in XY Plane C' Floating in Y All functional gage components are assumed to be frozen at their BASIC relative orientations! | interpretation of ABC possible and explicit. Note the contrast with FIG. 24a. This alternative is similar to FIG. 24a, but permits translational DRF mobility in X and Y as B departs from MMC. Because C is referenced IML, the functional gage element representing it is free to translate with C as C varies in location relative to B, and as the DRF translates, thus insuring that C eliminates all Roll, regardless of the material condition of B. See FIG. 24c for a further loosening of the DRF. |
| 24d | AB(M)C | AB(M) C(M) | A B($M_C$) C($M_L$) | OR/SOZ SOX/SOY (+ Mobility Adjustment) AL (+ Mobility Adjustment) | $\Delta X, \Delta Y$ $\Delta \alpha$ | Plane A' Fixed in Z Expanding Mandrel B' Fixed in XY Plane C' Fixed in Y All functional gage components are assumed to be frozen at their BASIC relative orientations! | This alternative is similar to FIG. 24a, but compounded by referencing B @MMC, thus permitting the same translational DRF mobility in X and Y but additional rotational mobility about Z. This illustrates how the Material Location Modifier method makes this uncommon, but perfectly functional interpretation of AB(M)C possible and explicit, in contrast with FIG. 24c. |

Material Location Modifier Alternative III—Default: "Fixed"

In addition to certain general rules, and in the absence of specific material location modifiers, the "Fixed" default requires that all datum feature simulators which serve to eliminate roll relative to a fixed primary axis be fixed, at their basic locations, except those representing straddling Datum Features without size, which shall be fixed at MML (at Maximum Material Location).

Thus, the material location modifiers BML (at BASIC Material Location) and, in the case of straddling datum features without size, MML (at Maximum Material Location) are implied in the absence of other modifiers. Furthermore, any datum feature simulator may be made free to translate in a direction perpendicular to its basic axis, mid-plane or surface using the material location modifier IML (Independent of Material Location).

Furthermore any datum feature simulator representing a datum feature without size may be fixed at Least or Maximum Material Location using the material location modifiers LML (at Least Material Location) and MML (at Maximum Material Location) respectively. TABLE XIII provides an overview of the proposed drawing symbols and their applicability.

TABLE XIII

"Fixed" Material condition/ Location Modifiers for Natural DRF Construction

| Short Form | Long Form | Full | Meaning | Applies to: |
|---|---|---|---|---|
| default | $R_C$ | RMC | Regardless of Material Condition (RFS) | any feature with size |
| M | $M_C$ | MMC | at Maximum Material Condition | any feature with size |
| L | $L_C$ | LMC | at Least Material Condition | any feature with size |
| I | $I_L$ | IML | Independent of Material Location | any feature |
| default | $B_L$ | BML | at BASIC Material Location | any feature except straddling features w/o size |
| M | $M_L$ | MML | at Maximum Material Location | straddling and non-straddling features w/o size |
| L | $L_L$ | LML | at Least Material Location | straddling and non-straddling features w/o size |

Just as in the "Floating" and "Fixed & Floating" scenarios, the modifiers (I) and (B) are added to the classical Y14.5M 1994 symbol set, and the use of the modifiers (M)

and (L) is extended to apply to the location of datum features without size. However in the case of the "Fixed" default, (B) is always implied, except in the case of straddling datum features without size, when (M) is implied. (I) can be used to mobilize any datum feature simulator, and (M) and (L) can be used to fix any datum feature without size at either MML or LML respectively. Just as in the previous cases, there is no danger of confusion between (M) used for MMC and (M) used for MML, or between (L) used for LMC and (L) used for LML, because the former apply only to features with size, and the latter only to features without size.

Rules of Material Location ("Fixed" Default):

1. All datum feature simulators representing Datum Targets are fixed at their BASIC locations relative to previously established Datums.

2. All datum feature simulators which do not serve to eliminate Roll about a previously fixed primary DRF axis are fixed at their BASIC locations relative to previously established Datums.

3. All datum feature simulators which serve to eliminate Roll about a previously fixed primary DRF axis are fixed at Basic Material Location (BML) except those representing straddling datum features without size, which are fixed at Maximum Material Location (MML), unless associated with the material location modifiers (I), (M) or (L) used as set forth in the table above.

Material Location Modifier Alternative IV—Default "None"

A fourth alternative is to specify Material Location Modifiers explicitly at all times. The examples in this case follow directly from those provided for the other three alternatives.

Computer Implementation

Figure 25:
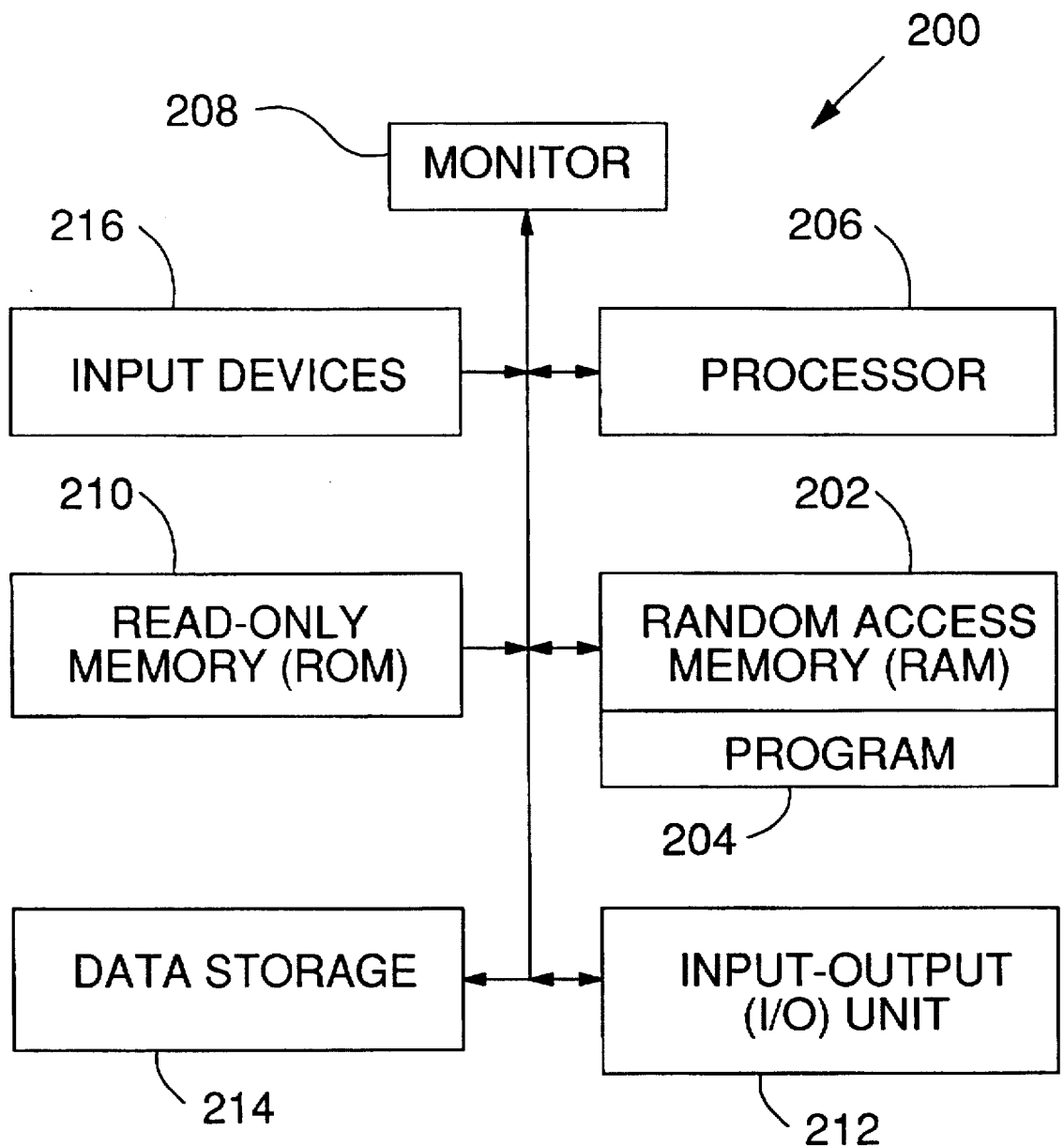
FIG. 25 is a diagram illustrating a computer system for implementing a method according to the present invention.

FIG. 25 illustrates a digital computer system 200 according to the present invention for automatically constructing a DRF and/or FCF in accordance with the present invention. Automatic DRF construction has not been heretofore possible due to the ambiguity regarding the use of orientation or location of a datum feature for eliminating DRF roll. Computer implementation of the present material location modifiers and rules as described above eliminates this ambiguity and makes automatic DRF construction possible.

The system 200 can be a Computer Aided Design (CAD) system which is specifically designed for processing information relating to machine part design and which constructs a DRF and/or FCF during the course of its operation, or can be any other type of apparatus such as machine for manufacturing or measuring machine parts which constructs a DRF during the course of its operation.

The system 200 includes a random access memory (RAM) 202 in which a software program 204 including instructions or code which implement the functionality of the system 200 is stored, and a processor 206 for executing the program 204. The system 200 further includes a visual display unit or monitor 208 for providing a graphic user interface, a read-only memory (ROM) 210 for storing firmware, and an input-output (I/O) unit 212 for connection to a printer, plotter, etc.

The system 200 further includes a mass data storage device 214 which can be any combination of suitable elements such as a fixed (hard) magnetic disk drive, a removable (floppy) magnetic disk drive, an optical (CD-ROM) drive, etc., and at least one input device 216 such as a keyboard, mouse, digitizer tablet, etc.

A specification of a part, comprising datum features including a sequence in which the datum features are to be processed, and a material location modifier for a datum feature which is intended to eliminate roll in the DRF, the material location modifier designating whether said datum feature should be used to eliminate roll using said datum feature's orientation or location, is input to the system 200. This can be accomplished using the input device (keyboard) 216, or alternatively the specification can be read from a floppy disk or other medium using the data storage device 214. The program is then executed to process the specification.

The program 204 will normally be stored on a data storage medium such as a magnetic disk, optical disk (CD-ROM), etc. which is removably inserted into the data storage device 214. The program 204 is loaded from the medium into the RAM 202, and executed using the processor 206. The present invention further includes such a computer data storage medium on which a program which implements the functionality of the invention is stored.

It will be noted that the RAM 202 itself is such a data storage medium within the scope of the invention. As yet another alternative, the program 204 can be stored in the ROM 210, which is typically an integrated circuit chip and also constitutes a data storage medium in accordance with the invention.

The system 200 can be used by the designer of a machine part or object to construct a formal drawing including a Feature Control Frame with material location modifiers in accordance with either of the four alternative scenarios described above. Preferably, the program 204 will be designed such that only the default material location modifier and appropriate alternative material location modifiers for a datum feature being considered will be displayed in a menu, prompt, etc. on the monitor 208 for selection by a user.

Although the set of material location modifiers can include material location modifiers which are inappropriate for a particular datum feature, the program will automatically not display these inappropriate alternatives, thereby ensuring that an erroneous formal drawing is not produced. As another feature, the program can display informative text, icons, etc. relating to the displayed material condition modifiers.

The program 204 is preferably designed to construct a DRF in accordance with the flowchart illustrated in FIGS. 26a to 26e. The construction sequence includes the following steps, in combination with auxiliary steps as illustrated, some of which are represented by several blocks in the drawing.

FIG. 26a

(a) Identify a next datum feature in the sequence.

FIG. 26b

(b) Determine if pitch and yaw have already been eliminated.

(c) If pitch and yaw have not been eliminated, and if the next datum feature is capable of eliminating pitch and yaw, apply an ORIENT tool to the next datum feature to eliminate pitch and yaw, and if datum feature is referenced at MMC or LMC, set DRF Pitch and Yaw Mobility Flag.

FIG. 26c

(d) Determine if roll has been eliminated.

(e) If roll has not been eliminated, and if the primary DRF axis is not fixed, and if the datum feature has a unit vector, apply an ALIGN tool to the next datum feature to eliminate roll using the next datum feature's orientation.

(e") If roll has not been eliminated, and if the primary DRF axis is fixed, and if the next datum feature is a sphere or is axial and has an axis parallel to the primary axis, apply a PIVOT tool to the next datum feature to eliminate roll using the next datum feature's location and if the datum feature is referenced at MMC or LMC set the DRF Roll Mobility Flag.

Figure 26A:
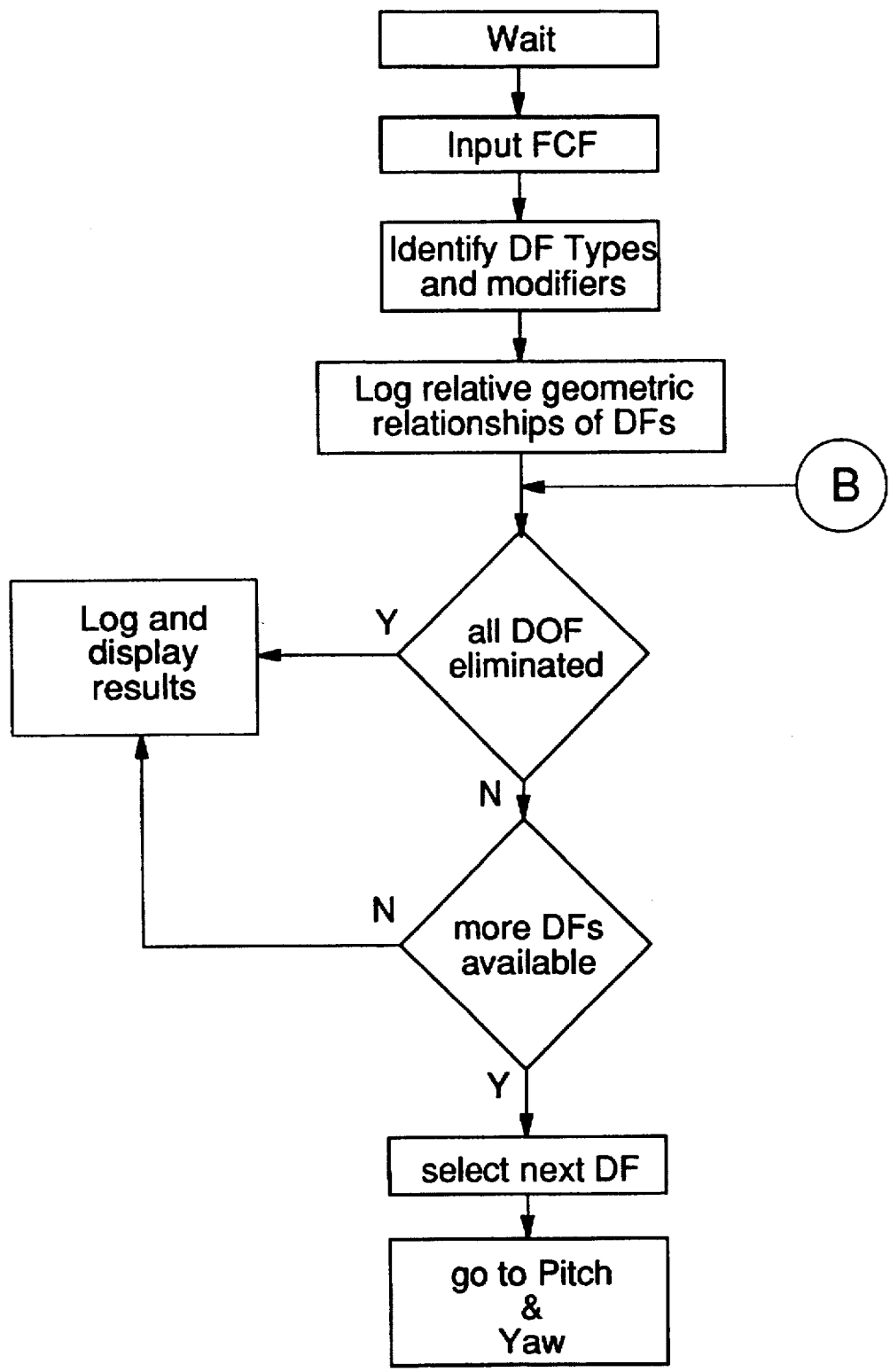
FIGS. 26a to 26e in combination constitute a flowchart of the vectorial implementation of the present method.
Figure 26B:
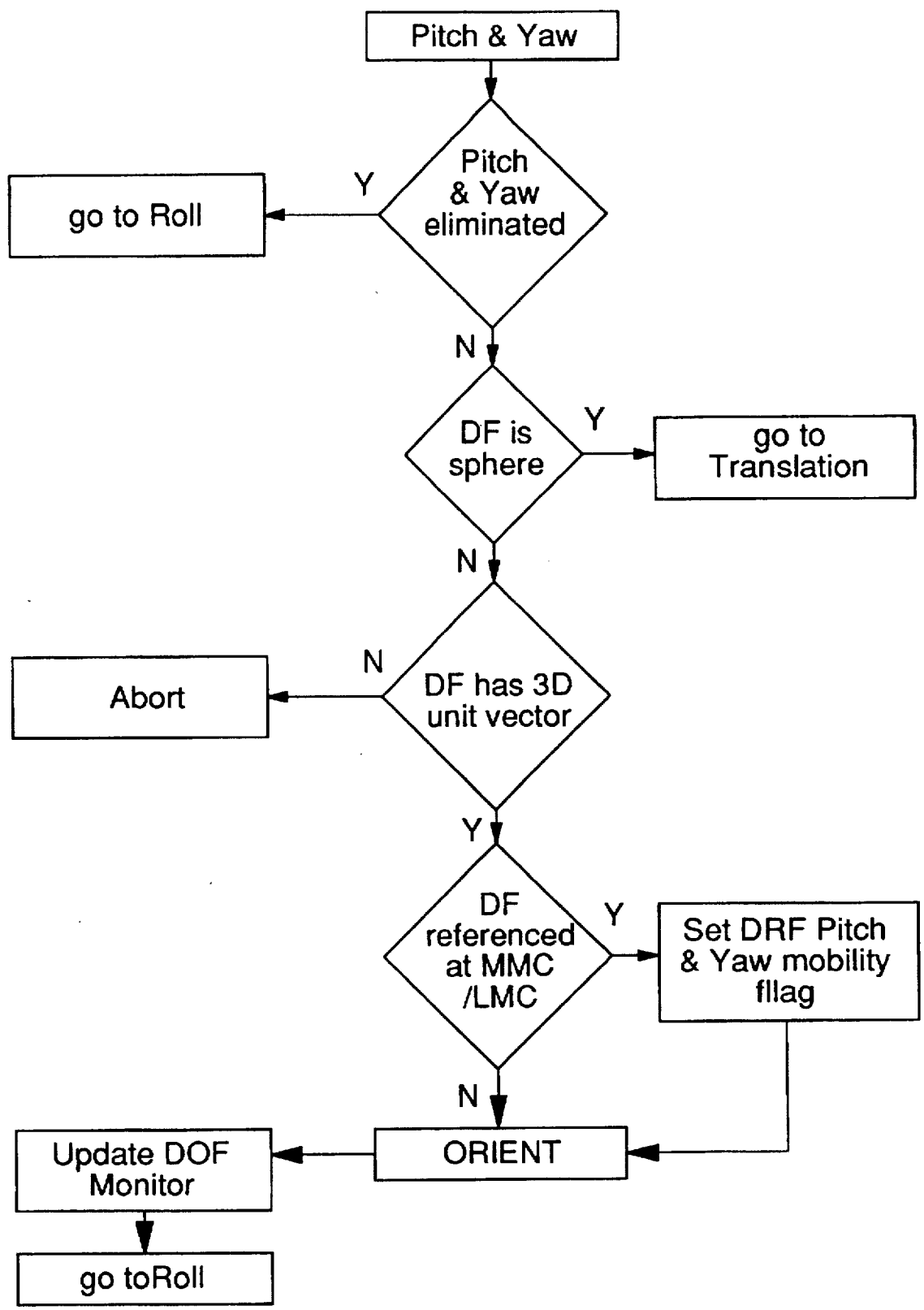
Figure 26C:
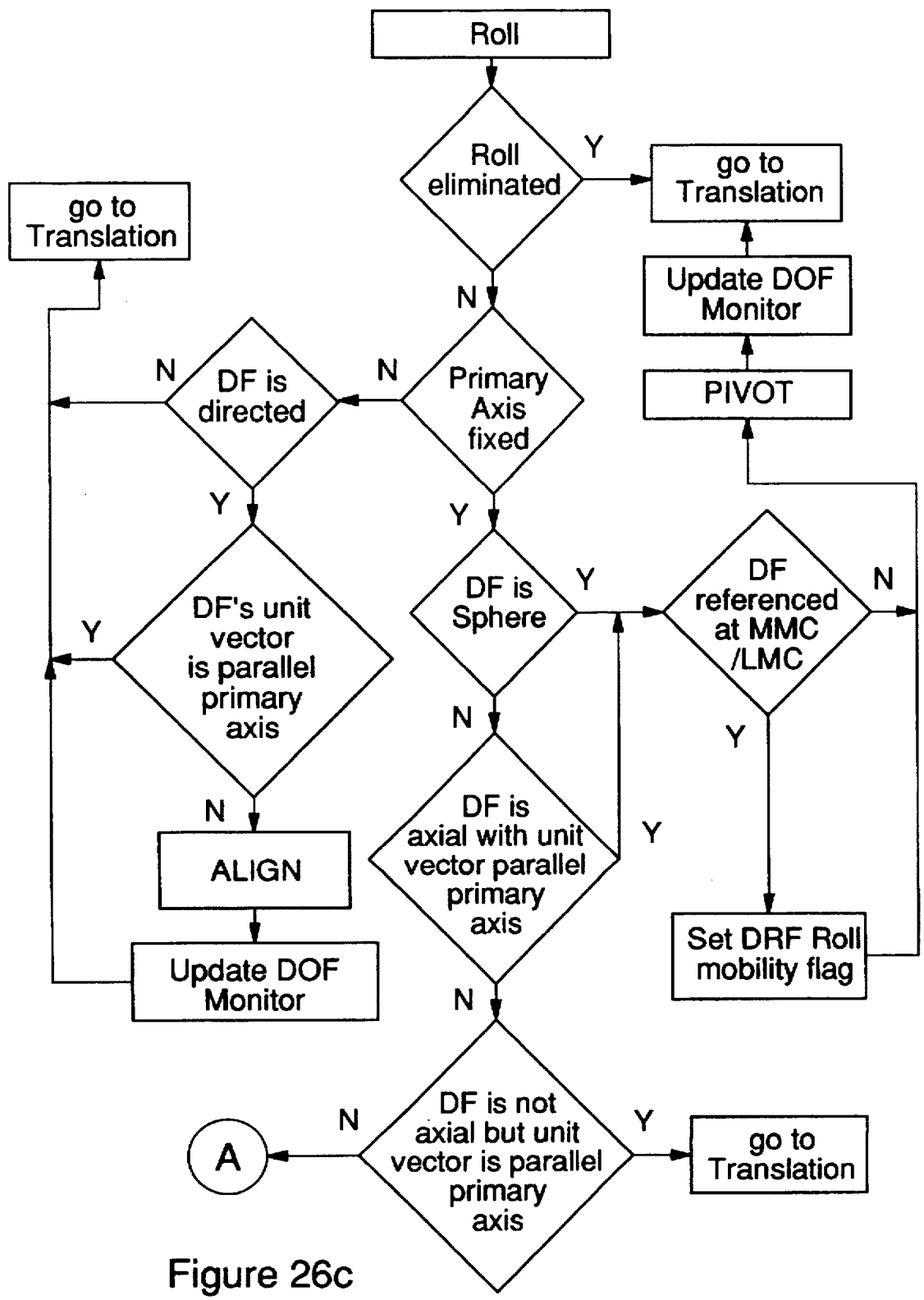
Figure 26D:
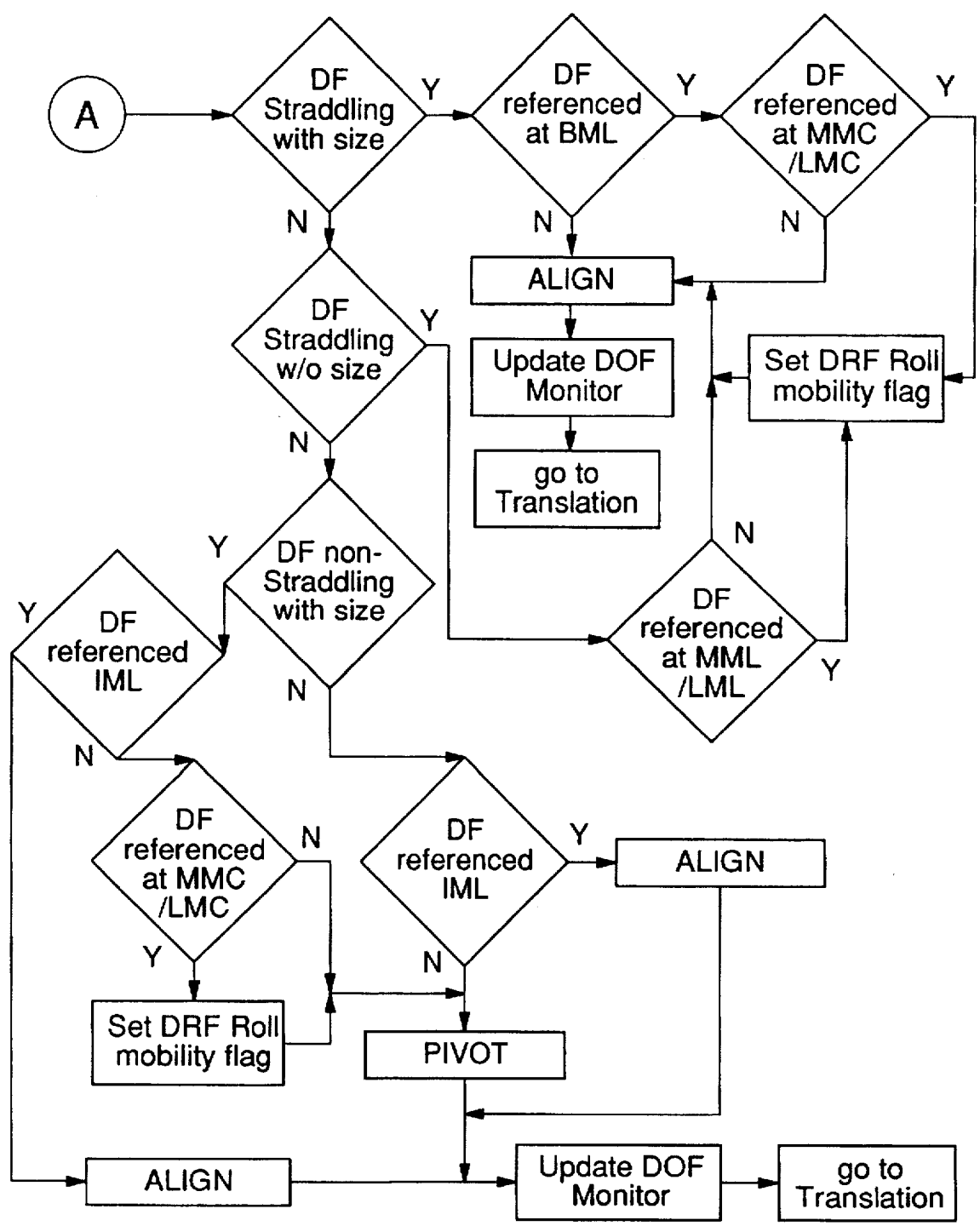

FIG. 26d (f) If roll has not been eliminated, and if the next datum feature has size and straddles a previously fixed primary axis of the DRF, apply an ALIGN tool to the next datum feature to eliminate roll using the next datum feature's orientation, and if the datum feature is referenced at MMC or LMC set the DRF Roll Mobility Flag.

(f') If roll has not been eliminated, and if the next datum feature does not have size and straddles a previously fixed primary axis of the DRF, apply an ALIGN tool to the next datum feature to eliminate roll using the next datum feature's orientation, and if the datum feature is referenced at MMC or LMC set the DRF Roll Mobility Flag.

(f") If roll has not been eliminated, and if the next datum feature does not straddle a previously fixed primary axis of the DRF, and if the next datum feature has size and is associated with the material location modifier Independent of Material Location (IML), apply an ALIGN tool to the next datum feature to eliminate roll using the datum feature's orientation.

(g) If roll has not been eliminated, and if the next datum feature does not straddle a previously fixed primary axis of the DRF, and if the next datum feature has size and is associated with a material location modifier Basic Material Location (BML), apply a PIVOT tool to the next datum feature to eliminate roll using the next datum feature's location.

(g') If roll has not been eliminated, and if the next datum feature does not straddle a previously fixed primary axis of the DRF, and if the next datum feature does not have size and is associated with a material location modifier Independent of Material Location (IML), apply an ALIGN tool to the next datum feature to eliminate roll using the next datum feature's orientation.

(g") If roll has not been eliminated, and if the next datum feature does not straddle a previously fixed primary axis of the DRF, and if the next datum feature does not have size and is associated with a material location modifier Basic Material Location (BML), Maximum Material Location (MML) or Least Material Location (LML), apply a PIVOT tool to the next datum feature to eliminate roll using the next datum feature's location.

Figure 26E:
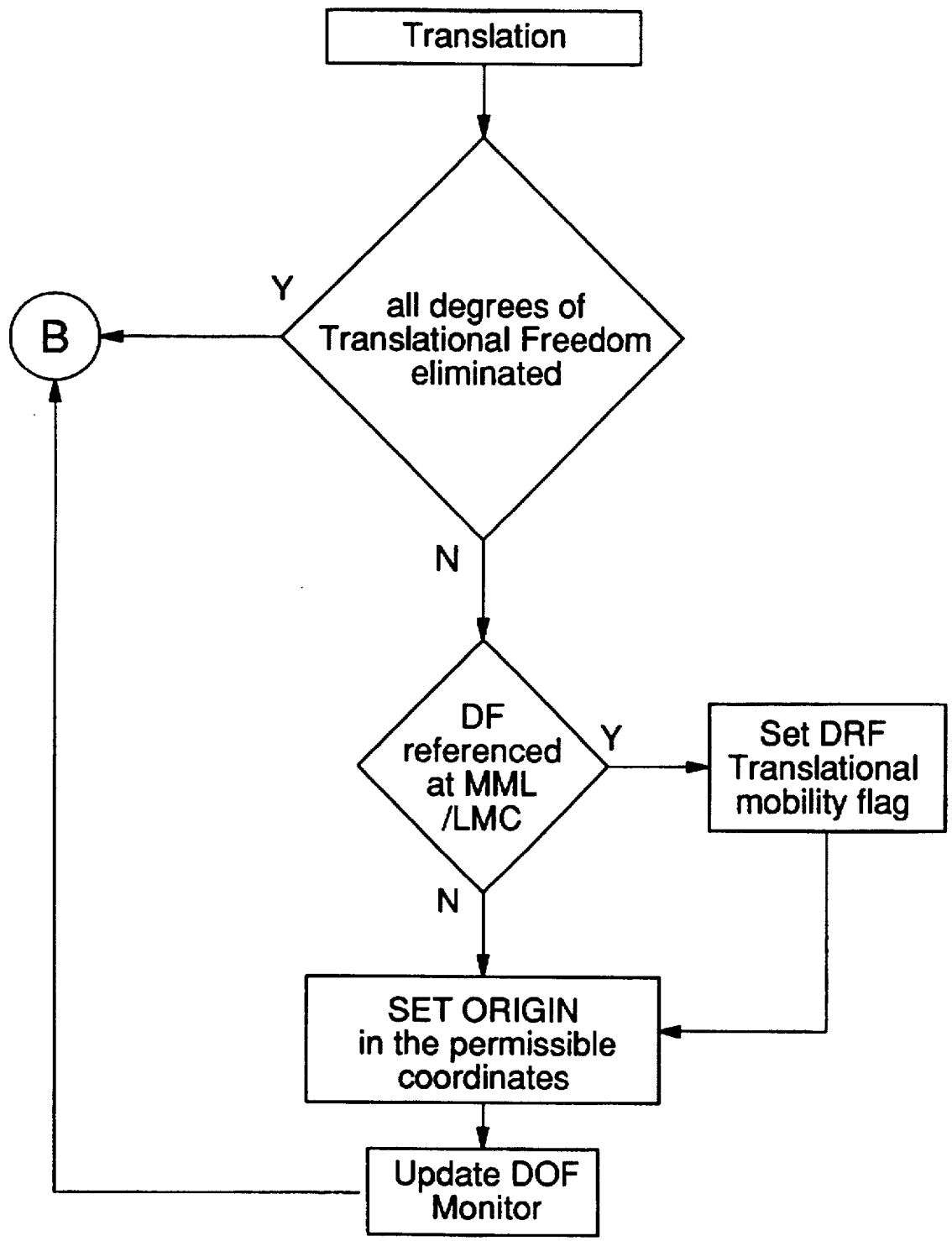

FIG. 26e (h) Determine if all degrees of translational freedom have been eliminated;

(i) If all degrees of translational freedom have not been eliminated, apply a SET ORIGIN tool to the next datum feature to eliminate all permissible and possible degrees of translational freedom, and if the datum feature is referenced at MMC or LMC set the DRF Translation Mobility Flag.

(j) Determine if all degrees of freedom have been eliminated.

(k) If all degrees of freedom have not been eliminated and more datum features exist, repeat steps (a) to (j), otherwise terminate processing.

Applications

A method and apparatus for automatically constructing a DRF and/or FCF can be incorporated into numerous applications including, but not limited to, the following.

Machine Part Design

The material location modifier (MLM) method of the present invention provides the means for creating drawings in which the design intent concerning the effect of roll eliminating datum features relative to fixed primary DRF axes is fully explicit. This applies to hand made drawings as well as to those created using Computer Aided Design (CAD) systems.

Due to the complexity of constructing Feature Control Frames (FCF) and of selecting proper Material Condition and Material Location Modifiers, it is of interest to provide expert systems support for the process. The MLM method and apparatus permit a CAD system to recognize, during FCF construction, whether a roll eliminating Datum Feature is straddling or non-straddling, whether it has size or does not, and therefore to suggest the permissible Material Location Modifier alternatives and forecast their effect.

There is growing interest in the CAD environment to undertake "computer assisted tolerance analysis". An important part of any such effort has to do with the construction of the DRFs defined by the various Feature Control Frames (FCF) associated with features in a computer model. The MLM method and apparatus permit a CAD system to automatically construct the DRF defined by the Datum Features and datum feature modifiers stipulated in a FCF, and thereby (1) determine whether said DRF can actually be constructed and (2), based on the permissible variations of the datum features, determine the extent to which said DRF is stable enough to provide the desired control of the features referenced to it.

Machine Part Manufacturing

The MLM method for defining DRFs provides means to unambiguously specify (1) the design of the fixtures which hold parts in Machine Tools (MT) during the manufacturing process, (2) the "set-up" of MTs prior to material removal, and (3) the in-process verification of part geometry in emulation of a Coordinate Measuring Machine (CMM).

Most commonly, MT "set-up" involves setting linear and rotary MT axis origins by indicating or probing datum features on each successive part, or by indicating or probing the datum feature simulators on the machining fixture. In advanced computer controlled 5 axis MTs, the possibility exists for coarsely securing parts in the machine and then probing their datum features in emulation of a CMM to determine the relevant DRFs for machine path control. The MLM method and attendant automatic DRF construction process thus permit further automation of the manufacturing process.

Machine Part Inspection/Functional Gage Design and Use

The MLM method for defining DRFs provides means to unambiguously specify the design of certain portions of the functional gages used to assess machine part geometry. In particular, the method permits a clear decision as to whether a DFS intended to eliminate roll about a primary axis defining component is to be fixed in space relative to said component or free to translate in a direction perpendicular to the axis, center plane or surface of the roll eliminating component.

Machine Part Inspection/Coordinate Measuring Machine Use

Coordinate Measuring Machines (CMM) simulate functional gages (1) by constructing DRFs from point clouds collected on stipulated Datum Features, and (2) by analyzing the geometry of Considered Features from point clouds collected on said Considered Features.

The process of CMM based DRF construction is currently computer assisted by mathematical tools fulfilling the operations of the ORIENT, ALIGN, PIVOT, SET ORIGIN, TRANSLATE and ROTATE tools as used by the present invention, but whose selection and application remain in the hands of the operator/programmer. The difficulty of comprehending the DRFs defined by particular sets of datum features and datum feature modifiers combined with the human dependence of the current DRF construction process lead to frequent errors in CMM based DRF construction.

The MLM method for automatic DRF construction permits CMM programmers/operators to measure and enter datum features and their material condition and material location modifiers into the computer for completely automatic implementation. The effect is to insure rigorously correct DRF construction on a repetitive basis and to greatly reduce processing time by eliminating the deliberation phase now inherent in the process.

SUMMARY

The present invention fulfills the need which has existed heretofore in the prior art by providing a computer implemented method for automatically and unambiguously constructing a Datum Reference Frame (DRF) for a machine part.

Various modifications will become possible for those skilled in the art after receiving the teachings of the present disclosure without departing from the scope thereof.

I claim:

1. A method of constructing a Datum Reference Frame (DRF) for an object using a computer, the DRF being defined by surfaces of a holding fixture that are inverses of selected features on the object and engage with said selected features to immobilize the object, the method comprising the steps of:

(a) providing the computer with a program for constructing a DRF in response to a specification of datum features of the object including a sequence in which the datum features are to be processed, and a material location modifier for a datum feature which is intended to eliminate roll in the DRF, the material location modifier designating whether said datum feature should be used to eliminate roll using said datum feature's orientation or location;

(b) inputting a specification into the computer; and (c) executing the program.

2. A method as in claim 1, in which step (a) comprises providing the program to construct the DRF in response to the specification by using said datum feature to eliminate roll relative to a previously fixed primary axis of the DRF.

3. A method as in claim 1, in which:

step (a) comprises providing the program to construct the DRF in response to the specification by using datum feature simulators whose locations are controlled by the material location modifier; and the datum feature simulators are inverses of corresponding datum features.

4. A method as in claim 1, in which the material location modifier is selected from a set of material location modifiers, including Independent of Material Location (IML), at Basic Material Location (BML), at Maximum Material Location (MML) and at Least Material Location (LML).

5. A method as in claim 1, in which the material location modifier is selected from a set of material location modifiers.

6. A method as in claim 5, in which a default material location modifier is Independent of Material Location (IML).

7. A method as in claim 6, in which:

if said datum feature does not straddle a previously fixed primary axis of the DRF, the material location modifier can be at Basic Material Location (BML); and if said datum feature does not have size, the material location modifier can be at Maximum Material Location (MML) or at Least Material Location (LML).

8. A method as in claim 6, in which, for datum features without size, material location increases in a direction of increasing material condition.

9. A method as in claim 5, in which:

if said datum feature does not straddle a previously fixed primary axis of the DRF, a default material location modifier is at Basic Material Location (BML); and if said datum feature straddles a previously fixed primary axis of the DRF, the default material location modifier is Independent of Material Location (IML).

10. A method as in claim 9, in which:

if said datum feature has size and straddles a previously fixed primary axis of the DRF, the material location modifier can be at BML; and if said datum feature does not have size, the material location modifier can be at Maximum Material Location (MML) or at Least Material Location (LML).

11. A method as in claim 9, in which, for datum features without size, material location increases in a direction of increasing material condition.

12. A method as in claim 5, in which:

if said datum feature straddles a previously fixed primary axis of the DRF and does not have size, a default material location modifier is at Maximum Material Location (MML);

if said datum feature straddles a previously fixed primary axis of the DRF and has size, the default material location modifier is at Basic Material Location (BML); and if said datum feature has size, or does not have size and does not straddle a previously fixed primary axis of the DRF, the default material location modifier is at Basic Material Location (BML).

13. A method as in claim 12, in which the material location modifier can be Independent of Material Location (IML).

14. A method as in claim 12, in which, if said datum feature does not have size and does not straddle a previously fixed primary axis of the DRF, the material location modifier can be at Maximum Material Location (MML) or at Least Material Location (LML).

15. A method as in claim 12, in which, if said datum feature straddles a previously fixed primary axis of the DRF and does not have size, the material location modifier can be at Least Material Location (LML).

16. A method as in claim 12, in which, for datum features without size, material location increases in a direction of increasing material condition.

17. A method as in claim 5, in which there is no default material location modifier, and the material location modifier is selected explicitly.

18. A method as in claim 1, in which step (a) comprises providing the program to construct the DRF in response to the specification by applying, in order, ORIENT, ALIGN, PIVOT, and SET ORIGIN tools.

19. A method as in claim 18, in which step (a) comprises providing the program to construct the DRF in response to the specification by further applying TRANSLATE and ROTATE tools.

20. A method as in claim 1, in which:

step (a) comprises providing the program to construct the DRF in response to the specification by using datum feature simulators whose locations are controlled by the material location modifier;

the datum feature simulators are inverses of corresponding datum features; and step (a) comprises providing the program to construct the DRF in response to the specification in accordance with the following rules:

RULE OF MATERIAL ORIENTATION—the orientations of datum feature simulators are fixed relative to one another at the basic angles of their corresponding datum features;

RULES OF MATERIAL LOCATION—(i) datum feature simulators which do not serve to eliminate roll relative to a previously fixed primary axis of the DRF are fixed at their basic locations relative to previously established datums; (ii) datum feature simulators representing datum targets are fixed at their basic locations relative to previously established datums, whether or not they serve to eliminate roll; (iii) the manner in which datum feature simulators serve to eliminate roll relative to a previously fixed primary axis of a DRF is determined by explicit Material Location Modifiers or by Material Location Modifier defaults;

RULE OF MATERIAL CONDITION—datum feature simulators representing datum features with size are fixed at Virtual Material Condition (VMC) if accompanied by Maximum Material Condition (MMC) or Least Material Condition (LMC) modifiers, and will otherwise expand or contract to consume all space inside or outside respective datum features;

FIRST RULE OF PRECEDENCE—datum features listed in a Feature Control Frame (FCF) will be used in the order in which they appear;

SECOND RULE OF PRECEDENCE—ORIENT, ALIGN, PIVOT, and SET ORIGIN tools will be applied in order; the program will attempt to use each datum feature first to eliminate pitch and yaw, then to eliminate roll, and then to eliminate the three degrees of translational freedom;

RULE OF MAXIMUM UTILIZATION—each datum feature must contribute everything it can and may to eliminating the six degrees of freedom of a DRF;

RULE OF COMPOSITE FEATURE CONTROL FRAMES—datum features listed in a first tier of a composite feature control frame are empowered to remove both translational and rotational degrees of DRF freedom; datum features listed in a second tier and all lower tiers of a composite feature control frame may only remove rotational degrees of freedom;

RULE OF NON-OVERRIDE—no datum features may override degrees of freedom eliminated by previous datum features;

RULE OF SIMULTANEITY—all features referenced to a same mobile DRF must meet their requirements simultaneously unless modified by a notation indicating that they are separate; in the case of separate groups of features referenced to the same mobile DRFs defined by second and lower tiers of separate composite feature control frames, the rule of simultaneity applies separately within each group.

21. A method as in claim 1, in which step (a) comprises providing the program to construct the DRF in response to the specification by performing the substeps of:

(a1) identifying a next datum feature in the sequence;

(a2) determining if pitch and yaw have already been eliminated;

(a3) if pitch and yaw have not been eliminated, and if said next datum feature is capable of eliminating pitch and yaw, applying an ORIENT tool to said next datum feature to eliminate pitch and yaw;

(a4) determining if roll has been eliminated;

(a5) if roll has not been eliminated, and if said next datum feature straddles a previously fixed primary axis of the DRF, applying an ALIGN tool to said next datum feature to eliminate roll using said next datum feature's orientation;

(a6) if roll has not been eliminated, and if said next datum feature does not straddle a previously fixed primary axis of the DRF, and if said next datum feature is associated with the material location modifier Independent of Material Location (IML), applying an ALIGN tool to said next datum feature to eliminate roll using said next datum feature's orientation;

(a7) if roll has not been eliminated, and if said next datum feature does not straddle a previously fixed primary axis of the DRF, and if said next datum feature is associated with a material location modifier Basic Material Location (BML), Maximum Material Location (MML) or Least Material Location (LML), applying a PIVOT tool to said next datum feature to eliminate roll using said next datum feature's location;

(a8) determining if all degrees of translational freedom have been eliminated;

(a9) if all degrees of translational freedom have not been eliminated, applying a SET ORIGIN tool to said next datum feature to eliminate all permissible and possible degrees of translational freedom;

(a10) determining if all degrees of freedom have been eliminated;

(a11) if all degrees of freedom have not been eliminated and more datum features exist, repeating steps (a1) to (a10), otherwise terminating the method.

22. A method as in claim 1, in which step (a) comprises providing the program to construct the DRF in response to the specification and eliminate roll in the DRF by performing the substeps of:

(a1) identifying a next datum feature in the sequence;

(a2) if roll has not been eliminated, and if said next datum feature straddles a previously fixed primary axis of the DRF, applying an ALIGN tool to said next datum feature to eliminate roll using said next datum feature's orientation;

(a3) if roll has not been eliminated, and if said next datum feature does not straddle a previously fixed primary axis of the DRF, and if said next datum feature is associated with a material location modifier Independent of Material Location (IML), applying an ALIGN tool to said next datum feature to eliminate roll using said next datum feature's orientation; and (a4) if roll has not been eliminated, and if said next datum feature does not straddle a previously fixed primary axis of the DRF, and if said next datum feature is associated with a material location modifier Basic Material Location (BML), Maximum Material Location (MML), or Least Material Location (LML), applying a PIVOT tool to said next datum feature to eliminate roll using said next datum feature's location.

23. A method for specifying and constructing an unambiguous Datum Reference Frame (DRF) for an object, the DRF being defined by surfaces of a holding fixture that are inverses of selected features on the object and engage with said selected features to immobilize the object the method comprising the steps of:

(a) providing a specification of datum features of the object including a sequence in which the datum features are to be processed, and a material location modifier for a datum feature which is intended to eliminate roll in the DRF, the material location modifier designating whether said datum feature should be used to eliminate roll using said datum feature's orientation or location; and (b) constructing the DRF by processing the specification using a procedure which includes implementation of the material location modifier.

24. A method as in claim 23, in which the material location modifier is selected from a set of material location modifiers.

25. A method as in claim 24, in which a default material location modifier is Independent of Material Location (IML).

26. A method as in claim 24, if said datum feature does not straddle a previously fixed primary axis of the DRF, a default material location modifier is at Basic Material Location (BML); and if said datum feature straddles a previously fixed primary axis of the DRF, the default material location modifier is Independent of Material Location (IML).

27. A method as in claim 24, in which:

if said datum feature straddles a previously fixed primary axis of the DRF and does not have size, a default material location modifier is at Maximum Material Location (MML);

if said datum feature straddles a previously fixed primary axis of the DRF and has size, the default material location modifier is at Basic Material Location (BML); and if said datum feature has size, or does not have size and does not straddle a previously fixed primary axis of the DRF, the material location modifier is at Basic Material Location (BML).

28. A method as in claim 24, in which there is no default material location modifier, and the material location modifier is selected explicitly.

29. A method of constructing a Feature Control Frame (FCF) for controlling the geometry of a feature of an object using a computer, the FCF specifying a Datum Reference Frame (DRF) defined by surfaces of a holding fixture that are inverses of selected features on the object and engage with said selected features to immobilize the object the method comprising the steps of:

(a) providing the computer with a program for constructing an FCF in response to a specification of a dimension, a tolerance, and a material location modifier for a datum feature, the FCF including a material location modifier symbol corresponding to the material location modifier;

(b) inputting a specification into the computer; and (c) executing the program.

30. A method as in claim 29, in which the material location modifier is selected from a set of material location modifiers, including Independent of Material Location (IML), at Basic Material Location (BML), at Maximum Material Location (MML) and at Least Material Location (LML).

31. A method as in claim 29, in which the material location modifier is selected from a set of material location modifiers.

32. A method as in claim 31, in which there is no default material location modifier, and the material location modifier is selected explicitly.

33. A method as in claim 31, in which the set includes a default material location modifier and an alternative material location modifier.

34. A method as in claim 33, in which the program enables selection of the default material location modifier or the alternative material location modifier.

35. A method as in claim 34, in which the program displays the default material location modifier and the alternative material location modifier, and prompts for selection of the default material location modifier or the alternative material location modifier.

36. A method as in claim 35, in which the program further displays information regarding the alternative material location modifier.

37. A method as in claim 35, in which:

the set includes a material location modifier which is inappropriate for said datum feature; and the program does not display or enable selection of said material location modifier which is inappropriate for said datum feature.

38. An apparatus which constructs a Datum Reference Frame (DRF) for an object, the DRF being defined by surfaces of a holding fixture that are inverses of selected features on the object and engage with said selected features to immobilize the object, the method comprising:

memory means for storing a program including instructions for constructing a DRF in response to a specification of datum features of the object including a sequence in which the datum features are to be processed, and a material location modifier for a datum feature which is intended to eliminate roll in the DRF, the material location modifier designating whether said datum feature should be used to eliminate roll using said datum feature's orientation or location;

input means for inputting a specification; and processing means for executing the program.

39. An apparatus as in claim 38, in which the material location modifier is selected from a set of material location modifiers.

40. An apparatus as in claim 39, in which a default material location modifier is Independent of Material Location (IML).

41. An apparatus as in claim 39, in which:

if said datum feature does not straddle a previously fixed primary axis of the DRF, a default material location modifier is at Basic Material Location (BML); and if said datum feature straddles a previously fixed primary axis of the DRF, a default material location modifier is Independent of material Location (IML).

42. An apparatus as in claim 39, in which:

if said datum feature straddles a previously fixed primary axis of the DRF and does not have size, a default material location modifier is at Maximum Material Location (MML);

if said datum feature straddles a previously fixed primary axis of the DRF and has size, a default material location modifier is at Basic Material Location (BML);

if said datum feature has size, or does not have size and does not straddle a previously fixed primary axis of the DRF, the default material location modifier is at Basic Material Location (BML).

43. An apparatus as in claim 39, in which there is no default material location modifier, and the material location modifier is selected explicitly.

44. An apparatus as in claim 38, in which:

the program constructs the DRF in response to the specification by using datum feature simulators whose locations are controlled by the material location modifier;

the datum feature simulators are inverses of corresponding datum features; and the program constructs the DRF in response to the specification in accordance with the following rules:

RULE OF MATERIAL ORIENTATION—the orientations of datum feature simulators are fixed relative to one another at the basic angles of their corresponding datum features;

RULES OF MATERIAL LOCATION—(i) datum feature simulators which do not serve to eliminate roll relative to a previously fixed primary axis of the DRF are fixed at their basic locations relative to previously established datums; (ii) datum feature simulators representing datum targets are fixed at their basic locations relative to previously established datums, whether or not they serve to eliminate roll; (iii) the manner in which datum feature simulators serve to eliminate roll relative to a previously fixed primary axis of a DRF is determined by explicit Material Location Modifiers or by Material Location Modifier defaults;

RULE OF MATERIAL CONDITION—datum feature simulators representing datum features with size are fixed at Virtual Material Condition (VMC) if accompanied by Maximum Material Condition (MMC) or Least Material Condition (LMC) modifiers, and will otherwise expand or contract to consume all space inside or outside respective datum features;

FIRST RULE OF PRECEDENCE—datum features listed in a Feature Control Frame (FCF) will be used in the order in which they appear;

SECOND RULE OF PRECEDENCE—ORIENT, ALIGN, PIVOT, and SET ORIGIN tools will be applied in order; the program will attempt to use each datum feature first to eliminate pitch and yaw, then to eliminate roll, and then to eliminate the three degrees of translational freedom;

RULE OF MAXIMUM UTILIZATION—each datum feature must contribute everything it can and may to eliminating the six degrees of freedom of a DRF;

RULE OF COMPOSITE FEATURE CONTROL FRAMES—datum features listed in a first tier of a composite feature control frame are empowered to remove both translational and rotational degrees of DRF freedom; datum features listed in a second tier and all lower tiers of a composite feature control frame may only remove rotational degrees of freedom;

RULE OF NON-OVERRIDE—no datum features may override degrees of freedom eliminated by previous datum features;

RULE OF SIMULTANEITY—all features referenced to a same mobile DRF must meet their requirements simultaneously unless modified by a notation indicating that they are separate; in the case of separate groups of features referenced to the same mobile DRFs defined by second and lower tiers of separate composite feature control frames, the rule of simultaneity applies separately within each group.

45. An apparatus as in claim 38, in which the processing means, memory means and program operate in combination for performing the steps of:

(a) identifying a next datum feature in the sequence;

(b) determining if pitch and yaw have already been eliminated;

(c) if pitch and yaw have not been eliminated, and if said next datum feature is capable of eliminating pitch and yaw, applying an ORIENT tool to said next datum feature to eliminate pitch and yaw;

(d) determining if roll has been eliminated;

(e) if roll has not been eliminated, and if said next datum feature straddles a previously fixed primary axis of the DRF, applying an ALIGN tool to said next datum feature to eliminate roll using said next datum feature's orientation;

(f) if roll has not been eliminated, and if said next datum feature does not straddle a previously fixed primary axis of the DRF, and if said next datum feature is associated with the material location modifier Independent of Material Location (IML), applying an ALIGN tool to said next datum feature to eliminate roll using said next datum feature's orientation;

(g) if roll has not been eliminated, and if said next datum feature does not straddle a previously fixed primary axis of the DRF, and if said next datum feature is associated with a material location modifier Basic Material Location (BML), Maximum Material Location (MML) or Least Material Location (LML), applying a PIVOT tool to said next datum feature to eliminate roll using the next datum feature's location;

(h) determining if all degrees of translational freedom have been eliminated;

(i) if all degrees of translational freedom have not been eliminated, applying a SET ORIGIN tool to said next datum feature to eliminate all permissible and possible degrees of translational freedom;

(j) determining if all degrees of freedom have been eliminated;

(k) if all degrees of freedom have not been eliminated and more datum features exist, repeating steps (a) to (j), otherwise terminating processing.

46. An apparatus as in claim 38, in which the processing means, memory means and program operate in combination for performing the steps of:

(a) identifying a next datum feature in the sequence;

(b) if roll has not been eliminated, and if said next datum feature straddles a previously fixed primary axis of the DRF, applying an ALIGN tool to said next datum feature to eliminate roll using said next datum feature's orientation;

(c) if roll has not been eliminated, and if said next datum feature does not straddle a previously fixed primary axis of the DRF, and if said next datum feature is associated with a material location modifier Independent of Material Location (IML), applying an ALIGN tool to said next datum feature to eliminate roll using said next datum feature's orientation; and (d) if roll has not been eliminated, and if said next datum feature does not straddle a previously fixed primary axis of the DRF, and if said next datum feature is associated with a material location modifier Basic Material Location (BML), Maximum Material Location (MML), or Least Material Location (LML), applying a PIVOT tool to said next datum feature to eliminate roll using said next datum feature's location.

47. A Computer Aided Design (CAD) system which constructs a Datum Reference Frame (DRF) for an object, the DRF being defined by surfaces of a holding fixture that are inverses of selected features on the object and engage with said selected features to immobilize the object, the method comprising:

memory means for storing a program including instructions for constructing a DRF in response to a specification of datum features of the object including a sequence in which the datum features are to be processed, and a material location modifier for a datum feature which is intended to eliminate roll in the DRF, the material location modifier designating whether said datum feature should be used to eliminate roll using said datum feature's orientation or location;

input means for inputting a specification; and processing means for executing the program.

48. A data storage medium which stores a computer program for operative execution by a computer, the program comprising:

program code means for inputting a specification of datum features of an object including a sequence in which the datum features are to be processed, and a material location modifier for a datum feature which is intended to eliminate roll in the DRF, the material location modifier designating whether said datum feature should be used to eliminate roll using said datum feature's orientation or location; and program code means for constructing a Datum Reference Frame (DRF) for an object in response to said specification, the DRF being defined by surfaces of a holding fixture that are inverses of selected features on the object and engage with said selected features to immobilize the object.

49. A medium as in claim 48, in which the material location modifier is selected from a set of material location modifiers.

50. A medium as in claim 49, in which a default material location modifier is Independent of Material Location (IML).

51. A medium as in claim 49, in which:

if said datum feature does not straddle a previously fixed primary axis of the DRF, a default material location modifier is at Basic Material Location (BML);

if said datum feature straddles a previously fixed primary axis of the DRF, the default material location modifier is Independent of material Location (IML).

52. A medium as in claim 49, in which:

if said datum feature straddles a previously fixed primary axis of the DRF and does not have size, a default material location modifier is at Maximum Material Location (MML);

if said datum feature straddles a previously fixed primary axis of the DRF and has size, the default material location modifier is at Basic Material Location (BML);

if said datum feature has size, or does not have size and does not straddle a previously fixed primary axis of the DRF, the default material location modifier is at Basic Material Location (BML).

53. A medium as in claim 49, in which there is no default material location modifier, and the material location modifier is selected explicitly.

54. A medium as in claim 48, in which:

the program constructs the DRF in response to the specification by using datum feature simulators whose locations are controlled by the material location modifier;

the datum feature simulators are inverses of corresponding datum features; and the program constructs the DRF in response to the specification in accordance with the following rules:

RULE OF MATERIAL ORIENTATION—the orientations of datum feature simulators are fixed relative to one another at the basic angles of their corresponding datum features;

RULES OF MATERIAL LOCATION—(i) datum feature simulators which do not serve to eliminate roll relative to a previously fixed primary axis of the DRF are fixed at their basic locations relative to previously established datums; (ii) datum feature simulators representing datum targets are fixed at their basic locations relative to previously established datums, whether or not they serve to eliminate roll; (iii) the manner in which datum feature simulators serve to eliminate roll relative to a previously fixed primary axis of a DRF is determined by explicit Material Location Modifiers or by Material Location Modifier defaults;

RULE OF MATERIAL CONDITION—datum feature simulators representing datum features with size are fixed at Virtual Material Condition (VMC) if accompanied by Maximum Material Condition (MMC) or Least Material Condition (LMC) modifiers, and will otherwise expand or contract to consume all space inside or outside respective datum features;

FIRST RULE OF PRECEDENCE—datum features listed in a Feature Control Frame (FCF) will be used in the order in which they appear;

SECOND RULE OF PRECEDENCE—ORIENT, ALIGN, PIVOT, and SET ORIGIN tools will be applied in order; the program will attempt to use each datum feature first to eliminate pitch and yaw, then to eliminate roll, and then to eliminate the three degrees of translational freedom;

RULE OF MAXIMUM UTILIZATION—each datum feature must contribute everything it can and may to eliminating the six degrees of freedom of a DRF;

RULE OF COMPOSITE FEATURE CONTROL FRAMES—datum features listed in a first tier of a composite feature control frame are empowered to remove both translational and rotational degrees of DRF freedom; datum features listed in a second tier and all lower tiers of a composite feature control frame may only remove rotational degrees of freedom;

RULE OF NON-OVERRIDE—no datum features may override degrees of freedom eliminated by previous datum features;

RULE OF SIMULTANEITY—all features referenced to a same mobile DRF must meet their requirements simultaneously unless modified by a notation indicating that they are separate; in the case of separate groups of features referenced to the same mobile DRFs defined by second and lower tiers of separate composite feature control frames, the rule of simultaneity applies separately within each group.

55. A medium as in claim 48, in which the program performs the steps of:

(a) identifying a next datum feature in the sequence;

(b) determining if pitch and yaw have already been eliminated;

(c) if pitch and yaw have not been eliminated, and if said next datum feature is capable of eliminating pitch and yaw, applying an ORIENT tool to said next datum feature to eliminate pitch and yaw;

(d) determining if roll has been eliminated;

(e) if roll has not been eliminated, and if said next datum feature straddles a previously fixed primary axis of the DRF, applying an ALIGN tool to said next datum feature to eliminate roll using said next datum feature's orientation;

(f) if roll has not been eliminated, and if said next datum feature does not straddle a previously fixed primary axis of the DRF, and if said next datum feature is associated with the material location modifier Independent of Material Location (IML), applying an ALIGN tool to said next datum feature to eliminate roll using said next datum feature's orientation;

(g) if roll has not been eliminated, and if said next datum feature does not straddle a previously fixed primary axis of the DRF, and if said next datum feature is associated with a material location modifier Basic Material Location (BML), Maximum Material Location (MML) or Least Material Location (LML), applying a PIVOT tool to said next datum feature to eliminate roll using the next datum feature's location;

(h) determining if all degrees of translational freedom have been eliminated;

(i) if all degrees of translational freedom have not been eliminated, applying a SET ORIGIN tool to said next datum feature to eliminate all permissible and possible degrees of translational freedom;

(j) determining if all degrees of freedom have been eliminated;

(k) if all degrees of freedom have not been eliminated and more datum features exist, repeating steps (a) to (j), otherwise terminating processing.

56. A medium as in claim 48, in which the program performs the steps of:

(a) identifying a next datum feature in the sequence;

(b) if roll has not been eliminated, and if said next datum feature straddles a previously fixed primary axis of the DRF, applying an ALIGN tool to said next datum feature to eliminate roll using said next datum feature's orientation;

(c) if roll has not been eliminated, and if said next datum feature does not straddle a previously fixed primary axis of the DRF, and if said next datum feature is associated with a material location modifier Independent of Material Location (IML), applying an ALIGN tool to said next datum feature to eliminate roll using said next datum feature's orientation; and (d) if roll has not been eliminated, and if said next datum feature does not straddle a previously fixed primary axis of the DRF, and if said next datum feature is associated with a material location modifier Basic Material Location (BML), Maximum Material Location (MML), or Least Material Location (LML), applying a PIVOT tool to said next datum feature to eliminate roll using said next datum feature's location.

57. A medium as in claim 48, comprising a computer memory.

58. A medium as in claim 48, comprising a magnetic storage element.

59. A medium as in claim 48, comprising an optical storage element.

* * * * *